United States Patent
Kato

(10) Patent No.: US 9,412,739 B2
(45) Date of Patent: Aug. 9, 2016

(54) SEMICONDUCTOR DEVICE

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/682,476

(22) Filed: Apr. 9, 2015

(65) Prior Publication Data

US 2015/0294992 A1 Oct. 15, 2015

(30) Foreign Application Priority Data

Apr. 11, 2014 (JP) ................. 2014-082256

(51) Int. Cl.
| | |
|---|---|
| H01L 29/10 | (2006.01) |
| H01L 27/088 | (2006.01) |
| H01L 29/786 | (2006.01) |
| H01L 21/8258 | (2006.01) |
| H01L 27/02 | (2006.01) |
| H01L 27/06 | (2006.01) |
| H01L 27/092 | (2006.01) |

(52) U.S. Cl.
CPC .......... *H01L 27/088* (2013.01); *H01L 21/8258* (2013.01); *H01L 27/0207* (2013.01); *H01L 27/0688* (2013.01); *H01L 27/092* (2013.01); *H01L 29/7869* (2013.01)

(58) Field of Classification Search
CPC .............. H01L 27/1207; H01L 27/088; H01L 27/7869; H01L 27/78648; H01L 27/0207; H01L 27/0688; H01L 29/7869

USPC .......................................................... 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Weste.N. et al., "1.5.4 Gate Layouts", CMOS VLSI Design: A Circuits and Systems Perspective (Fourth Edition), Mar. 1, 2010, pp. 27-28.

(Continued)

*Primary Examiner* — Tu-Tu Ho
(74) *Attorney, Agent, or Firm* — Fish & Richardson P.C.

(57) ABSTRACT

A semiconductor with reduced area is provided. A first transistor includes a first conductor, a first insulator over the first conductor, an oxide semiconductor provided over the first insulator so as to overlap with the first conductor, a second insulator over the oxide semiconductor, a second conductor over the second insulator, and a third conductor and a fourth conductor in contact with the oxide semiconductor. The oxide semiconductor includes a region overlapping with the first region and not overlapping with the second region, and a region not overlapping with the first conductor and overlapping with the second conductor in a region positioned between the third conductor and the fourth conductor when viewed from above. The second transistor is a p-channel transistor. A layer in which the first transistor is provided and a layer in which the second transistor is provided are stacked together.

37 Claims, 27 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,344,788 B2 | 1/2013 | Yamazaki et al. |
| 8,466,463 B2 | 6/2013 | Akimoto et al. |
| 8,482,974 B2 | 7/2013 | Saito et al. |
| 8,614,916 B2 | 12/2013 | Nagatsuka et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,823,439 B2 | 9/2014 | Yamazaki et al. |
| 9,130,047 B2 | 9/2015 | Sakakura et al. |
| 9,136,391 B2 | 9/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0273773 A1* | 11/2012 | Ieda ............ H01L 27/105 257/43 |
| 2013/0207102 A1 | 8/2013 | Miyake et al. |
| 2013/0240872 A1 | 9/2013 | Noda |
| 2013/0270553 A1 | 10/2013 | Yokoyama et al. |
| 2014/0027764 A1* | 1/2014 | Yamazaki ......... H01L 27/0688 257/43 |
| 2015/0001532 A1 | 1/2015 | Yamazaki et al. |
| 2016/0005874 A1 | 1/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-187950 A | 9/2011 |
| JP | 2012-256400 A | 12/2012 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Nakamura.M, "Synthesis of Homologous Compound with New Long-Period Structure", NIRIM Newsletter, Mar. 1, 1995 vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

500

501

502

503

502

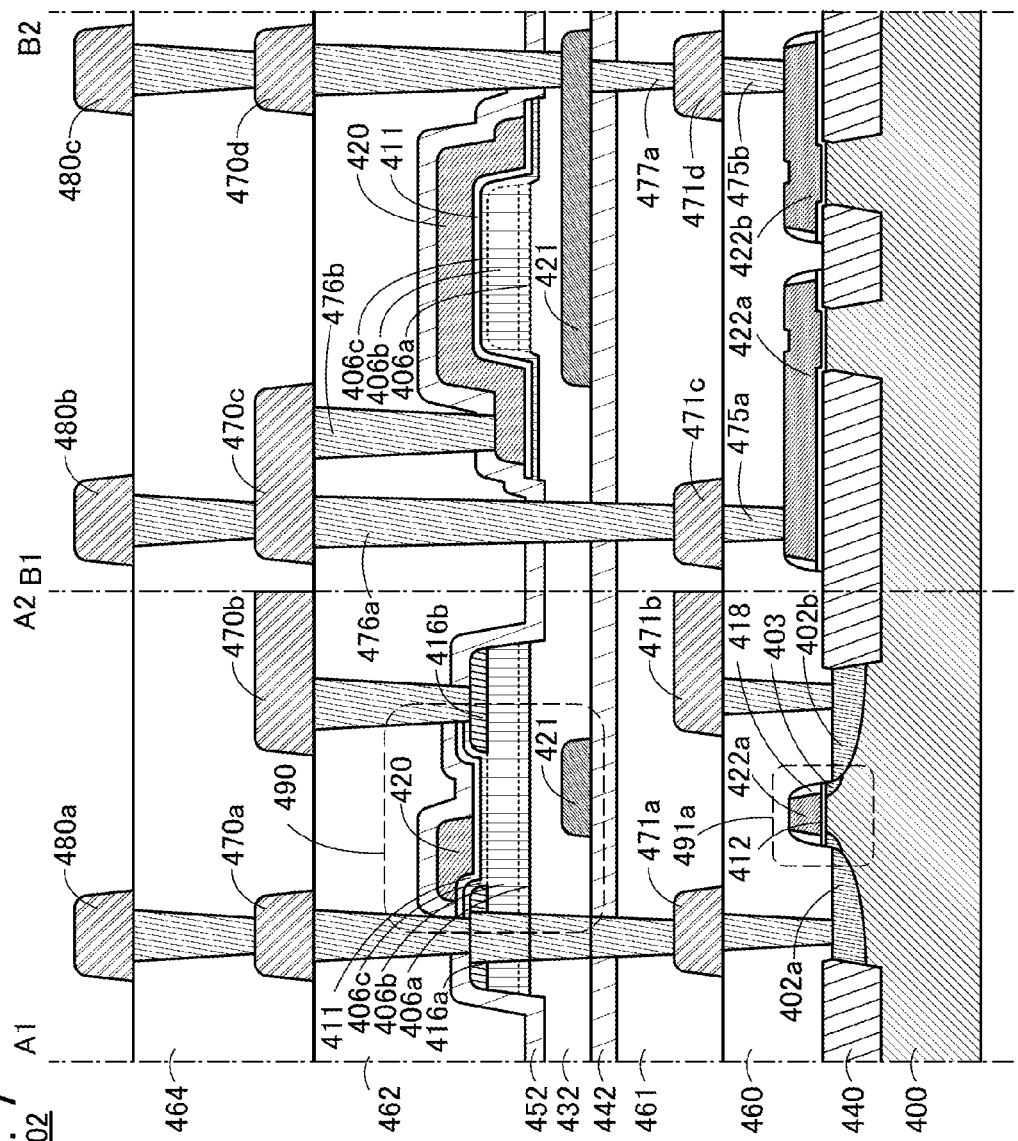

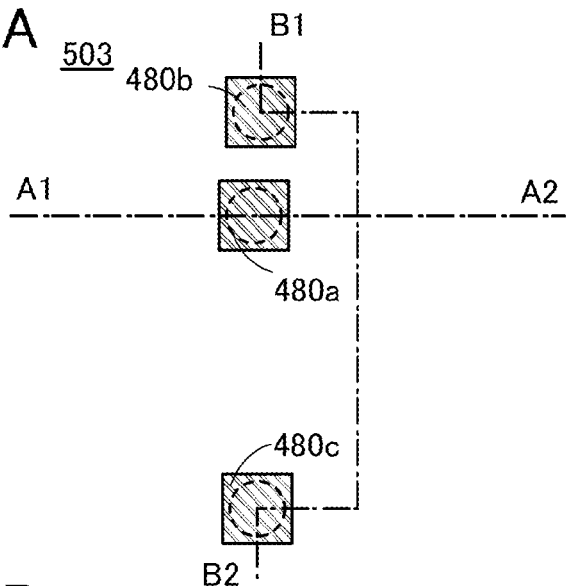
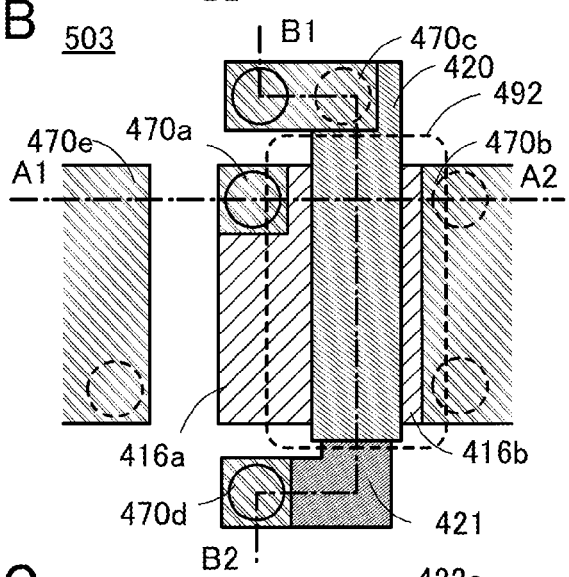
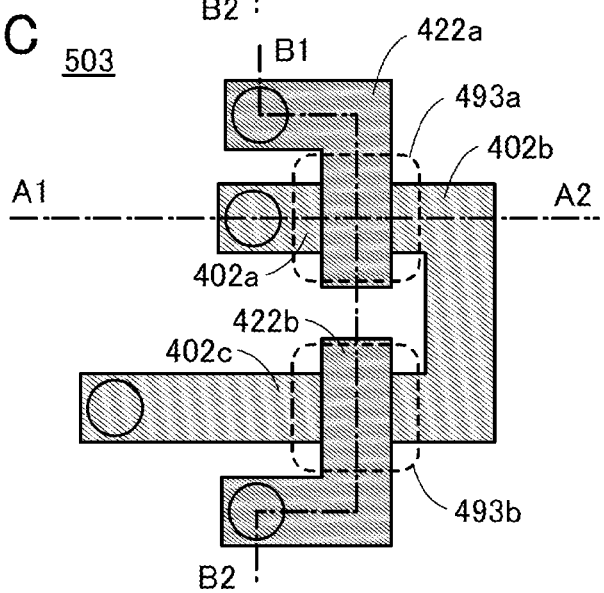

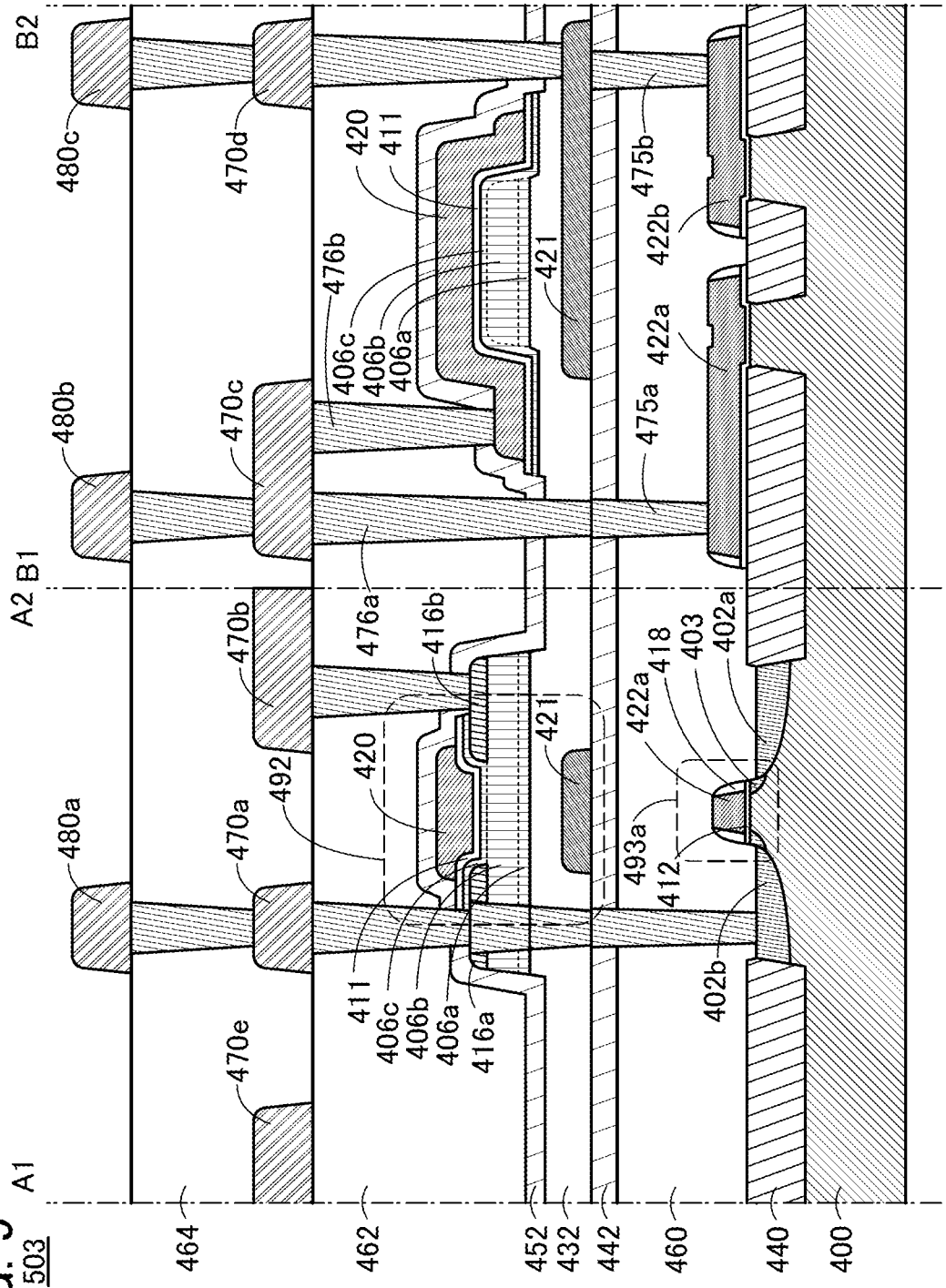

SEMICONDUCTOR DEVICE

BACKGROUND OF THE INVENTION

1. Field of the Invention

The present invention relates to an object, a method, or a manufacturing method. In addition, the present invention relates to a machine, a process, manufacture, or a composition of matter. In particular, the present invention relates to, for example, a semiconductor, a semiconductor device, a memory device, a processor, a display device, a light-emitting device, a lighting device, or a power storage device. Alternatively, the present invention relates to a method for manufacturing a semiconductor, a semiconductor device, a memory device, a processor, a display device, a light emitting device, a lighting device, or a power storage device. Alternatively, the present invention relates to a method for driving a semiconductor device, a memory device, a processor, a display device, a light emitting device, a lighting device, or a power storage device.

The semiconductor device in this specification indicates all the devices that can operate by utilizing semiconductor characteristics. Note that a semiconductor device means a circuit having a semiconductor element (e.g., a transistor or a diode) and a device having the circuit, and the like. For example, an electronic circuit and a chip including an electronic circuit are all semiconductor devices. A memory device, a display device, a light emitting device, a lighting device, an electro-optical device, an electronic device, and the like include a semiconductor device in some cases.

2. Description of the Related Art

Much attention is focused on a semiconductor device that can retain data even after the interruption of power supply by using a combination of a transistor including semiconductor silicon (Si) in a region where a channel is formed (also referred to as a channel formation region) (this transistor is referred to as a Si transistor in the following description) and a transistor including an oxide semiconductor (preferably an oxide including In, Ga, and Zn) in its channel formation region (see Patent Document 1). A Si transistor is used in a variety of electronic circuits or electronic components. As a structural unit, an electronic circuit contains a cell (also referred to as a logic cell or a standard cell) such as an inverter circuit, a NAND circuit, and a flip-flop which are formed by arranging and wiring an n-channel Si transistor and a p-channel Si transistor (see Non-Patent Document 1).

On the other hand, transistors including an oxide semiconductor (preferably an oxide including In, Ga, and Zn) in their channel formation regions are known. It is known that a transistor including an oxide semiconductor in a channel formation region has extremely small off-state current because an oxide semiconductor has a wider band gap than silicon. For example, Patent Document 1 discloses a semiconductor device that can retain data even after interruption of power supply with use of such a transistor in a memory cell.

In recent years, demand for a circuit in which semiconductor elements such as a miniaturized transistor are integrated with high density has risen with increased performance and reductions in the size and weight of an electronic device.

PATENT DOCUMENT

[Patent Document 1] Japanese Published Patent Application No. 2011-187950

[Non-Patent Document 1] Neil H. E. Weste and David Money Harris, CMOS VLSI Design: A Circuits and Systems Perspective (4th Edition), Addison Wesley, p. 27, 2011.

SUMMARY OF THE INVENTION

An object of one embodiment of the present invention is at least one of the following: to provide a semiconductor device (cell) including a circuit having a small circuit area; to provide a semiconductor device (cell) including a circuit with low power consumption; to provide a semiconductor device (cell) including a circuit with high operation speed; to provide a small semiconductor device; to provide a semiconductor device with low power consumption; to provide a semiconductor device with improved operation speed; to provide a semiconductor device which can be manufactured at low cost; and providing a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including a first transistor and a second transistor. The first transistor includes a first conductor, a first insulator over the first conductor, an oxide semiconductor over the first insulator, a second insulator over the oxide semiconductor, a second conductor over the second insulator, a third conductor, and a fourth conductor. The oxide semiconductor overlaps with the first conductor. The third conductor is in contact with the oxide semiconductor. The fourth conductor is in contact with the oxide semiconductor. The oxide semiconductor includes a first region positioned between the third conductor and the fourth conductor when viewed from above. The first region includes a second region overlapping with the first conductor. The first region includes a third region not overlapping with the first conductor. The first region includes a fourth region overlapping with the second conductor. The first region includes a fifth region not overlapping with the second conductor. The second region and the fifth region have a sixth region where they overlap with each other. The third region and the fourth region have a seventh region where they overlap with each other. The second transistor is a p-channel transistor. A layer in which the first transistor is provided and a layer in which the second transistor is provided are provided so as to overlap with each other.

(2) One embodiment of the present invention is a semiconductor device including a first transistor, a second transistor, and a third transistor. The first transistor includes a first conductor, a first insulator over the first conductor, an oxide semiconductor over the first insulator, a second insulator over the oxide semiconductor, a second conductor over the second insulator, a third conductor, and a fourth conductor. The oxide semiconductor overlaps with the first conductor. The third conductor is in contact with the oxide semiconductor. The fourth conductor is in contact with the oxide semiconductor. The oxide semiconductor includes a first region positioned between the third conductor and the fourth conductor when viewed from above. The first region includes a second region overlapping with the first conductor. The first region includes a third region not overlapping with the first conductor. The first region includes a fourth region overlapping with the second conductor. The first region includes a fifth region not overlapping with the second conductor. The second region and the fifth region have a sixth region where they overlap with each other. The third region and the fourth region have a seventh region where they overlap with each other. The second and the third transistors are p-channel transistors. A layer in which the first transistor is provided and a layer in which the second transistor and the third transistor are provided are provided so as to overlap with each other. A direction in which a gate of the second transistor extends, a direction in which a gate of the third transistor extends, a direction in which the first conductor extends, and a direction in which the second conductor extends are parallel to each other. A channel formation region of the second transistor and a channel formation region of the third transistor are aligned in the direction. The first conductor and the gate of the second transistor are electrically connected to each other through a first connection portion. The second conductor and the gate of the third transistor are electrically connected to each other through a second connection portion. The first region, the channel formation region of the second transistor, and the channel formation region of the third transistor are provided between the first connection portion and the second connection portion when viewed from above. One of the third conductor and the fourth conductor, one of a source and a drain of the second transistor, and one of a source and a drain of the third transistor are electrically connected to each other.

(3) One embodiment of the present invention is the semiconductor device according to the embodiment (1) or (2), in which the second region and the fourth region overlap with each other.

(4) One embodiment of the present invention is the semiconductor device according to the embodiment (1) or (2), in which the third region and the fifth region have an eighth region where they overlap with each other. The eighth region is narrower than the sixth region and the seventh region.

(5) One embodiment of the present invention is a semiconductor device including a first transistor and a second transistor. The first transistor includes a first conductor, a first insulator over the first conductor, an oxide semiconductor over the first insulator, a second insulator over the oxide semiconductor, a second conductor over the second insulator, a third conductor, and a fourth conductor. The oxide semiconductor overlaps with the first conductor. The third conductor is in contact with the oxide semiconductor. The fourth conductor is in contact with the oxide semiconductor. The oxide semiconductor includes a first region positioned between the third conductor and the fourth conductor when viewed from above. The first region overlaps with the first conductor and is covered with the second conductor. The second transistor is a p-channel transistor. A layer in which the first transistor is provided and a layer in which the second transistor is provided are provided so as to overlap with each other.

(6) One embodiment of the present invention is a semiconductor device including a first transistor, a second transistor, and a third transistor. The first transistor includes a first conductor, a first insulator over the first conductor, an oxide semiconductor over the first insulator, a second insulator over the oxide semiconductor, a second conductor over the second insulator, a third conductor, and a fourth conductor. The oxide semiconductor overlaps with the first conductor. The third conductor is in contact with the oxide semiconductor. /The fourth conductor is in contact with the oxide semiconductor. The oxide semiconductor includes a first region positioned between the third conductor and the fourth conductor when viewed from above. The first region overlaps with the first conductor and is covered with the second conductor. The second transistor and the third transistor are p-channel transistors. A layer in which the first transistor is provided and a layer in which the second transistor and the third transistor are provided are provided to overlap with each other. A direction in which a gate of the second transistor extends, a direction in which a gate of the third transistor extends, a direction in which the first conductor extends, a direction in which the second transistor extends are parallel. A channel formation region of the second transistor and a channel formation region of the third transistor are aligned in the direction. The channel formation region of the second transistor and a channel formation region of the third transistor are aligned in the direction. The first conductor and the gate of the second transistor are electrically connected to each other through a first connection portion. The second conductor and the gate of the third transistor are electrically connected to each other through the second connection portion. The first region, a channel formation region of the second transistor, and a channel formation region of the third transistor are provided between the first connection portion and the second connection portion when viewed from above. One of the third conductor and the fourth conductor is electrically connected to one of a source and a drain of the second transistor. The other of the source and the drain of the second transistor and one of a source and a drain of the third transistor are electrically connected to each other.

(7) One embodiment of the present invention is a semiconductor device including a first transistor, a second transistor, and a third transistor. The first transistor includes a first conductor, a first insulator over the first conductor, an oxide semiconductor over the first insulator, a second insulator over the oxide semiconductor, a second conductor over the second insulator, a third conductor, and a fourth conductor. The oxide semiconductor overlaps with the first conductor. The third conductor is in contact with the oxide semiconductor. The fourth conductor is in contact with the oxide semiconductor. The oxide semiconductor includes a first region positioned between the third conductor and the fourth conductor when viewed from above. The first region overlaps with the first conductor and is covered with the second conductor. The second transistor and the third transistor are p-channel transistors. A layer in which the first transistor is provided and a layer in which the second transistor and the third transistor are provided are provided to overlap with each other. A direction in which a gate of the second transistor extends, a direction in which a gate of the third transistor extends, and a direction in which the first conductor extends, and a direction in which the second conductor extends are parallel to a first direction. A channel formation region of the second transistor and a channel formation region of the third transistor are aligned perpendicular to the first direction. The first conductor and a gate of the second transistor are electrically connected to each other through a first connection portion. The second conductor and the gate of the third transistor are electrically connected to each other through a second connection portion. The first region, a channel formation region of the second transistor, and a channel formation region of the third transistor are provided between the first connection portion and the second connection portion when viewed from above. One of the third conductor and the fourth conductor and one of a source and a drain of the second transistor are electrically connected to each other. The other of the source and the drain of the second transistor and one of a source and a drain of the third transistor are electrically connected to each other.

(8) One embodiment of the present invention is the semiconductor device according to the embodiment (2) or (6), in which the channel width of the first transistor when viewed from above is larger than the channel widths of the second transistor and the third transistor when viewed from above.

(9) One embodiment of the present invention is the semiconductor device according to the embodiment (7), in which the channel length of the first transistor is larger than the channel lengths of the second transistor and the third transistor.

(10) One embodiment of the present invention is an RFID tag including the semiconductor device according to any one of the embodiments (1) to (9) and an antenna.

(11) One embodiment of the present invention is an electronic device including the semiconductor device according to any one of the embodiments (1) to (9) and a printed wiring board.

A semiconductor device (cell) including a circuit having a reduced circuit area can be provided. Alternatively, a semiconductor device (cell) including a circuit with low power consumption can be provided. Alternatively, a semiconductor device (cell) including a circuit with improved operation speed can be provided. Alternatively, a small semiconductor device can be provided. Alternatively, a semiconductor device with low power consumption can be provided. Alternatively, a semiconductor device with improved operation speed can be provided. Alternatively, a semiconductor device which can be manufactured at low cost can be provided. Alternatively, a novel semiconductor device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIG. 7 is a cross sectional view of a semiconductor device (cell) of one embodiment of the present invention.

FIGS. 8A to 8C are top views of a semiconductor device (cell) of one embodiment of the present invention.

FIG. 9 is a cross-sectional view of a semiconductor device (cell) of one embodiment of the present invention.

DETAILED DESCRIPTION OF THE INVENTION

Figure 1A:
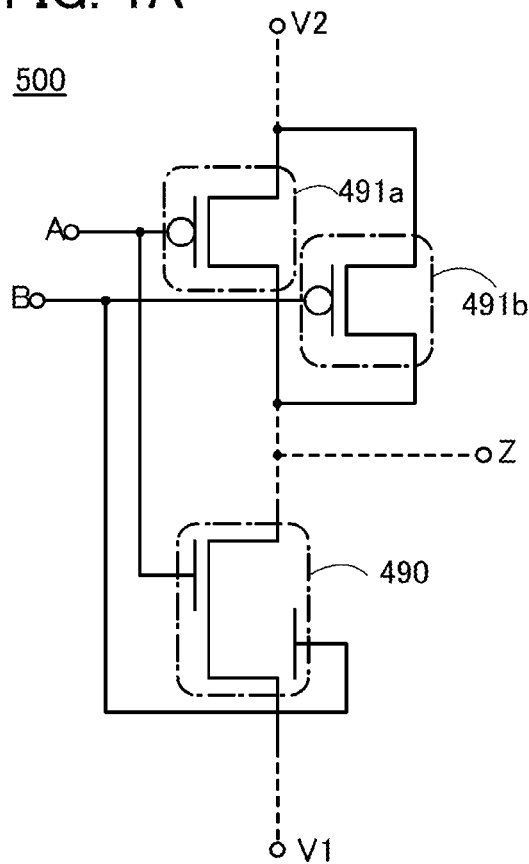
FIGS. 1A to 1D are circuit diagrams of a semiconductor device (cell) according to one embodiment of the present invention.

Embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments described below. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification and the like are not necessarily the same as the ordinal numbers used to specify one embodiment of the present invention.

In this specification, the phrase "A has a region with a concentration B" means, for example, "the concentration of the entire region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "the concentration in a region in which a probable value of A can be obtained in measurement is B".

In this specification, the phrase "A has a region with a size B, a length B, a thickness B, a width B, or a distance B" means, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value of A can be obtained in measurement is B".

A transistor includes three nodes (terminals) called a gate, a source, and a drain. A gate is a node that controls the conduction state of a transistor. Depending on the channel type of the transistor or levels of potentials applied to the nodes (terminals), one of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

A conductor functioning as a gate of the transistor is referred to as a gate electrode. A conductor functioning as a source of the transistor is referred to as a source electrode. A conductor functioning as a drain of the transistor is referred to as a drain electrode. A region functioning as a source of the transistor is referred to as a source region. A region functioning as a drain of the transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Note that in this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

Note that the layout of circuit blocks in a drawing is the one for specifying the positional relationship in description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

In this embodiment, a semiconductor device of one embodiment of the present invention will be described with reference to drawings.

FIGS. 1A to 1D illustrate an example of a circuit configuration of a semiconductor device of one embodiment of the present invention.

Semiconductor devices having circuit structures illustrated in FIGS. 1A to 1D may serve as components of various electronic circuits. Such components are referred to as a standard cell, a logic cell, or simply as a cell. In the following description, these semiconductor devices are referred to as "semiconductor devices (cells)" or simply "cells" in some cases.

A cell 500 illustrated in FIG. 1A includes a transistor 490, a transistor 491*a*, and a transistor 491*b*. Signals A and B are input to the cell 500, and the cell 500 outputs a signal Z. Power supply potentials V1 and V2 are supplied to the cell 500.

The transistor 490 includes a first gate, a second gate, a source, and a drain. The first gate and the second gate are positioned so as to vertically sandwich the channel formation region. The channel formation region includes a region A overlapping with the first gate and not overlapping with the second gate when viewed from above, and a region B not overlapping with the first gate and overlapping with the second gate. In this specification, the transistor 490 with such a structure is represented by a symbol surrounded by a dashed-dotted line FIG. 1A.

A gate of the transistor 491a and the first gate of the transistor 490 are electrically connected to each other, and a signal A is input thereto. A gate of the transistor 491b and the second gate of the transistor 490 are electrically connected to each other, and a signal B is input thereto. The transistors 491a and 491b are connected in parallel. That is, a source of the transistor 491a and a source of the transistor 491b are electrically connected to each other. A drain of the transistor 491a and a drain of the transistor 491b are electrically connected to each other. The sources of the transistors 491a and 491b are supplied with the power supply potential V2. The drains of the transistors 491a and 491b and the drain of the transistor 490 are electrically connected to each other, and output the signal Z. The source of the transistor 490 is supplied with the power supply potential V1. Though connection lines indicated by dotted lines in FIG. 1A are electrically connected to the power supply potentials V1 and V2 and an output terminal of the signal Z, another element such as a transistor may be provided therebetween. A connection line is also illustrated with a dotted line in other drawings.

The transistor 490 is turned on or off depending on the potential of the first gate and the potential of the second gate. When a potential difference Vgs1 between the first gate and the source exceeds a voltage Vth1, a channel is formed (or carriers are induced) in some cases in the channel formation region that overlaps with the first gate when viewed from above. When a potential difference Vgs2 between the second gate and the source exceeds a voltage Vth2, a channel is formed (or carriers are induced) in some cases in the channel formation region that overlaps with the second gate when viewed from above. As described above, the transistor 490 has at least two threshold voltages Vth1 and Vth2. The transistor 490 is on only when Vgs1>Vth1 and Vgs2>Vth2 are satisfied. That is, it can be said that the transistor 490 has a function equivalent to that of a circuit in which two transistors, a transistor whose threshold voltage is Vth1 and a transistor whose threshold voltage is Vth2, are connected in series.

As the transistor 490, an n-channel transistor can be used. As the transistors 491a and 491b, p-channel transistors can be used. The power supply potential V1 may be a low power supply potential VSS. The power supply potential V2 may be a high power supply potential VDD.

Specifically, a complementary metal oxide semiconductor (CMOS) circuit can be formed by using a p-channel transistor and an n-channel transistor. With the CMOS circuit, the power consumption of an electronic circuit can be reduced.

Figure 1B:
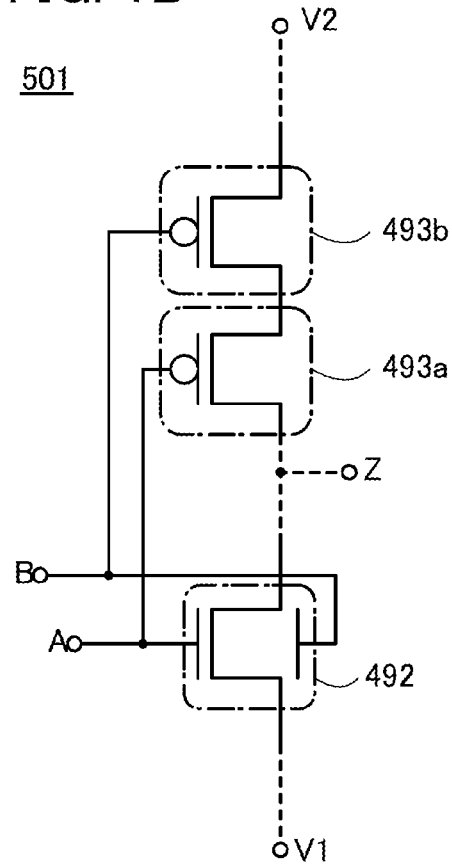
Figure 1C:
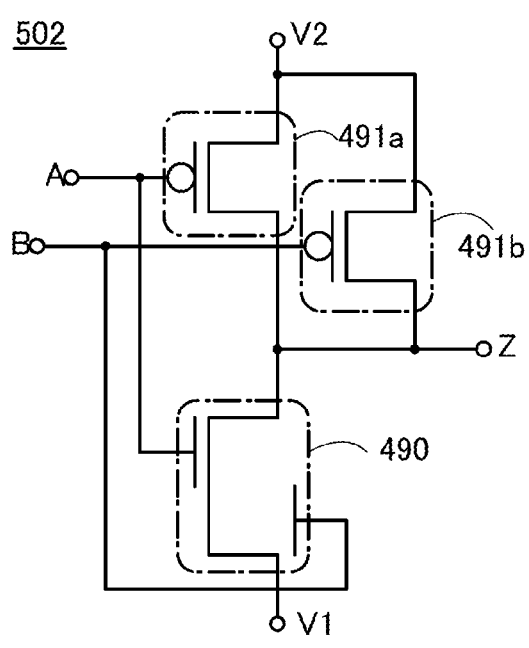

The structure of a cell 502 illustrated in FIG. 1C is partly different from that of the circuit illustrated in FIG. 1A. Specifically, a wiring indicated by a dotted line in FIG. 1A is indicated by a solid line in FIG. 1C. That is, in FIG. 1C, the sources of the transistors 491a and 491b are supplied with the power supply potential V2 without through a transistor. The drains of the transistors 491a and 491b output the signal Z without through a transistor. The source of the transistor 490 is supplied with the power supply potential V1 without through a transistor. The drain of the transistor 490 outputs the signal Z without through a transistor. The cell 502 illustrated in FIG. 1C is a two-input NAND circuit.

The symbol surrounded by a dashed-dotted line in FIGS. 1A and 1C refers to transistors where the first gates are formed over the channel formation region, and the second gates are formed under the channel formation region. In the transistor 490, the first gate may be placed on the source side and the second gate may be placed on the drain side; alternatively, the first gate may be placed on the drain side and the second gate may be placed on the source side.

In FIGS. 1A and 1C, the transistor 490 can be manufactured in a smaller area than the case where a transistor with a threshold voltage of Vth1 and a transistor with a threshold voltage of Vth2 are connected in series as described later. As a result, the cell area can be reduced in some cases.

As an example of the transistor 490, a transistor with a low drain current in an off state (also referred to as a leakage current) can be used. For example, the drain current in an off state is $1 \times 10^{-18}$ A or lower, preferably $1 \times 10^{-1}$ A or lower, further preferably $1 \times 10^{-24}$ A or lower at room temperature (approximately 25° C.), or $1 \times 10^{-15}$ A or lower, preferably $1 \times 10^{-18}$ A or lower, further preferably $1 \times 10^{-21}$ A or lower at 85° C. For example, a transistor including an oxide semiconductor (preferably an oxide including In, Ga, and Zn) in its channel formation region (hereinafter also referred to as an oxide semiconductor transistor in the following description) can be used. Consequently, leakage current of the cell can be reduced.

As an example of the transistors 491a and 491b, a p-channel transistor having a high switching speed can be used. For example, the time required to switch the transistor is shorter than 10 ns, preferably shorter than 1 ns, and more preferably shorter than 0.1 ns. For example, a p-channel Si transistor can be used. As an example of the transistor 490, an n-channel transistor having a high switching speed can be used. For example, the time required to switch the transistor is shorter than 10 ns, preferably shorter than 1 ns, and more preferably shorter than 0.1 ns. For example, an oxide semiconductor transistor can be used. As a result, the delay time of the cell can be shortened.

Note that "a transistor has a high switching speed" means that the time required to switch the transistor is short. For example, "a switching speed of a transistor" means time taken for the transistor to shift from a non-conduction state to a conduction state without load. The time can be regarded as time taken for an increase of a drain current of the transistor to compensate for an increase of charge accumulated in the gate capacitance in response to a potential applied to the gate. Alternatively, the time required to switch a transistor is expressed by $1/(2 \times f_T)$ in some cases, where $f_T$ is the maximum frequency (cutoff frequency) at which current gain becomes 1 or more when the transistor is used as an amplifier.

A cell 501 illustrated in FIG. 1B includes a transistor 492, a transistor 493a, and a transistor 493b. The signals A and B are input to the cell 501, and the cell 501 outputs the signal Z. The power supply potentials V1 and V2 are supplied to the cell 501.

The transistor 492 includes a first gate, a second gate, a source, and a drain. The first gate and the second gate are positioned so as to vertically sandwich the channel formation region. The channel formation region is covered with the first gate and the second gate when viewed from above. In this specification, the transistor 492 with such a structure is represented by a symbol surrounded by a dashed-dotted line FIG. 1B.

A gate of the transistor 493a and the first gate of the transistor 492 are electrically connected to each other, and the signal A is input thereto. A gate of the transistor 493b and the second gate of the transistor 492 are electrically connected to each other, and the signal B is input thereto. The transistors 493a and 493b are connected in series. Thus, a drain of the transistor 493b and a source of the transistor 493a are electrically connected to each other. A source of the transistor 493b is supplied with the power supply potential V2. A drain of the transistor 493a outputs the signal Z. A source of the transistor 492 is supplied with the power supply potential V1. The drain of the transistor 492 outputs the signal Z. Though connection lines indicated by dotted lines in FIG. 1B are electrically connected to the power supply potentials V1 and V2 and an output terminal of the signal Z, another element such as a transistor may be provided therebetween.

The first gate and the second gate of the transistor 492 each function as an input terminal of a semiconductor device (cell). Therefore, a signal is input to the first gate and the second gate of the transistor 492 instead of a power source with a constant potential. For example, a signal output from another cell is input to the first gate and the second gate of the transistor 492. For example, the first gate and the second gate of the transistor 492 are electrically connected to a signal wiring.

The transistor 492 is turned on or off depending on the potential of the potential of the first gate and the potential of the second gate. When a potential difference Vgs1 between the first gate and the source exceeds a voltage Vth1, a channel is formed (or carriers are induced) in some cases in the channel formation region that overlaps with the first gate when viewed from above. When a potential difference Vgs2 between the second gate and the source exceeds a voltage Vth2, a channel is formed (or carriers are induced) in the channel formation region that overlaps with the second gate when viewed from above. Thus, the transistor 492 has at least two threshold voltages, that is, Vth1 and Vth2. The transistor 492 is on when Vgs1>Vth1 and Vgs2>Vth2 are satisfied. That is, it can be said that the transistor 492 has a function equivalent to that of a circuit in which two transistors, a transistor whose threshold voltage is Vth1 and a transistor whose threshold voltage is Vth2, are connected in parallel.

Since the channel formation region of the transistor 492 is controlled by the first gate and the second gate, Vth1 may depend on Vgs2, and Vth2 may depend on Vgs1. For example, when gate capacitance per unit area between the first gate and the channel formation region is Cg1 and gate capacitance per unit area between the second gate and the channel formation region is Cg2, the condition where the transistor 492 is turned on is represented by using Vth0 as $(Cg1 \times Vgs1 + Cg2 \times Vgs2)/(Cg1+Cg2) > Vth0$ in some cases. In that case, the threshold voltage Vth1 regarding the first gate is represented as Vth1 (Vgs2)=$(1+Cg2/Cg1) \times Vth0 - Cg2/Cg1 \times Vgs2$, which indicates that the threshold voltage Vth1 depends on Vgs2. The threshold voltage Vth2 regarding the second gate is represented as Vth2 (Vgs1)=$(1+Cg1/Cg2) \times Vth0 - Cg1/Cg2 \times Vgs1$, which indicates that Vth2 depends on Vgs1. In logic operation, the transistor 492 is turned on when (Vgs1, Vgs2)=(VSS, VDD), (VDD, VSS), or (VDD, VDD), and the transistor 492 is turned off when (Vgs1, Vgs2)=(VSS, VSS).

As the transistor 492, an n-channel transistor can be used. As the transistors 493a and 493b, p-channel transistors can be used. The power supply potential V1 may be a low power supply potential VSS. The power supply potential V2 may be a high power supply potential VDD.

Specifically, a complementary metal oxide semiconductor (CMOS) circuit can be formed by using a p-channel transistor and an n-channel transistor. With the CMOS circuit, the power consumption of an electronic circuit can be reduced.

Figure 1D:
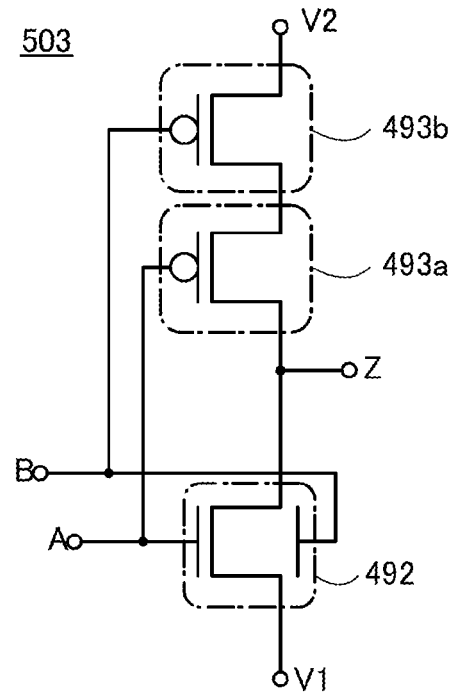

The structure of a cell 503 illustrated in FIG. 1D is partly different from that of the circuit illustrated in FIG. 1B. Specifically, a wiring indicated by a dotted line in FIG. 1B is indicated by a solid line in FIG. 1D. That is, in FIG. 1D, the source of the transistor 493b is supplied with a power supply potential V2 without through a transistor. The drain of the transistor 493a outputs the signal Z without through a transistor. The source of the transistor 492 is supplied with the power supply potential V1 without through a transistor. The drain of the transistor 492 outputs the signal Z without through a transistor. The cell 503 illustrated in FIG. 1D is a two-input NOR circuit.

In FIGS. 1B and 1D, the transistor 493b, the transistor 493a, and the transistor 492 are arranged in this order in the cells 501 and 503; however, one embodiment of the present invention is not limited thereto. The transistor 493a, 493b, and 492 may be arranged in this order in the cells 501 and 503. That is, the gate of the transistor 493b and the first gate of the transistor 492 may be electrically connected to each other, and the gate of the transistor 493a and the second gate of the transistor 492 may be electrically connected to each other.

In FIGS. 1B and 1D, the transistor 492 can be manufactured in a smaller area than the case where a transistor with a threshold voltage Vth1 and a transistor with a threshold voltage is Vth2 are connected in series as described later. As a result, the cell area can be reduced in some cases.

As an example of the transistor 492, a transistor with a low drain current in an off state (also referred to as a leakage current) can be used. For example, the drain current in an off state is $1 \times 10^{-18}$ A or lower, preferably $1 \times 10^{-21}$ A or lower, further preferably $1 \times 10^{-24}$ A or lower at room temperature (approximately 25° C.), or $1 \times 10^{-15}$ A or lower, preferably $1 \times 10^{-18}$ A or lower, further preferably $1 \times 10^{-21}$ A or lower at 85° C. As an example, an oxide semiconductor transistor can be used. Consequently, leakage current of the cell can be reduced.

As an example of the transistors 493a and 493b, a p-channel transistor having a high switching speed can be used. For example, the time required to switch the transistor is shorter than 10 ns, preferably shorter than 1 ns, and more preferably shorter than 0.1 ns. For example, a p-channel Si transistor can be used. As an example of the transistor 492, an n-channel transistor having a high switching speed can be used. For example, the time required to switch the transistor is shorter than 10 ns, preferably shorter than 1 ns, and more preferably shorter than 0.1 ns. For example, an oxide semiconductor transistor can be used. As a result, the delay time of the cell can be shortened.

As the semiconductor device (cell) of one embodiment of the present invention, a k-input NAND circuit, a k-input AND circuit, a k-input NOR circuit, and a k-input OR circuit (k is an integer of 2 or more) are given. Alternatively, an XOR circuit, an XNOR circuit, an AND-NOR circuit, an OR-NAND circuit, an AND-OR-INV circuit, an OR-AND-INV circuit, a flip-flop, a settable flip-flop, a resettable flip-flop, a settable and resettable flip-flop, an adder circuit, a half adder circuit, a multiplexer, a demultiplexer, a register, a scan register, a retention register, an isolator, a decoder, and the like are given.

Examples of an electronic circuit including a semiconductor device (cell) include a CPU, a graphics processing unit (GPU), a digital signal processor (DSP), a microcontroller unit (MCU), a radio frequency identification (RF-ID), and a custom LSI. In these electronic circuits, a plurality of cells are arranged in a plurality of rows, and input/output terminals of the cells are connected to each other so as to function as the electronic circuits.

The semiconductor device (cell) may include a plurality of input terminals and one output terminal.

Next, an example of the structure of the semiconductor device (cell) of one embodiment of the present invention is described with reference to FIGS. 2A to 2C, FIG. 3, and FIG. 4.

Note that in FIGS. 2A to 2C, FIG. 3, and FIG. 4, some components such as an insulator are omitted for easy understanding, and a conductor or the like formed in the same layer are shown with the same hatching pattern.

Figure 2A:
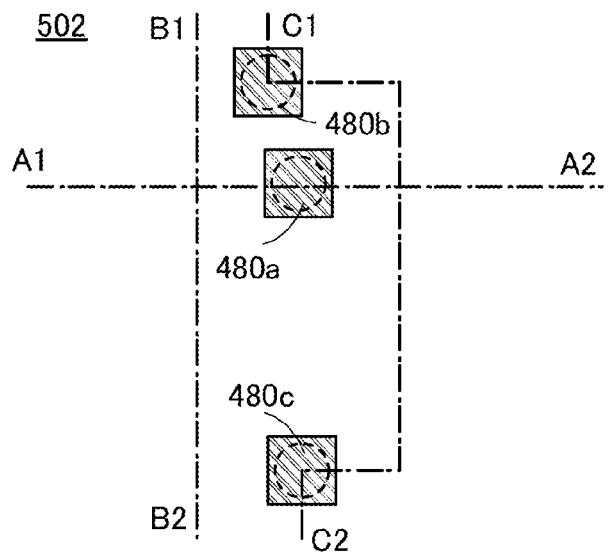
FIGS. 2A to 2C are top views of a semiconductor device (cell) of one embodiment of the present invention.
Figure 2B:
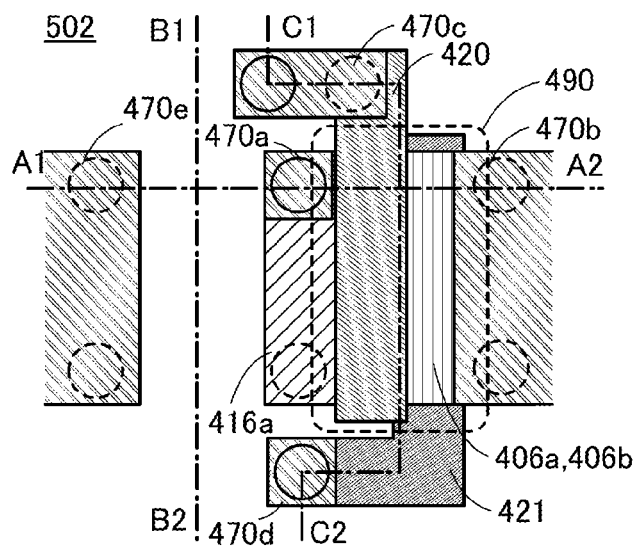
Figure 2C:
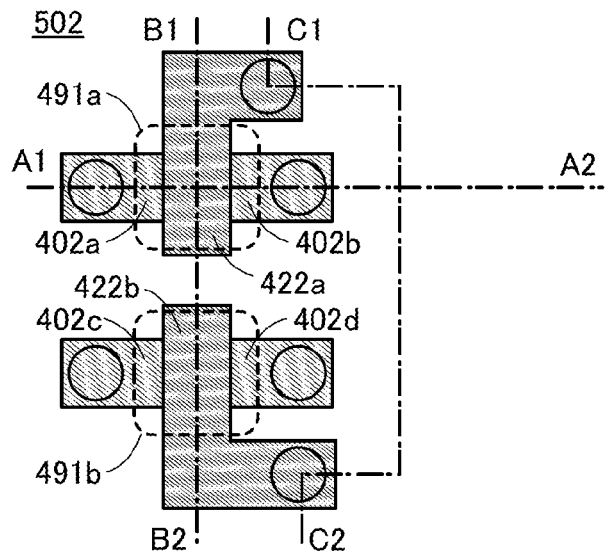

FIGS. 2A to 2C are top views illustrating an example of the structure of the cell 502 illustrated in FIG. 1C. FIG. 2A is a top view of a region including portions where the signals A, B, and Z are input or output. FIG. 2B is a top view of a region including the transistor 490. FIG. 2C is a top view of a region including the transistors 491a and 491b. In FIG. 2B, the hatching pattern of a semiconductor 406c is omitted.

Figure 3:
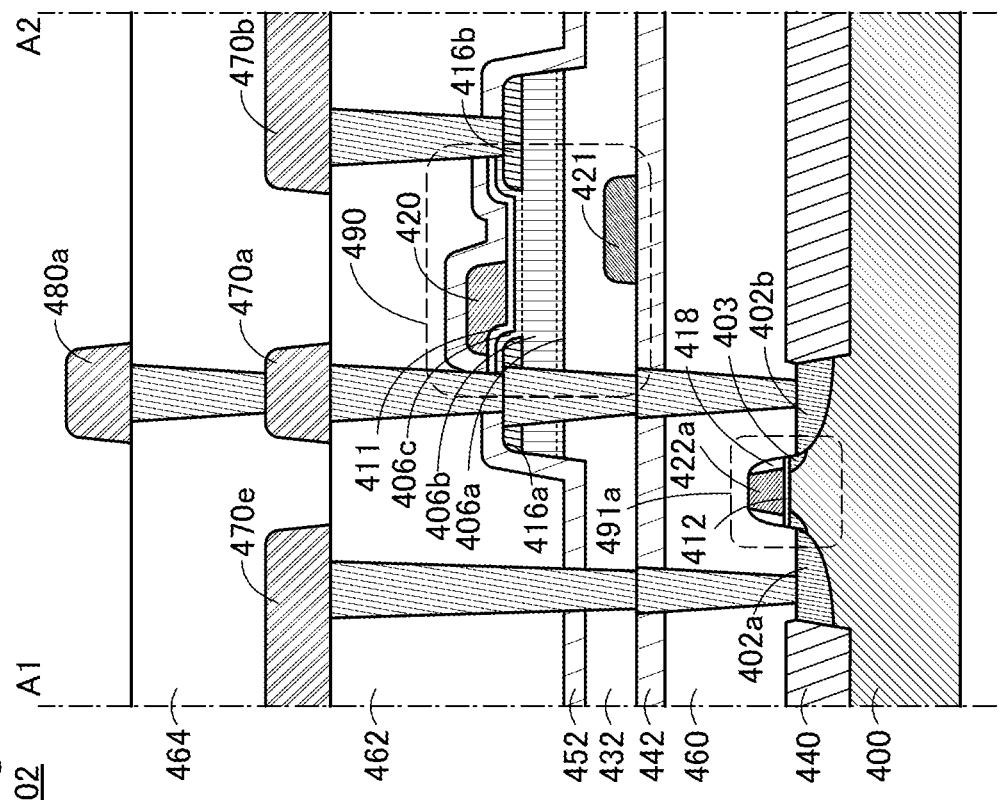
FIG. 3 is a cross-sectional view of a semiconductor device (cell) of one embodiment of the present invention.
Figure 4:
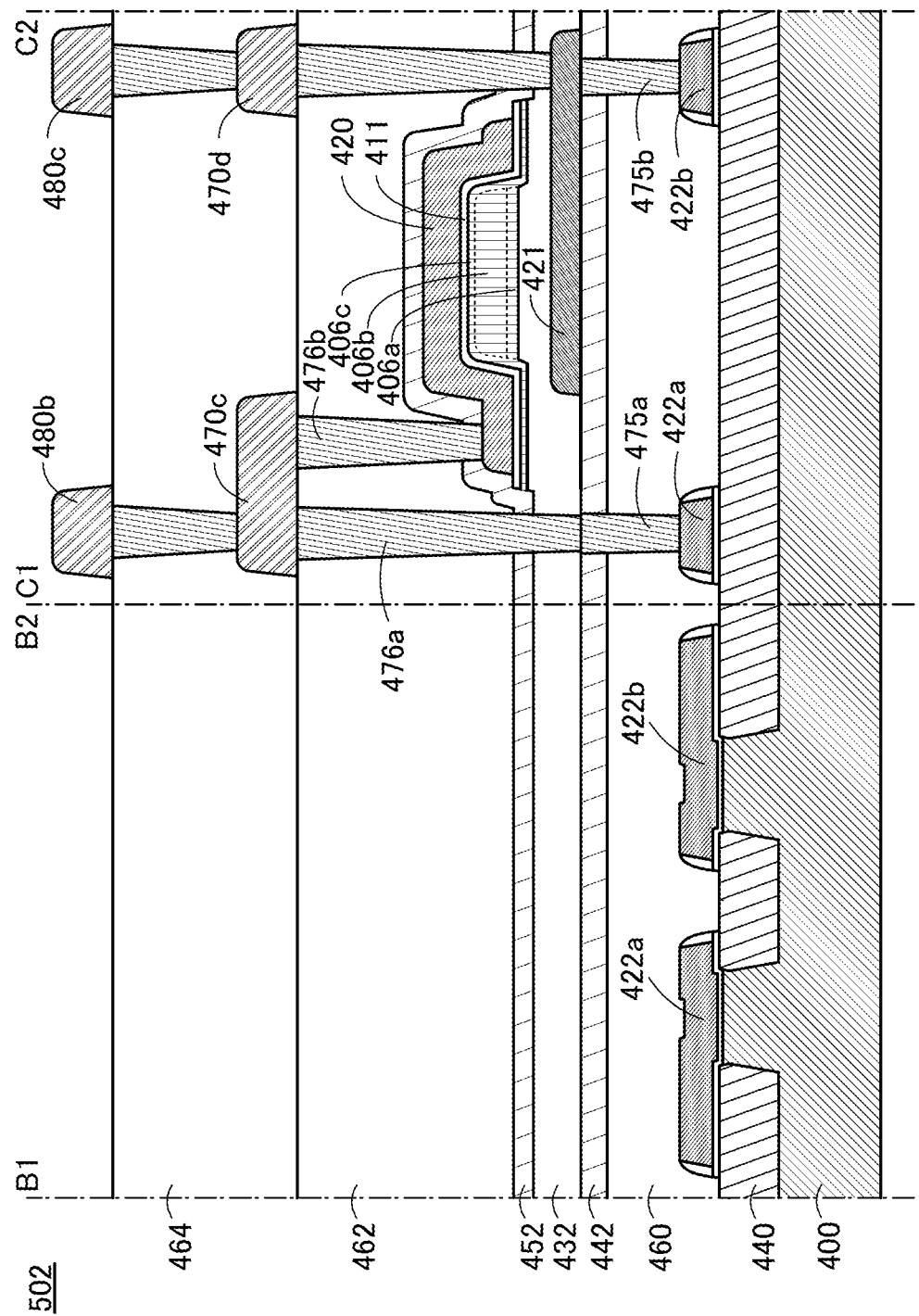
FIG. 4 is a cross-sectional view of semiconductor device (cell) according to one embodiment of the present invention.

FIGS. 3 and 4 are cross-sectional views illustrating an example of the structure of the cell 502. A cross section taken along dashed-dotted line A1-A2 in FIGS. 2A to 2C is shown in FIG. 3. A cross section taken along dashed-dotted line B1-B2 in FIGS. 2A to 2C is shown on the left side of FIG. 4. A cross section taken along dashed-dotted line C1-C2 in FIGS. 2A to 2C is shown on the right side of FIG. 4.

The cell 502 illustrated in FIGS. 2A to 2C, FIG. 3, and FIG. 4 includes the transistor 490, the transistor 491a, and the transistor 491b. These transistors are connected as necessary through a plurality of conductors, whereby the circuit illustrated in FIG. 1C is formed. Here, as an example, an oxide semiconductor transistor is used as the transistor 490, and p-channel Si transistors are used as transistors 491a and 491b.

Specifically, the cell 502 illustrated in FIGS. 2A to 2C, FIG. 3, and FIG. 4 includes a substrate 400, the transistors 491a and 491b, an insulator 460 over the transistors 491a and 491b, an insulator 442 over the insulator 460, the transistor 490 over the insulator 442, an insulator 452 over the transistor 490, an insulator 462 over the insulator 452, conductors 470a to 470e over the insulator 462, an insulator 464 over the insulator 462 and the conductors 470a to 470e, and conductors 480a to 480c over the insulator 464. One or a plurality of layers of insulators or conductors may be further provided over the insulator 464 and the conductors 480a to 480c. Openings are provided in the insulators 460, 442, 432, 452, 462, and 464 as necessary, and conductors are provided in the openings.

As illustrated in FIGS. 2A to 2C, FIG. 3, and FIG. 4, a layer including the transistor 490 and a layer including the transistors 491a and 491b are provided so as to overlap with each other in the cell 502. In such a case, the cell 502 can be reduced in size. The transistor 490 and the transistor 491a or the transistor 491b may be arranged so as to overlap with each other. In such a case, the memory cell 502 can be reduced in size.

An expression "a transistor A and a transistor B overlap with each other" means that at least part of a gate, a drain, or a source of the transistor A overlaps with part of a gate, a drain, or a source of the transistor B. Moreover, the expression means that a region including the gate, the drain, and the source of the transistor A at least partly overlaps with a region including the gate, the drain, and the source of the transistor B. Furthermore, the expression also means that a region including any of components of the transistor A at least partly overlaps with a region including any of components of the transistor B.

The structure of the transistor 491a illustrated in FIG. 3 is described.

The transistor 491a includes an insulator 412 over the substrate 400; a conductor 422a over the insulator 412; an insulator 418 in contact with a side surface of the conductor 422a; and regions 402a, 402b, and 403 in the substrate 400. The regions 402a and 402b do not overlap with the conductor 422a and the insulator 418. The region 403 overlaps with the insulator 418.

The insulator 412 serves as a gate insulator of the transistor 491a. The conductor 422a serves as a gate of the transistor 491a. The insulator 418 serves as a sidewall insulator (also referred to as a sidewall) of the conductor 422a. The regions 402a and 402b serve as a source and a drain of the transistor 491a. The region 403 serves as a lightly doped drain (LDD) region of the transistor 491a.

The region 403 can be formed by adding an impurity using the conductor 422a as a mask. After that, the insulator 418 is formed and an impurity is added using the conductor 422a and the insulator 418 as masks, so that the regions 402a and 402b can be formed. Therefore, in the case where the regions 403, 402a, and 402b are formed by adding the same kind of impurities, the region 403 has a lower impurity concentration than the regions 402a and 402b.

When the transistor 491a includes the region 403, a short-channel effect can be suppressed. Therefore, the structure of the transistor 491a is suitable for miniaturization.

The transistor 491b illustrated in FIG. 2C has a structure similar to that of the transistor 491a. The transistor 491b includes a conductor 422b instead of the conductor 422a. The transistor 491b includes regions 402c and 402d instead of the regions 402a and 402b.

The transistors 491a and 491b is kept away from another transistor provided in the substrate 400 by an insulator 440 or the like. Although an example where the insulator 440 is formed by a shallow trench isolation (STI) method is shown, one embodiment of the present invention is not limited thereto. For example, instead of the insulator 440, an insulator formed by a local oxidation of silicon (LOCOS) method may be used so that transistors are separated from each other.

The structure of the transistor 490 in FIG. 3 will be described.

As illustrated in FIG. 3, the transistor 490 includes a conductor 421, an insulator 432 over the conductor 421, the semiconductor 406a over the insulator 432, a semiconductor 406b over the semiconductor 406a, the conductors 416a and 416b in contact with a top surface of the semiconductor 406b, the semiconductor 406c in contact with a side surface of the semiconductor 406a, top and side surfaces of the semiconductor 406b, top and side surfaces of the conductor 416a, and top and side surfaces of the conductor 416b, the insulator 411 over the semiconductor 406c, and the conductor 420 over the insulator 411.

The conductor 421 serves as a second gate of the transistor 490. The insulator 432 serves as a gate insulator of the transistor 490. The conductor 416a and the conductor 416b serve as a source and a drain of the transistor 490. The insulator 411 serves as a gate insulator of the transistor 490. The conductor 420 serves as a first gate of the transistor 490. The semiconductor 406b serves as a channel formation region.

The second gate of the transistor 490 may be expressed as the gate (the conductor 421). The first gate of the transistor 490 may be expressed as the gate (the conductor 420).

As illustrated in FIG. 2B and FIG. 3, in a region positioned between the conductor 416a and the conductor 416b when viewed from above, the semiconductor 406b includes a region A overlapping with the conductor 421 and not overlapping with the conductor 420, and a region B not overlapping with the conductor 421 and overlapping with the conductor 420.

That is, the channel formation region of the transistor 490 includes the region A overlapping with the gate (the conductor 421) and not overlapping with the gate (the conductor 420), and the region B not overlapping with the gate (the conductor 421) and overlapping with the gate (the conductor 420).

Moreover, as illustrated in FIG. 2B and FIG. 3, in the region positioned between the conductor 416a and the conductor 416b when viewed from above, the semiconductor 406b includes a region that overlaps with the conductor 421 and the conductor 420.

That is, the channel formation region of the transistor 490 includes a region overlapping with the gate (the conductor 421) and the gate (the conductor 420).

In other words, in the transistor 490, the conductor 421 and the conductor 420 overlap with each other when viewed from above.

In addition, the semiconductor 406b may include a region not overlapping with the conductors 420 and 421 in a region sandwiched between the conductor 416a and the conductor 416b when viewed from above. The region is preferably smaller than the region A. The region is preferably smaller than the region B.

That is, the channel formation region of the transistor 490 may include a region not overlapping with a gate (the conductor 421) and not overlapping with a gate (the conductor 420).

In other words, in the transistor 490, the conductor 421 and the conductor 420 may be arranged with a space therebetween when viewed from above. The space is preferably smaller than the width of the conductor 421. The space is preferably smaller than the width of the conductor 420.

In the transistor 490, an end portion of the conductor 421 and an end portion of the conductor 420 may be aligned when viewed from above.

With such a structure, the transistor 490 has a function similar to that of a circuit in which two transistors are connected in series, and the area of the transistor 490 can be smaller than that of the circuit in which two transistors having gates formed using conductors in one layer are connected in series.

Two gates adjacent to each other included in the transistor 490 each include a connection portion (not illustrated) for inputting a signal. These two connection portions may be arranged at both sides of the channel formation region when viewed from above. As a result, this structure is preferable because the connection portions of the transistor 490 can be arranged near the channel formation region, and the transistor 490 including the connection portions can be provided in a small region.

The insulators 432 and 411 that serve as gate insulators of the transistor 490 preferably have approximately the same thickness. In this case, a voltage applied to the conductor 421 and a voltage applied to the conductor 420 which are needed to turn on the transistor 490 can be approximately equal to each other. The thickness of the insulator 432 is 1/10 to 10 times, preferably 1/5 to 5 times, and further preferably 1/2 to 2 times of the thickness of the insulator 411.

As illustrated in FIG. 4, the conductor 420 electrically surrounds the semiconductor 406b in the channel width direction, that is, surrounds not only the top surface but also the side surfaces of the semiconductor 406b. Such a structure of a transistor is referred to as a surrounded channel (s-channel) structure. By employing the s-channel structure in the transistor, the subthreshold swing (also referred to as S value) of the transistor 490 can be decreased, whereby a short-channel effect of the transistor can be suppressed. Therefore, the s-channel structure is suitable for miniaturization.

Here, reduction in the area occupied by the transistor 490 is explained with reference to FIGS. 5A to 5C.

Figure 5A:
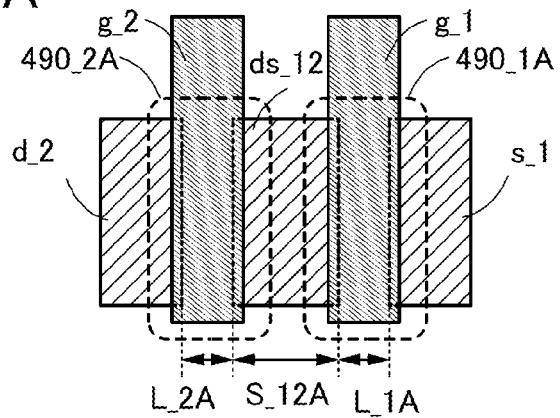
FIGS. 5A to 5C are top views of a semiconductor device (cell) of one embodiment of the present invention.

FIG. 5A is a top view illustrating an example of a configuration in which two transistors (490_1A and 490_2A) whose gates are formed using conductors in the same layer are connected in series. In FIG. 5A, a distance DA between a source (a conductor s_1) of the transistor 490_1A and a drain (a conductor d_2) of the transistor 490_2A is an indicator of the size of the two transistors in the channel length direction. The distance DA is represented as the sum of a channel length L_1A of the transistor 490_1A, a channel length L_2A of the transistor 490_2A, and a distance S_12A between a channel formation region of the transistor 490_1A and that of the transistor 490_2A.

The distance DA is estimated when the minimum space between the conductors that is determined by processing limitation in a fabrication process is $F_S$, and the minimum width of the line of the conductors is $F_L$. The channel length L_1A is a distance between the source (the conductor s_1) and the drain (a conductor ds_12), and the minimum value is $F_S$. The channel length L_2A is a distance between a source (the conductor ds_12) and the drain (the conductor d_2), and the minimum value is $F_S$. The distance S_12A is the width of the conductor ds_12, and the minimum value is $F_L$. Therefore, the distance DA is more than or equal to $2F_S+F_L$.

Figure 5B:
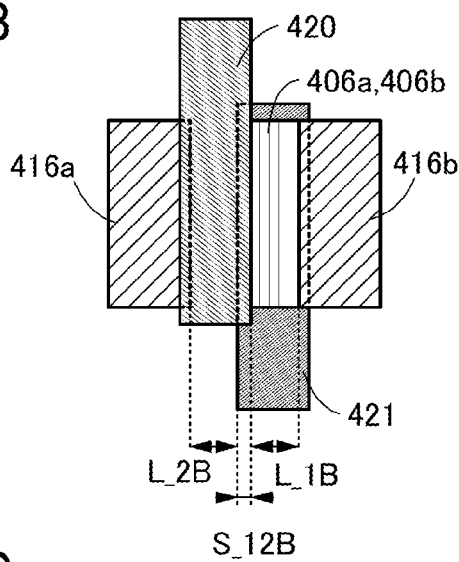

FIG. 5B is a top view illustrating a structure example in which the conductors 421 and 420 overlap with each other in the transistor 490 when viewed from above. In FIG. 5B, a distance between the source (the conductor 416b) of the transistor 490 and the drain (the conductor 416a) of the transistor 490 is an indicator of the size of the transistor 490 in the channel length direction. The distance is represented as the sum of a distance L_1B between the source (the conductor 416b) of the transistor 490 and the gate (the conductor 420) of the transistor 490, a distance L_2B between the drain (the conductor 416a) and the gate (the conductor 421) of the transistor 490, and a width S_12B of a region where the conductor 421 and the conductor 420 overlap with each other when viewed from above. The transistor 490 may have a function similar to that of a series connection of a transistor whose channel length is L_1B and a transistor whose channel length is L_2B.

The channel lengths L_1B and L_2B can be smaller than $F_S$ and $F_L$ because L_1B and L_2B are determined by the end portions of conductors in different layers. Similarly, the distance S_12B between two channel formation regions can be smaller than $F_S$ or $F_L$ because the distance S_12B is determined by the end portions of conductors in different layers. Therefore, the transistor 490 illustrated in FIG. 5B can be positioned in a narrower area than two transistors connected in series illustrated in FIG. 5A. The channel lengths L_1B and L_2B are preferably small within a range that achieves favorable characteristics of the transistors. For example, the channel lengths L_1B and L_2B are preferably smaller than $F_S$ and $F_L$. For example, the channel lengths L_1B and L_2B are less than or equal to 100 nm, preferably less than or equal to 60 nm, further preferably less than or equal to 30 nm, still further preferably less than or equal to 20 nm. Accordingly, the on-state current of the transistor 490 can be increased. The width S_12B is preferably smaller than or equal to $F_S$ or $F_L$. For example, the width S_12B is less than or equal to 100 nm, preferably less than or equal to 60 nm, further preferably less than or equal to 30 nm, still further preferably less than or equal to 20 nm. Thus, the area occupied by the transistor 490 can be reduced.

Figure 5C:
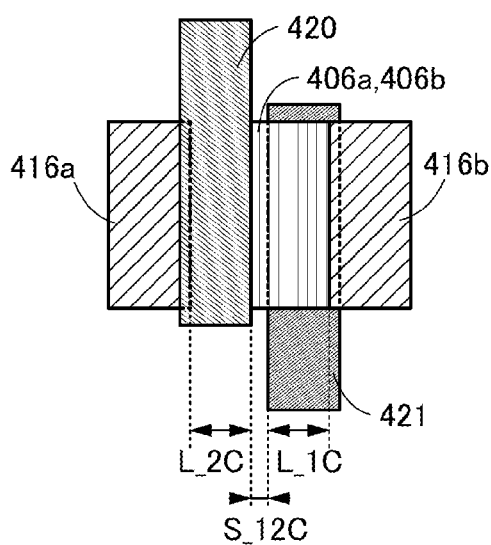

FIG. 5C is a top view illustrating a structure example in which the conductors and 421 and 420 do not overlap with each other in the transistor 490 when viewed from above. In FIG. 5C, a distance between the source (the conductor 416b) of the transistor 490 and a drain (the conductor 416a) of the transistor 490 is an indicator of the size of two transistors in the channel length direction. The distance is represented as the sum of a distance L_1C between the source (the conductor 416b) of the transistor 490 and the end portion of the gate (the conductor 421) of the transistor 490 which is farther from the conductor 416b, the distance L_2C between the drain (the conductor 416a) of the transistor 490 and the end portion of the gate (the conductor 420) of the transistor 490 which is farther from the conductor 416a, and the distance S_12C between the conductor 421 and the conductor 420. The transistor 490 may have a function similar to that of a series connection of a transistor whose channel length is L_1C and a transistor whose channel length is L_2C.

The channel lengths L_1C and L_2C can be smaller than $F_S$ and $F_L$ because L_1C and L_2C are determined by the end portions of conductors in different layers. Similarly, the distance S_12C between two channel formation regions can be smaller than $F_S$ or $F_L$ because the distance S_12C is determined by the end portions of conductors in different layers. Therefore, the transistor 490 illustrated in FIG. 5C can be positioned in a narrower area than two transistors connected in series illustrated in FIG. 5A. The channel lengths L_1C and L_2C are preferably small within a range that achieves favorable characteristics of the transistors. For example, the channel lengths L_1C and L_2C are preferably smaller than $F_S$ and $F_L$. For example, the channel lengths L_1C and L_2C are less than or equal to 100 nm, preferably less than or equal to 60 nm, further preferably less than or equal to 30 nm, still further preferably less than or equal to 20 nm. Accordingly, the on-state current of the transistor 490 can be increased. The width S_12C is preferably smaller than or equal to $F_S$ or $F_L$. For example, the width S_12C is less than or equal to 100 nm, preferably less than or equal to 60 nm, further preferably less than or equal to 30 nm, still further preferably less than or equal to 20 nm. Thus, the area occupied by the transistor 490 can be reduced.

The semiconductor 406b of the transistor 490 illustrated in FIG. 5C may have high resistance in a region between the conductor 421 and the conductor 420 when viewed from above. As a result, the on-state current of the transistor 490 is decreased in some cases. Therefore, the distance S_12C between two channel formation regions is preferably small. For example, the distance S_12C is less than or equal to the sum of the thickness of the insulator 432 serving as a gate insulator and the thickness of the insulator 411 serving as a gate insulator, preferably less than or equal to the thickness of the insulator 432, or the thickness of the insulator 411. As a result, when the transistor 490 is turned on, carriers are induced and the resistance is lowered in the region of the semiconductor 406b between the conductor 421 and the conductor 420 by an electric field at end portions (fringes) of the conductors 421 and 420 serving as gates. Accordingly, the on-state current of the transistor 490 can be increased as compared to the case where the distance S_12C is larger.

Thus, the area occupied by the transistor 490 can be reduced. As a result, the area of a semiconductor device (cell) can be reduced.

Here, the characteristics of the oxide semiconductor transistor and those of the transistor with an s-channel structure are described.

When the transistor 490 has an s-channel structure, the channel formation region can be easily controlled by a gate electric field from the side surface side of the semiconductor 406b. The structure where the conductor 420 reaches below the semiconductor 406b is preferable because higher controllability can be achieved. Consequently, the subthreshold swing (also referred to as S value) of the transistor 490 can be decreased, so that the current of the transistor 490 in an off state can be decreased.

Accordingly, favorable electrical characteristics can be obtained even when the transistor is miniaturized. For example, the channel length of the transistor 490 is preferably less than or equal to 40 nm, further preferably less than or equal to 30 nm, still further preferably less than or equal to 20 nm and the channel width of the transistor 490 is preferably less than or equal to 40 nm, further preferably less than or equal to 30 nm, still further preferably less than or equal to 20 nm. With miniaturization of the transistor, the area of the semiconductor device (cell) can be reduced.

When the transistor 490 has an s-channel structure, a channel might be formed in the entire semiconductor 406b (bulk). Therefore, as the semiconductor 406b has a larger thickness, a channel formation region becomes larger. For example, the semiconductor 406b has a region with a thickness of greater than or equal to 20 nm, preferably greater than or equal to 40 nm, more preferably greater than or equal to 60 nm, still more preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased. With this structure in the s-channel structure, a large amount of current can flow between the source and the drain of the transistor, so that a high current in an on state (on-state current) can be achieved.

As a result, the switching speed of the transistor can be increased in some cases. For example, the time required to switch the transistor is shorter than 10 ns, preferably shorter than 1 ns, and more preferably shorter than 0.1 ns.

When the transistor 490 is an accumulation-type transistor whose majority carriers are electrons, an electric field extending from the source and the drain to the channel formation region is easily shielded within a short distance; thus, carriers can be easily controlled with a gate electric field even when the channel is short. Accordingly, favorable electrical characteristics can be obtained even when the transistor is miniaturized.

Unlike in the case of using a semiconductor substrate as a channel formation region, when the transistor 490 is formed over an insulating surface, parasitic capacitance is not formed between the gate and the body or the semiconductor substrate and thus, carriers can be easily controlled with a gate electric field. Accordingly, favorable electrical characteristics can be obtained even when the transistor is miniaturized.

In the transistor 490 illustrated in FIG. 3, the conductors 416a and 416b are not in contact with the side surfaces of the semiconductor 406b. Thus, an electric field applied from the conductor 420 functioning as a gate to the side surfaces of the semiconductor 406b is less likely to be blocked by the conductor 416a and the conductor 416b. Moreover, the conductors 416a and 416b are not in contact with a top surface of the insulator 432. Thus, excess oxygen (oxygen) released from the insulator 432 is not consumed to oxidize the conductors 416a and 416b. Accordingly, excess oxygen (oxygen) released from the insulator 432 can be efficiently used to reduce oxygen vacancies in the semiconductor 406b.

At least part (or all) of the conductor 416a (and/or the conductor 416b) is in contact with at least part (or all) of a surface, a side surface, a top surface, and/or a bottom surface of a semiconductor layer, e.g., the semiconductor 406b. The contact portion of the semiconductor 406b, in which donor levels are formed by entry of hydrogen into oxygen vacancy sites in some cases, includes an n-type conductive region. A state in which hydrogen enters sites of oxygen vacancies are denoted by $V_OH$ in some cases. Because of current flow in the n-type conductive region, a high on-state current can be achieved.

Furthermore, it is effective to reduce the concentration of impurities in the semiconductor 406b to make the oxide semiconductor intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$. In the oxide semiconductor, hydrogen, nitrogen, carbon, silicon, and metal elements that are not main components are impurities. For example, hydrogen and nitrogen form donor levels to increase the carrier density.

A transistor including a substantially intrinsic oxide semiconductor has a low carrier density and thus rarely has negative threshold voltage. In addition, because of few carrier traps in the oxide semiconductor, the transistor including the oxide semiconductor has small variation in electrical characteristics and high reliability. Moreover, a transistor including the oxide semiconductor enables an extremely low off-state current.

For example, the drain current at the time when the transistor including the oxide semiconductor is off can be less than or equal to $1 \times 10^{-18}$ A, preferably less than or equal to $1 \times 10^{-21}$ A, further preferably less than or equal to $1 \times 10^{-24}$ A at room temperature (approximately 25° C.); or less than or equal to $1 \times 10^{-15}$ A, preferably less than or equal to $1 \times 10^{-18}$ A, further preferably less than or equal to $1 \times 10^{-21}$ A at 85° C. The off state of a transistor refers to a state where the gate voltage is lower than the threshold voltage in an n-channel transistor.

Note that the above-described three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided under or over the semiconductor 406a or under or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, under the semiconductor 406a, over the semiconductor 406c, and under the semiconductor 406c.

Next, a connection and an arrangement of the transistors 490, 491a and 491b, are described.

The conductor 470e is supplied with the high power supply potential VDD. The conductor 470b is supplied with the low power supply potential VSS. The conductor 470e is formed in the same layer as the conductor 470b. The conductor 470e is connected to the source (the region 402a) of the transistor 491a and the source (the region 402c) of the transistor 491b with a conductor provided therebetween. The conductor 470b is connected to the source (the conductor 416b) of the transistor 490 with a conductor provided therebetween. The conductor 480a is an output portion that outputs the signal Z. The conductor 480a is connected to the drain (the conductor 416a) of the transistor 490 with a conductor provided therebetween. The conductor 480b is an input portion to which the signal A is input. The conductor 480b is connected to the gate (the conductor 420) of the transistor 490 with a conductor provided therebetween. The conductor 480c is an input portion to which the signal B is input. The conductor 480c is connected to the gate (the conductor 421) of the transistor 490 with a conductor provided therebetween.

The gate (the conductor 422a) of the transistor 491a and the gate (the conductor 420) of the transistor 490 are electrically connected to each other through a first connection portion. The gate (the conductor 422b) of the transistor 491b and the gate (the conductor 421) of the transistor 490 are electrically connected to each other through a second connection portion. The drain (the conductor 416a) of the transistor 490, the drain (the region 402b) of the transistor 491a, and the drain (the region 402d) of the transistor 491b are electrically connected to each other.

In FIG. 4, the first connection portion is conductors 475a, 476a, 470c, and/or 476b. The second connection portion is a conductor 475b.

In this specification, a connection portion of a conductor A and a conductor B is a portion for connecting the conductor A and the conductor B. For example, in the case where the conductor A and the conductor B are directly connected, a region where the conductor A is in contact with the conductor B is a connection portion. For example, in the case where the conductor A and the conductor B are connected to each other with the conductor C and/or the conductor D provided therebetween, the conductor C and/or the conductor D is a connection portion.

The direction in which the gate of the transistor 491a extends and the direction in which the gate of the transistor 491b extends are substantially parallel to each other.

A channel formation region of the transistor 491a and a channel formation region of the transistor 491b are aligned in this direction.

A gate of a transistor is provided to cross a region including a source, a channel formation region, or a drain. A gate extends in this crossing direction. The direction in which a gate extends is referred to as a channel width direction. A direction where current flows in a transistor is referred to as a channel length direction. A channel length direction is substantially perpendicular to a channel width direction. In the top views illustrated in FIGS. 2A to 2C, the channel width direction is the direction of dashed-dotted line B1-B2, and the channel length direction is the direction of dashed-dotted line A1-A2.

The channel width direction of the transistor 491a and the channel width direction of the transistor 491b are substantially parallel to each other.

The channel formation region of the transistor 491a and the channel formation region of the transistor 491b are aligned in the channel width direction.

As a result, the transistor 491a and the transistor 491b including their connection portions can be provided in smaller regions.

The channel formation region of the transistor 490 is provided between the first connection portion and the second connection portion when viewed from above. Accordingly, the first connection portion and the second connection portion can be provided close to the channel formation region of the transistor 490, so that the transistor 490 including the connection portions can be provided in a smaller region.

The direction in which the gate of the transistor 491a extends, the direction in which the gate of the transistor 491b extends, the direction in which the gate (the conductor 420) of the transistor 490 extends, and the direction in which the gate (the conductor 421) of the transistor 490 extends are substantially parallel to each other.

The region A of the transistor 490, the region B of the transistor 490, the channel formation region of the transistor 491a, and the channel formation region of the transistor 491b are provided between the first connection portion and the second connection portion when viewed from above.

As a result, the transistors 491*a*, 491*b*, and 490 including their connection portions can be positioned in smaller regions. Accordingly, the area of the cell 502 can be further reduced.

When the cell 502 is provided as described above, the area of the cell 502 does not increase in some cases even if the channel width of the transistor 490 is larger than the channel widths of the transistors 491*a* and 491*b*. This is because the transistor 491*a* and the transistor 491*b* are arranged in the channel width direction, and the transistor 490 is stacked thereover. For example, the channel width of the transistor 490 is 1 to 5 times, preferably 1.5 to 3 times as large as that of the channel widths of the transistor 491*a* and the transistor 491*b*.

When the channel width of the transistor 490 is larger than the channel widths of the transistor 491*a* and the transistor 491*b*, the delay time of the cell 502 can be shortened and the operational performance thereof can be increased. In particular, a large channel width of the transistor 490 is effective in increasing the operational performance of the cell 502 in the case where the on-state current per channel width of the transistor 490 is lower than the on-state current per channel width of the transistors 491*a* and 491*b*, or in the case where the field-effect mobility of the transistor 490 is lower than that of the transistors 491*a* and 491*b*.

Next, the cross-sectional structure of the cell 502 illustrated in FIGS. 3 and 4 is described in detail.

The substrate 400 is a single-crystal silicon substrate. The substrate 400 may be a semiconductor substrate including a single-material semiconductor of silicon, germanium, or the like or a compound semiconductor of silicon carbide, silicon germanium, gallium arsenide, gallium nitride, indium phosphide, zinc oxide, gallium oxide, or the like, for example. For the semiconductor substrate, an amorphous semiconductor or a crystalline semiconductor may be used, and examples of the crystalline semiconductor include a single crystal semiconductor, a polycrystalline semiconductor, and a microcrystalline semiconductor. Alternatively, the substrate 400 may be a glass substrate. Further alternatively, the substrate 400 may be an element substrate in which a semiconductor element is formed on a semiconductor substrate or a glass substrate.

The insulator 432 is preferably an insulator containing excess oxygen.

The insulator containing excess oxygen means an insulator from which oxygen is released by heat treatment, for example. Silicon oxide containing excess oxygen means silicon oxide from which oxygen can be released by heat treatment or the like, for example. Therefore, the insulator 432 is an insulator in which oxygen can be moved. In other words, the insulator 432 may be an insulator having an oxygen-transmitting property. For example, the insulator 432 may be an insulator having a higher oxygen-transmitting property than the semiconductor positioned over the insulator 432.

The insulator containing excess oxygen has a function of reducing oxygen vacancies in the semiconductor positioned over the insulator, in some cases. Such oxygen vacancies form DOS in the semiconductor and serve as hole traps or the like. In addition, hydrogen comes into the site of such an oxygen vacancy and forms an electron serving as a carrier. Thus, by a reduction in oxygen vacancies in the semiconductor, the transistor can have stable electrical characteristics.

The insulator 442 is provided between the transistors 491*a* and 491*b* and the transistor 490. As the insulator 442, an oxide containing aluminum, e.g., aluminum oxide, is used. The insulator 442 blocks oxygen and hydrogen, and aluminum oxide whose density is lower than 3.2 g/cm$^3$ is preferable because it has a particularly high capability of blocking hydrogen. Alternatively, aluminum oxide with low crystallinity is preferable because its function of blocking hydrogen is particularly high.

For example, in the case where the transistor 491*a* and the transistor 491*b* are silicon transistors, electrical characteristics of the transistor may be improved because dangling bonds of silicon can be reduced by supplying hydrogen from the outside. The supply of hydrogen is performed by, for example, providing an insulator containing hydrogen in the vicinity of the Si transistor and performing heat treatment to diffuse and supply the hydrogen to the Si transistor.

An insulator containing hydrogen may release hydrogen, the amount of which is larger than or equal to $1\times10^{18}$ atoms/cm$^3$, larger than or equal to $1\times10^{19}$ atoms/cm$^3$, or larger than or equal to $1\times10^{20}$ atoms/cm$^3$ in TDS analysis (converted into the number of hydrogen atoms) in the range of a surface temperature of 100° C. to 700° C. or 100° C. to 500° C.

Out of hydrogen diffused from the insulator containing hydrogen, a small amount of hydrogen reaches the transistor 490 because the insulator 442 has a function of blocking hydrogen. Hydrogen serves as a carrier trap or a carrier generation source in an oxide semiconductor and causes deterioration of electrical characteristics of the transistor 490 in some cases. Therefore, blocking hydrogen by the insulator 442 is important to improve performance and reliability of the semiconductor device.

On the other hand, for example, by supplying oxygen to the transistor 490 from the outside, oxygen vacancies in the oxide semiconductor can be reduced; thus, electrical characteristics of the transistor are improved in some cases. The supply of oxygen may be performed by heat treatment under an atmosphere containing oxygen, for example. Alternatively, for example, an insulator containing excess oxygen (oxygen) is provided in the vicinity of the transistor 490 and heat treatment is performed, so that the oxygen may be diffused and supplied to the transistor 490. Here, an insulator containing excess oxygen is used as the insulator 432.

The diffused oxygen might reach the Si transistor through layers; however, since the insulator 442 has a function of blocking oxygen, the amount of oxygen which reaches the Si transistor is small. The entry of oxygen into silicon might be a factor of decreasing the crystallinity of silicon or inhibiting carrier movement. Therefore, blocking oxygen by the insulator 442 is important to improve performance and reliability of the semiconductor device.

The insulator 452 is preferably provided over the transistor 490. The insulator 452 has a function of blocking oxygen and hydrogen. For the insulator 452, the description of the insulator 442 is referred to, for example. Furthermore, for example, the insulator 452 has the capability of blocking oxygen and hydrogen more effectively than the semiconductor 406*a* and/or the semiconductor 406*c*.

When the semiconductor device includes the insulator 452, outward diffusion of oxygen from the transistor 490 can be suppressed. Consequently, excess oxygen (oxygen) contained in the insulator 432 and the like can be effectively supplied to the transistor 490. Since the insulator 452 blocks entry of impurities including hydrogen from layers above the insulator 452 or the outside of the semiconductor device, deterioration of electrical characteristics of the transistor 490 due to entry of impurities can be suppressed.

Although in the above description, the insulator 442 and/or the insulator 452 is described separately from the transistor 490 for convenience, the insulator 442 and/or the insulator 452 may be part of the transistor 490.

Note that in this embodiment, in a channel formation region and the like of the transistor 490, an oxide semiconductor can be used, for example; however, one embodiment of the present invention is not limited to this example. For example, depending on cases or conditions, a channel formation region, the vicinity of the channel formation region, a source region, a drain region, or the like of the transistor 490 may be formed using a material containing Si (silicon), Ge (germanium), SiGe (silicon germanium), GaAs (gallium arsenide), or the like.

Note that in this specification and the like, a transistor such as the transistor 490 can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

Since an n-channel Si transistor is unnecessary in the semiconductor device (cell) described above, a process for forming the n-channel Si transistor is not needed, so that the manufacturing cost can be reduced in some cases.

Next, a different example of the structure of the semiconductor device (cell) of one embodiment of the present invention is described with reference to FIGS. 6A to 6C and FIG. 7.

Note that in FIGS. 6A to 6C and FIG. 7, some components such as an insulator are omitted for easy understanding, and a conductor or the like formed in the same layer are shown with the same hatching pattern.

Figure 6A:
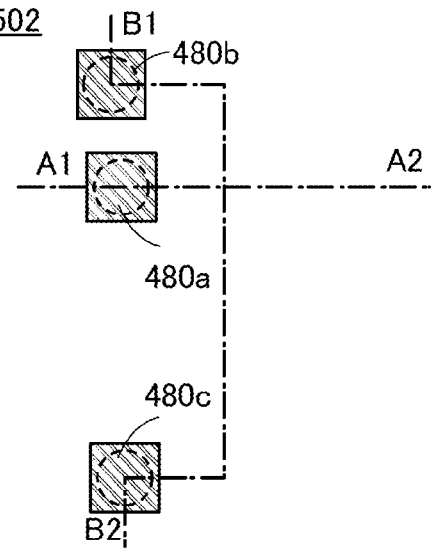
FIGS. 6A to 6C are top views of a transistor.
Figure 6B:
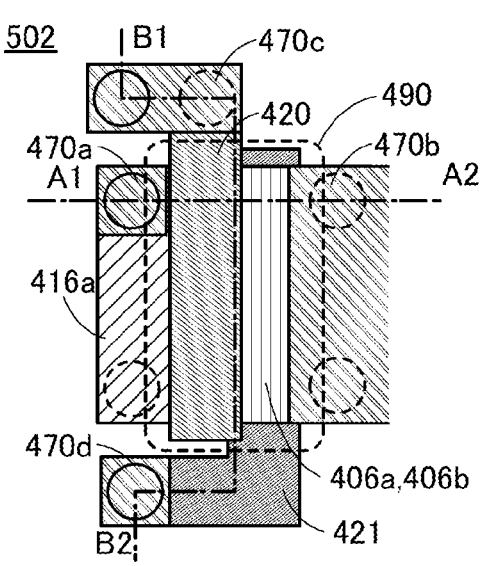
Figure 6C:
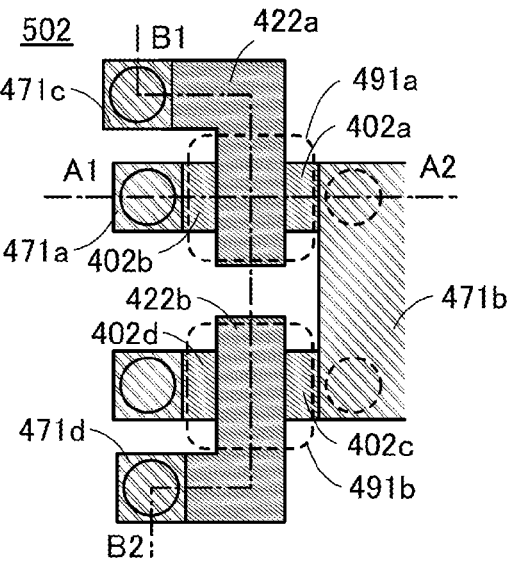

FIGS. 6A to 6C are top views illustrating an example of the structure of the cell 502 illustrated in FIG. 1C. FIG. 6A is a top view of a region including input-output portions of the signals A, B and Z. FIG. 6B is a top view of a region including the transistor 490, and FIG. 6C is a top view of a region including the transistors 491*a* and 491*b*. In FIG. 6B, the hatching pattern of the semiconductor 406*c* is omitted.

FIG. 7 is a cross-sectional view illustrating an example of the structure of the cell 502. A cross section taken along dashed-dotted line A1-A2 in FIGS. 6A to 6C is shown in on the left side of FIG. 7, and a cross section taken along dashed-dotted line B1-B2 in FIGS. 6A to 6C is shown on the right side of FIG. 7.

The cell 502 illustrated in FIGS. 6A to 6C and FIG. 7 includes the transistor 490, the transistor 491*a*, and the transistor 491*b*. The transistors are connected as necessary through a plurality of conductors, whereby a circuit illustrated in FIG. 1C is formed. Here, as an example, an oxide semiconductor transistor is used as a transistor 490, and p-channel Si transistors are used as the transistors 491*a* and 491*b*.

Specifically, the cell 502 illustrated in FIGS. 6A to 6C and FIG. 7 includes the substrate 400, the transistors 491*a* and 491*b*, the insulator 460 over the transistors 491*a* and 491*b*, conductors 471*a* to 471*d* over the insulator 460, an insulator 461 over the insulator 460 and the conductors 471*a* to 471*d*, the insulator 442 over the insulator 461, the transistor 490 over the insulator 442, the insulator 452 over the transistor 490, the insulator 462 over the insulator 452, the conductors 470*a* to 470*d* over the insulator 462, the insulator 464 over the insulator 462 and the conductors 470*a* to 470*d*, the insulator 464 over the insulator 462 and the conductors 470*a* to 470*d*, and the conductors 480*a* to 480*c* over the insulator 464. Another one or plurality of layers of insulators or conductors may be further provided over the insulator 464 and the conductors 480*a* to 480*c*. Openings are provided in the insulators 460, 461, 442, 432, 452, 462, and 464 as necessary, and conductors are provided in the openings.

As illustrated in FIGS. 6A to 6C and FIG. 7, the layer including the transistor 490 and the layer including the transistors 491*a* and 491*b* are provided so as to overlap with each other in the cell 502. In such a case, the cell 502 can be reduced in size. The transistor 490 and the transistors 491*a* or 491*b* are arranged so as to overlap with each other. In such a case, the memory cell 502 can be reduced in size.

The transistors 491*a* and 491*b* included in the cell 502 illustrated in FIGS. 6A to 6C and FIG. 7 have the same structures as the transistors 491*a* and 491*b* included in the cell 502 in FIGS. 2A to 2C, FIG. 3, and FIG. 4. Thus, the description of the transistors 491*a* and 491*b* illustrated in FIGS. 2A to 2C, FIG. 3, and FIG. 4 can be referred to as appropriate.

The transistor 490 illustrated in FIGS. 6A to 6C and FIG. 7 has the same structure as the transistor 490 illustrated in FIGS. 2A to 2C, FIG. 3 and FIG. 4. Thus, the description of the transistor 490 illustrated in FIGS. 2A to 2C, FIG. 3, and FIG. 4 can be referred to as appropriate.

A connection and arrangement of the transistors 490, 491*a* and 491*b*, and arrangement thereof are described.

The conductor 471*b* is supplied with the high power supply potential VDD. The conductor 470*b* is supplied with the low power supply potential VSS. The conductor 471b is formed in a different layer as the conductor 470b. The conductor 471b is connected to the source (the region 402a) of the transistor 491a and the source (the region 402c) of the transistor 491b with a conductor provided therebetween. The conductor 470b is connected to the source of the transistor 490 (the conductor 416b) with a conductor provided therebetween. The conductor 480a is an output portion that outputs the signal Z. The conductor 480a is connected to the drain of the transistor 490 (the conductor 416a) with a conductor provided therebetween. The conductor 480b is an input portion to which the signal A is input. The conductor 480b is connected to the gate of the transistor 490 (the conductor 420) with a conductor positioned therebetween. The conductor 480c is an input portion to which the signal B is input. The conductor 480c is connected to the gate of the transistor 490 (the conductor 421) with a conductor positioned therebetween.

In the cell 502 illustrated in FIGS. 2A to 2C, FIG. 3, and FIG. 4, the conductors 470e and 470b formed using the same layer are supplied with the power supply potentials VDD and VSS. On the other hand, in the cell 502 illustrated in FIGS. 6A to 6C and FIG. 7, the conductors 471b and 470b formed using different layers are supplied with the power supply potentials VDD and VSS. The conductors 471b and 470b to which the power supply potentials VDD and VSS are supplied are provided to overlap with each other in the cell 502 illustrated in FIGS. 6A to 6C and FIG. 7, so that the cell area can be reduced as compared to the cell 502 illustrated in FIGS. 2A to 2C, FIG. 3, and FIG. 4. On the other hand, the number of layers from which the conductors are formed in the cell 502 illustrated in FIGS. 2A to 2C, FIG. 3, and FIG. 4 is smaller than that in the cell 502 illustrated in FIGS. 6A to 6C and FIG. 7, so that the number of manufacturing steps can be reduced.

The gate (the conductor 422a) of the transistor 491a and the gate (the conductor 420) of the transistor 490 are electrically connected to each other through a first connection portion. The gate (the conductor 422b) of the transistor 491b and the gate (the conductor 421) of the transistor 490 are electrically connected to each other through a second connection portion. The drain (the conductor 416a) of the transistor 490, the drain (the region 402b) of the transistor 491a, and the drain (the region 402d) of the transistor 491a are electrically connected to each other.

The first connection portion is the conductors 475a, 471c, 476a, 470c and/or 476b. The second connection portion is the conductors 475b, 471d, and/or a conductor 477a.

The direction in which the gate of the transistor 491a extends and the direction in which the gate of the transistor 491b extends are substantially parallel to each other.

The channel formation region of the transistor 491a and the channel formation region of the transistor 491b are aligned in this direction.

The channel width direction of the transistor 491a and the channel width direction of the transistor 491b are substantially parallel to each other.

The channel formation region of the transistor 491a and the channel formation region of the transistor 491b are aligned in the channel width direction.

As a result, the transistor 491a and the transistor 491b including their connection portions can be provided in smaller regions.

The channel formation region of the transistor 490 is provided between the first connection portion and the second connection portion when viewed from above. Accordingly, the first connection portion and the second connection portion can be provided close to the channel formation region of the transistor 490, so that the transistor 490 including the connection portions can be provided in a smaller region.

The direction in which the gate of the transistor 491a extends, the direction in which the gate of the transistor 491b extends, the direction in which the gate (the conductor 420) of the transistor 490 extends, and the direction in which the gate (the conductor 421) of the transistor 490 extends are substantially parallel to each other.

The region A of the transistor 490, the region B of the transistor 490, the channel formation region of the transistor 491a, and the channel formation region of the transistor 491b are provided between the first connection portion and the second connection portion when viewed from above.

As a result, the transistors 491a, 491b, and 490 including their connection portions can be positioned in smaller regions. Accordingly, the area of the cell 502 can be further reduced.

When the cell 502 is provided as described above, the area of the cell 502 does not increase in some cases even if the channel width of the transistor 490 is larger than the channel widths of the transistors 491a and 491b. This is because the transistor 491a and the transistor 491b are arranged in the channel width direction, and the transistor 490 is stacked thereover. For example, the channel width of the transistor 490 is 1 to 5 times, preferably 1.5 to 3 times as large as that of the channel widths of the transistor 491a and the transistor 491b.

When the channel width of the transistor 490 is larger than the channel widths of the transistor 491a and the transistor 491b, the delay time of the cell 502 can be shortened and the operational performance thereof can be increased. In particular, a large channel width of the transistor 490 is effective in increasing the operational performance of the cell 502 in the case where the on-state current per channel width of the transistor 490 is lower than the on-state current per channel width of the transistors 491a and 491b, or in the case where the field-effect mobility of the transistor 490 is lower than that of the transistors 491a and 491b.

Next, a different example of a semiconductor device (cell) of one embodiment of the present invention is described with reference to FIGS. 8A to 8C and FIG. 9.

Note that in FIGS. 8A to 8C and FIG. 9, some components such as an insulator are omitted for easy understanding, and a conductor or the like formed in the same layer are shown with the same hatching pattern.

FIGS. 8A to 8C are top views illustrating an example of the structure of the cell 503 illustrated in FIG. 1D. FIG. 8A is a top view of a region including input-output portions of the signals A, B and Z. FIG. 8B is a top view of a region including the transistor 492. FIG. 8C is a top view of a region including the transistors 493a and 493b. In FIG. 8B, the hatching pattern of the semiconductor 406c is omitted.

FIG. 9 is a cross-sectional view illustrating an example of the structure of the cell 503. A cross section taken along dashed-dotted line A1-A2 in FIGS. 8A to 8C is shown in on the left side of FIG. 9, a cross section taken along dashed-dotted line B1-B2 in FIGS. 8A to 8C is shown on the right side of FIG. 9.

The cell 503 illustrated in FIGS. 8A to 8C and FIG. 9 includes the transistor 492, the transistor 493a, and the transistor 493b. The transistors are connected as necessary through a plurality of conductors, whereby the circuit illustrated in FIG. 1D is formed. Here, as an example, an oxide semiconductor transistor is used as the transistor 492, and p-channel Si transistors are used as the transistors 493a and 493b.

Specifically, the cell 503 illustrated in FIGS. 8A to 8C and FIG. 9 includes the substrate 400, the transistors 493a and 493b, the insulator 460 over the transistors 493a and 493b, the insulator 442 over the insulator 460, the transistor 492 over the insulator 442, the insulator 452 over the transistor 492, the insulator 462 over the insulator 452, the conductors 470a to 470e over the insulator 462, the insulator 464 over the insulator 462 and the conductors 470a to 470e, and the conductors 480a to 480c over the insulator 464. One or a plurality of layers of insulators or conductors may be further provided over the insulator 464 and the conductors 480a to 480c. Openings are provided in the insulators 460, 442, 432, 452, 462, and 464 as necessary, and conductors are provided in the openings.

As illustrated in FIGS. 8A to 8C and FIG. 9, the layer including the transistor 492 and the layer including the transistors 493a and 493b are provided so as to overlap with each other. In such a case, the cell 503 can be reduced in size. The transistor 492 and the transistor 493a or the transistor 493b are arranged so as to overlap with each other. In such a case, the cell 503 can be reduced in size.

For the transistors 493a and 493b included in the cell 503 illustrated in FIGS. 8A to 8C and FIG. 9, the description of the transistors 491a and 491b included in the cell 502 illustrated in FIGS. 2A to 2C, FIG. 3, and FIG. 4 can be referred to as appropriate.

The structure of the transistor 492 in FIG. 9 will be described.

As illustrated in FIG. 9, the transistor 492 includes a conductor 421, an insulator 432 over the conductor 421, the semiconductor 406a over the insulator 432, a semiconductor 406b over the semiconductor 406a, the conductors 416a and 416b in contact with a top surface of the semiconductor 406b, the semiconductor 406c in contact with a side surface of the semiconductor 406a, top and side surfaces of the semiconductor 406b, top and side surfaces of the conductor 416a, and top and side surfaces of the conductor 416b, the insulator 411 over the semiconductor 406c, and the conductor 420 over the insulator 411.

The conductor 421 serves as the second gate of the transistor 492. The insulator 432 serves as a gate insulator of the transistor 492. The conductor 416a and the conductor 416b serve as a source and a drain of the transistor 492. The insulator 411 serves as a gate insulator of the transistor 492. The conductor 420 serves as a first gate of the transistor 492. The semiconductor 406b serves as a channel formation region.

As illustrated in FIGS. 8A to 8C and FIG. 9, in the transistor 492, a region sandwiched between the conductors 416a and 416b (also referred to as a channel formation region) included in the semiconductor 406b overlaps with the conductor 421 and is covered with the conductor 420 when viewed from above.

The transistor 492 has a function similar to that of a circuit in which two transistors are connected in parallel. In addition, two gates (the conductor 421 and the conductor 420) overlap with each other in the channel formation region when viewed from above, so that the area of transistor 492 can be smaller than that of the circuit in which two transistors whose gates are formed using conductors in the same layer are connected in parallel.

Two gates adjacent to each other included in the transistor 492 each include a connection portion (not illustrated) for inputting a signal. The two connection portions may be arranged at both sides of the channel formation region when viewed from above. As a result, the transistor 492 is preferable because the connection portions of the transistor 492 can be positioned close to the channel formation region, and the transistor 492 including the connection portions can be positioned in a smaller area.

The insulators 432 and 411 that serve as gate insulators of the transistor 492 preferably have approximately the same thickness. In this case, a voltage applied to the conductor 421 and a voltage applied to the conductor 420 which are needed to turn on the transistor 492 can be approximately equal to each other. The thickness of the insulator 432 is $\frac{1}{10}$ to 10 times, preferably $\frac{1}{5}$ to 5 times, and further preferably $\frac{1}{2}$ to 2 times of the thickness of the insulator 411.

The conductor 420 electrically surrounds the semiconductor 406b in the channel width direction, that is, surrounds not only the top surface but also the side surfaces of the semiconductor 406b (s-channel structure). Consequently, the sub-threshold swing of the transistor 492 can be smaller, whereby a short-channel effect of the transistor can be suppressed. Therefore, such a structure is suitable for miniaturization. For the characteristics of the oxide semiconductor transistor and the characteristics of the transistor with the s-channel structure, the description of the transistor 490 can be referred to as appropriate.

Next, a connection and an arrangement between transistors 492, 493a and 493b are described.

The conductor 470e is supplied with the high power supply potential VDD. The conductor 470b is supplied with the low power supply potential VSS. The conductor 470e is formed in the same layer as the conductor 470b. The conductor 470e is connected to the source (the region 402c) of the transistor 493b with a conductor provided therebetween. The conductor 470b is connected to the source (the conductor 416b) of the transistor 492 with a conductor provided therebetween. The conductor 480a is an output portion that outputs the signal Z. The conductor 480a is connected to the drain (the conductor 416a) of the transistor 492 with a conductor provided therebetween. The conductor 480b is an input portion to which the signal A is input. The conductor 480b is connected to the gate (the conductor 420) of the transistor 492 with a conductor provided therebetween. The conductor 480c is an input portion to which the signal B is input. The conductor 480c is connected to the gate (the conductor 421) of the transistor 492 with a conductor provided therebetween.

The gate (the conductor 422a) of the transistor 493a and the gate (the conductor 420) of the transistor 492 are electrically connected to each other through a first connection portion. The gate (the conductor 422b) of the transistor 493b and the gate (the conductor 421) of the transistor 492 are electrically connected to each other through a second connection portion. The drain (the conductor 416a) of the transistor 492 and the drain (the region 402a) of the transistor 493a are electrically connected to each other. The source of the transistor 493a and the drain of the transistor 493b share the region 402b, and they are electrically connected to each other.

The first connection portion is the conductors 475a, 476a, 470c, and/or 476b. The second connection portion is the conductor 475b.

The direction in which the gate of the transistor 493a extends and the direction in which the gate of the transistor 493b extends are substantially parallel to each other.

A channel formation region of the transistor 493a and a channel formation region of the transistor 493b are aligned in the direction.

The channel width direction of the transistor 493a and the channel width direction of the transistor 493b are substantially parallel to each other.

The channel formation region of the transistor 493a and the channel formation region of the transistor 493b are aligned in the channel width direction.

As a result, the transistors 493a and 493b including their connection portions can be positioned in smaller regions. Note that current of the transistor 493a and the transistor 493b may flow in the opposite direction.

The channel formation region of the transistor 492 is provided between the first connection portion and the second connection portion when viewed from above. Accordingly, the first connection portion and the second connection portion can be provided close to the channel formation region of the transistor 492, so that the transistor 492 including the connection portions can be provided in a smaller region.

The direction in which the gate of the transistor 493a extends, the direction in which the gate of the transistor 493b extends, the direction in which the gate (the conductor 420) of the transistor 492 extends, and the direction in which the gate (the conductor 421) of the transistor 492 extends are substantially parallel to each other.

The region A of the transistor 492, the region B of the transistor 492, the channel formation region of the transistor 493a, and the channel formation region of the transistor 493b are provided between the first connection portion and the second connection portion when viewed from above.

As a result, the transistors 493a, 493b, and 492 including their connection portions can be positioned in smaller regions. Accordingly, the area of the cell 503 can be further reduced.

When the cell 503 is provided as described above, the area of the cell 503 does not increase in some cases even if the channel width of the transistor 492 is larger than the channel widths of the transistors 493a and 493b. This is because the transistor 493a and the transistor 493b are arranged in the channel width direction, and the transistor 492 is stacked thereover. For example, the channel width of the transistor 492 is 1 to 5 times, preferably 1.5 to 3 times as large as that of the channel widths of the transistor 493a and the transistor 493b.

When the channel width of the transistor 492 is larger than the channel widths of the transistor 493a and the transistor 493b, the delay time of the cell 503 can be shortened and the operational performance thereof can be increased. In particular, a large channel width of the transistor 492 is effective in increasing the operational performance of the cell 503 in the case where the on-state current per channel width of the transistor 492 is lower than the on-state current per channel width of the transistors 493a and 493b, or in the case where the field-effect mobility of the transistor 492 is lower than that of the transistors 493a and 493b.

Next, a different example of the structure of the semiconductor device (cell) of one embodiment of the present invention is described with reference to FIGS. 10A to 10C and FIG. 11.

Note that in FIGS. 10A to 10C and FIG. 11, some components such as an insulator are omitted for easy understanding, and a conductor or the like formed in the same layer are shown with the same hatching pattern.

Figure 10A:
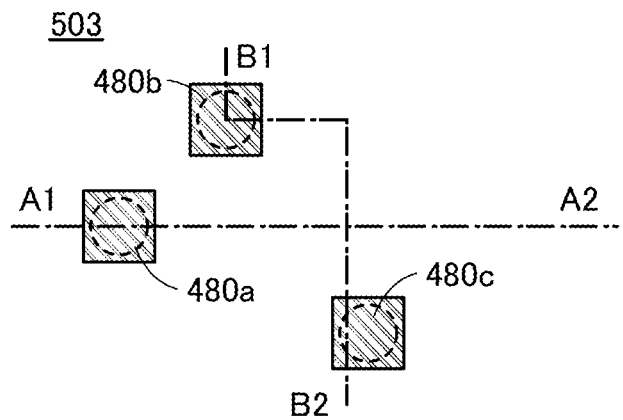
FIGS. 10A to 10C are top views of a semiconductor device (cell) of one embodiment of the present invention.
Figure 10B:
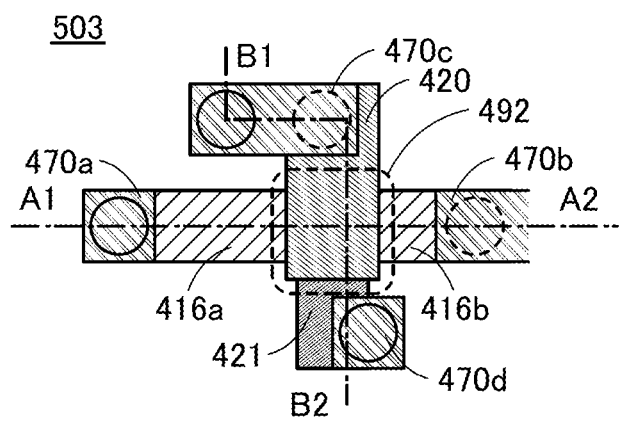
Figure 10C:
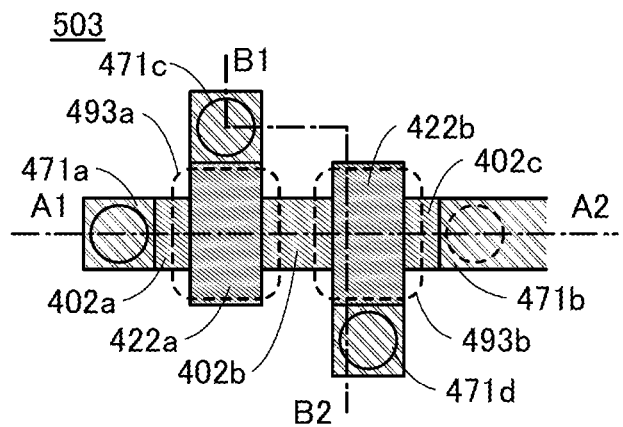

FIGS. 10A to 10C are top views illustrating an example of the structure of the cell 503 illustrated in FIG. 1D. FIG. 10A is a top view of a region including portions where the signals A, B, and Z are input or output. FIG. 10B is a top view of a region including the transistor 492. FIG. 10C is a top view of a region including the transistors 493a and 493b. In FIG. 10B, the hatching pattern of the semiconductor 406c is omitted.

Figure 11:
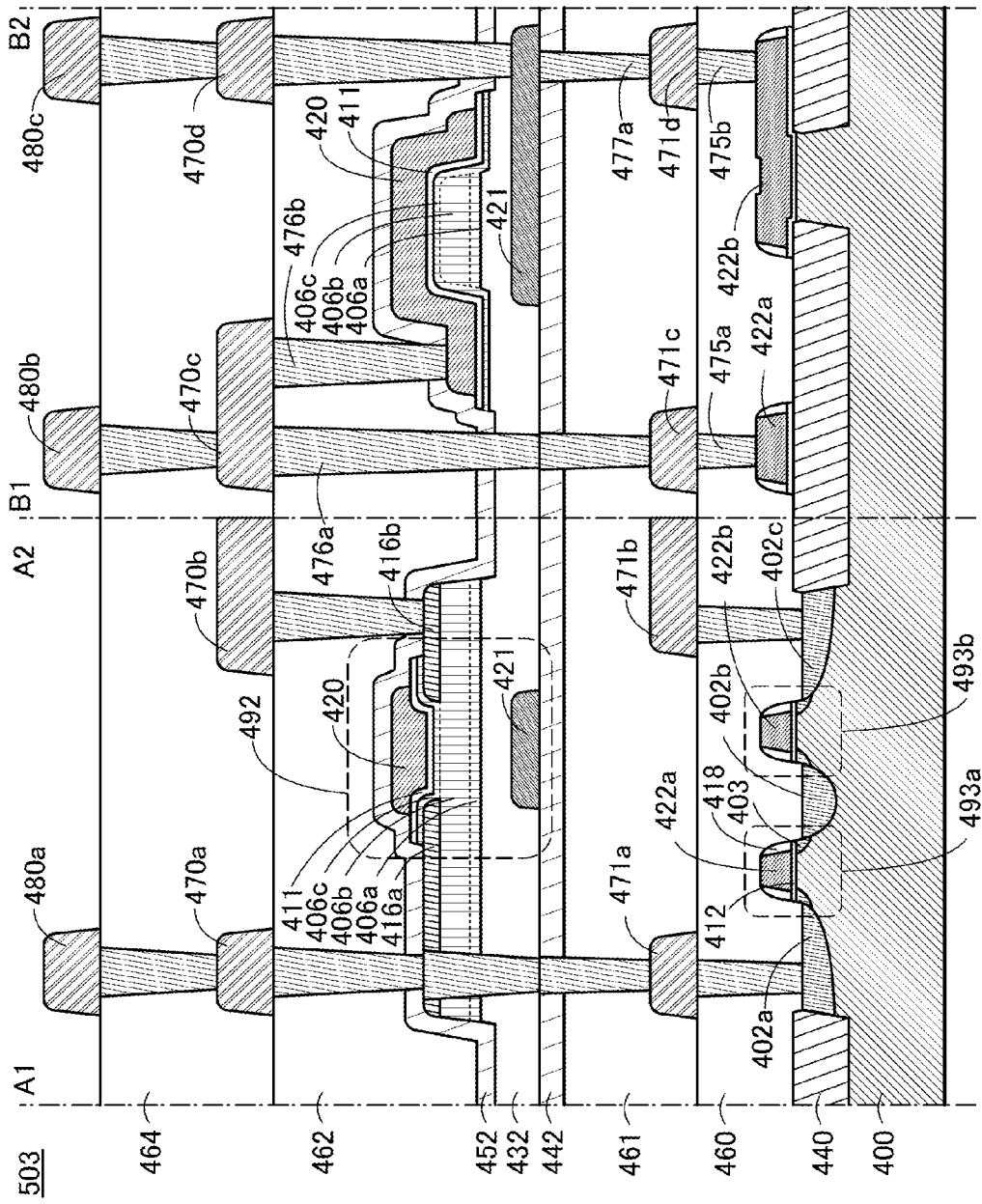
FIG. 11 is a cross-sectional view of a semiconductor device (cell) of one embodiment of the present invention.

FIG. 11 is a cross-sectional view illustrating an example of the structure of the cell 503. A cross section taken along dashed-dotted line A1-A2 in FIGS. 10A to 10C is shown in on the left side of FIG. 11, a cross section taken along dashed-dotted line B1-B2 in FIGS. 10A to 10C is shown on the right side of FIG. 11.

The cell 503 illustrated in FIGS. 10A to 10C and FIG. 11 includes the transistor 492, the transistor 493a, and the transistor 493b. The transistors are connected as necessary through a plurality of conductors, whereby the circuit illustrated in FIG. 1D is formed. Here, as an example, an oxide semiconductor transistor is used as the transistor 492, and p-channel Si transistors are used as the transistors 493a and 493b.

Specifically, the cell 503 illustrated in FIGS. 10A to 10C and FIG. 11 includes the substrate 400, the transistors 493a and 493b, the insulator 460 over the transistors 493a and 493b, conductors 471a to 471d over the insulator 460, the insulator 461 over the insulator 460 and the conductors 471a to 471d, the insulator 442 over the insulator 461, the transistor 492 over the insulator 442, the insulator 452 over the transistor 492, the insulator 462 over the insulator 452, the conductors 470a to 470d over the insulator 462, the insulator 464 over the insulator 462 and the conductors 470a to 470d, and the conductors 480a to 480c over the insulator 464. One or a plurality of layers of insulators or conductors may be further provided over the insulator 464 and the conductors 480a to 480c. Openings are provided in the insulators 460, 461, 442, 432, 452, 462, and 464 as necessary, and conductors are provided in the openings.

As illustrated in FIGS. 10A to 10C and FIG. 11, the layer including the transistor 492 and the layer including the transistors 493a and 493b are provided so as to overlap with each other. In such a case, the cell 503 can be reduced in size. The transistor 492 and the transistor 493a or the transistor 493b are arranged so as to overlap with each other. In such a case, the cell 503 can be reduced in size.

The transistors 493a and 493b illustrated in FIGS. 10A to 10C and FIG. 11 have the same structures as the transistors 493a and 493b in FIGS. 8A to 8C and FIG. 9. Thus, the description of the transistors 493a and 493b illustrated in FIGS. 8A to 8C, and FIG. 9 can be referred to as appropriate.

The transistor 492 illustrated in FIGS. 10A to 10C and FIG. 11 has the same structure as the transistor 492 illustrated in FIGS. 8A to 8C and FIG. 9. Thus, the description of the transistor 492 illustrated in FIGS. 8A to 8C and FIG. 9 can be referred to as appropriate.

Next, a connection and an arrangement between transistors 492, 493a and 493b are described.

The conductor 471b is supplied with the high power supply potential VDD. The conductor 470b is supplied with the low power supply potential VSS. The conductor 471b is formed in a different layer as the conductor 470b. The conductor 471b is connected to the source (the region 402c) of the transistor 493b with a conductor provided therebetween. The conductor 470b is connected to the source of the transistor 492 (the conductor 416b) with a conductor provided therebetween. The conductor 480a is an output portion that outputs the signal Z. The conductor 480a is connected to the drain of the transistor 492 (the conductor 416a) with a conductor provided therebetween. The conductor 480b is an input portion to which the signal A is input. The conductor 480b is connected to the gate of the transistor 492 (the conductor 420) with a conductor positioned therebetween. The conductor 480c is an input portion to which the signal B is input. The conductor 480c is connected to the gate (the conductor 421) of the transistor 492 with a conductor provided therebetween.

In the cell 503 illustrated in FIGS. 8A to 8C and FIG. 9, the conductors 470e and 470b formed using the same layer are supplied with the power supply potentials VDD and VSS. On the other hand, in the cell 503 illustrated in FIGS. 10A to 10C and FIG. 11, the conductors 471*b* and 470*b* formed using different layers are supplied with the power supply potentials VDD and VSS. The conductors 471*b* and 470*b* to which the power supply potentials VDD and VSS are supplied are provided to overlap with each other in the cell 503 illustrated in FIGS. 10A to 10C and FIG. 11, so that the cell area can be reduced as compared to the cell 503 illustrated in FIGS. 8A to 8C and FIG. 9. On the other hand, the number of layers from which the conductors are formed in the cell 503 illustrated in FIGS. 8A to 8C and FIG. 9 is smaller than that in the cell 503 illustrated in FIGS. 10A to 10C and FIG. 11, so that the number of manufacturing steps can be reduced.

The gate (the conductor 422*a*) of the transistor 493*a* and the gate (the conductor 420) of the transistor 492 are electrically connected to each other through a first connection portion. The gate (the conductor 422*b*) of the transistor 493*b* and the gate (the conductor 421) of the transistor 492 are electrically connected to each other through a second connection portion. The drain (the conductor 416*a*) of the transistor 492 and the drain (the region 402*a*) of the transistor 493*a* are electrically connected to each other. The source of the transistor 493*a* and the drain of the transistor 493*b* share the region 402*b*, and they are electrically connected to each other.

The first connection portion is the conductors 475*a*, 471*c*, 476*a*, 470*c* and/or 476*b*. The second connection portion is the conductors 475*b*, 471*d*, and/or a conductor 477*a*.

The direction in which the gate of the transistor 493*a* extends and the direction in which the gate of the transistor 493*b* extends are substantially parallel to each other.

The channel formation region of the transistor 493*a* and the channel formation region of the transistor 493*b* are aligned perpendicular to the direction.

The channel width direction of the transistor 493*a* and the channel width direction of the transistor 493*b* are substantially parallel to each other.

The channel formation region of the transistor 493*a* and the channel formation region of the transistor 493*b* are aligned in the channel width direction.

As a result, the transistors 493*a* and 493*b* including their connection portions can be positioned in smaller regions.

The channel formation region of the transistor 492 is provided between the first connection portion and the second connection portion when viewed from above. Accordingly, the first connection portion and the second connection portion can be provided close to the channel formation region of the transistor 492, so that the transistor 492 including the connection portions can be provided in a smaller region.

The direction in which the gate of the transistor 493*a* extends, the direction in which the gate of the transistor 493*b* extends, the direction in which the gate (the conductor 420) of the transistor 492 extends, and the direction in which the gate (the conductor 421) of the transistor 492 extends are substantially parallel to each other.

The region A of the transistor 492, the region B of the transistor 492, the channel formation region of the transistor 493*a*, and the channel formation region of the transistor 493*b* are provided between the first connection portion and the second connection portion when viewed from above.

As a result, the transistors 493*a*, 493*b*, and 492 including their connection portions can be positioned in smaller regions. Accordingly, the area of the cell 503 can be further reduced.

In the cell 503 illustrated in FIGS. 8A to 8C and FIG. 9, the gate of the transistor 493*a* and the gate of the transistor 493*b* are aligned in the channel width direction. The gates of the transistors 493*a* and 493*b* overlap with the first gate and the second gate of the transistor 492, whereby the area of the cell 503 can be reduced. In the arrangement of the cell 503 illustrated in FIGS. 8A to 8C and FIG. 9, the area of the cell 503 is less affected even when the width of the transistor 492 is larger than the widths of the transistors 493*a* and 493*b*. On the other hand, in the cell 503 illustrated in FIGS. 10A to 10C and FIG. 11, the gate of the transistor 493*a* and the gate of the transistor 493*b* are aligned in the channel length direction. In that case, the region 402*b* which is a connection portion of the transistor 493*a* and the transistor 493*b* can be made very small, whereby the area of the cell 503 can be reduced. In the arrangement of the cell 503 illustrated in FIGS. 10A to 10C and FIG. 11, the area of the cell 503 is less affected even when the channel length of the transistor 492 is increased.

As illustrated in FIGS. 10A to 10C and FIG. 11, the area of the cell 503 does not increase in some cases even if the channel length of the transistor 492 is larger than the channel lengths of the transistors 493*a* and 493*b*. This is because the transistor 493*a* and the transistor 493*b* are arranged in the channel length direction, and the transistor 492 is stacked thereover. For example, the channel length of the transistor 492 is 1 to 5 times, preferably 1.5 to 3 times as large as that of the channel lengths of the transistor 493*a* and/or the transistor 493*b*.

In general, as an object is formed in the later step or is formed in the upper side, the minimum feature size thereof is bigger. Therefore, the minimum feature line width of a layer of a first gate electrode and a second gate electrode of the transistor 492 and the minimum feature space width of a layer of the source electrode and the drain electrode of the transistor 492 are larger than the minimum feature line widths of the gate electrodes of the transistors 493*a* and 493*b* formed before the transistor 492 in some cases. In such a case, the channel length of the transistor 492 is larger than the channel lengths of the transistors 493*a* and 493*b*. In such a case, the cell 503 illustrated in FIGS. 10A to 10C and FIG. 11 has a preferable structure.

Next, a different example of the structure of the semiconductor device (cell) of one embodiment of the present invention is described with reference to FIG. 12 and FIG. 13.

Figure 12:
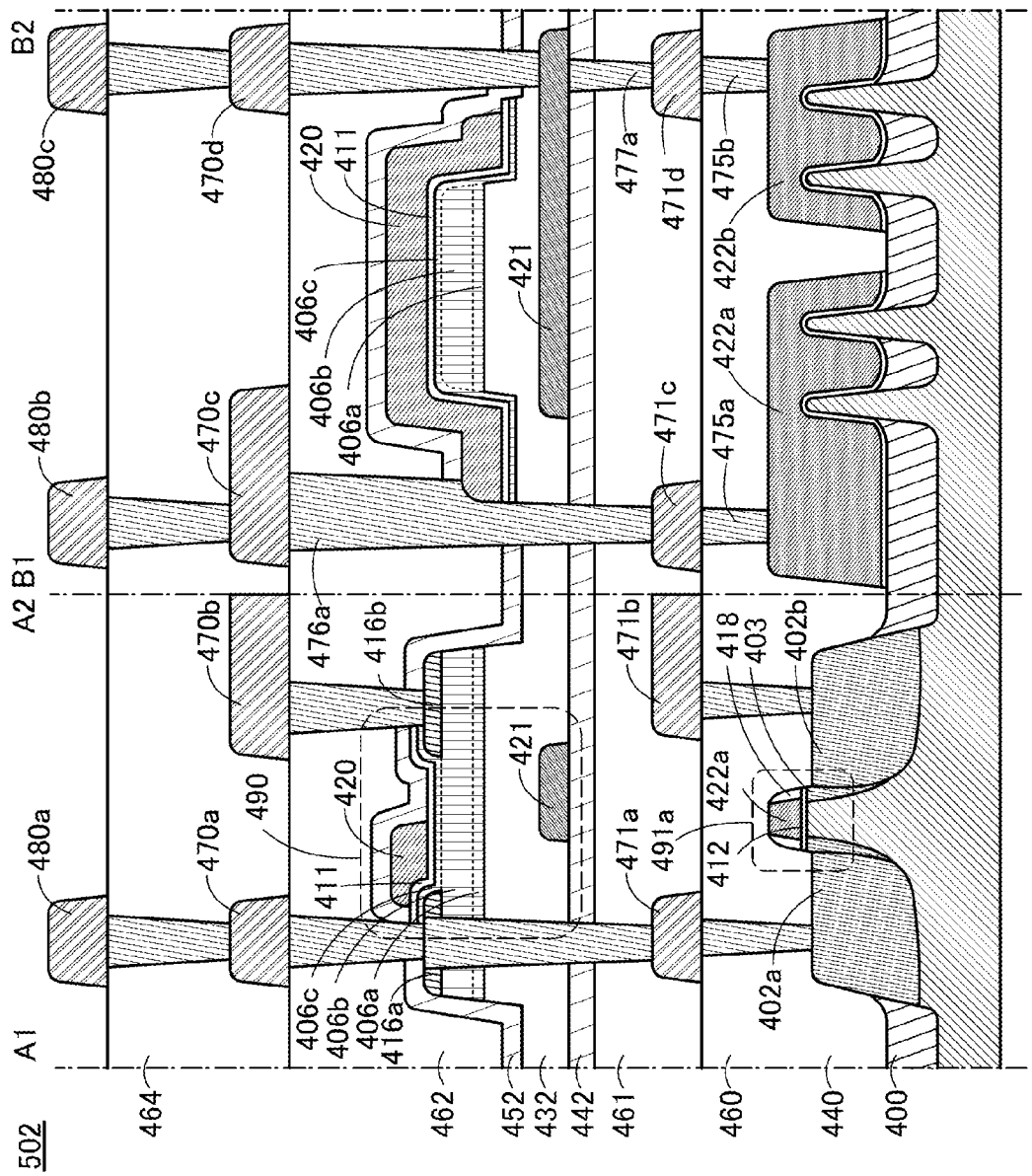
FIG. 12 is a cross-sectional view of a semiconductor device (cell) of one embodiment of the present invention.

FIG. 12 is a cross-sectional view illustrating an example of the structure of the cell 502. A cross section taken along dashed-dotted line A1-A2 in FIGS. 6A to 6C is shown in on the left side of FIG. 12, and a cross section taken along dashed-dotted line B1-B2 in FIGS. 6A to 6C is shown on the right side of FIG. 12.

Note that the structure of the transistors 491*a* and 491*b* is not limited to the structures illustrated in FIG. 7 and the like. For example, a structure where the semiconductor substrate 400 has a projection (also referred to as a protrusion or a fin), like the transistors 491*a* and 491*b* illustrated in FIG. 12, may be used. In the structure of the transistors 491*a* and 491*b* illustrated in FIG. 12, an effective channel width with respect to the occupation area can be increased as compared with that illustrated in FIG. 7 and the like. Thus, the on-state currents of the transistors 491*a* and 491*b* can be increased. In addition, the conductors 422*a* and 422*b* surround the projection of the substrate 400 in the channel width direction, whereby the channel formation region can be easily controlled by a gate electric field. As a result, a short-channel effect of the transistor can be suppressed. Therefore, the structure of the transistors 491*a* and 491*b* is suitable of miniaturization.

Figure 13:
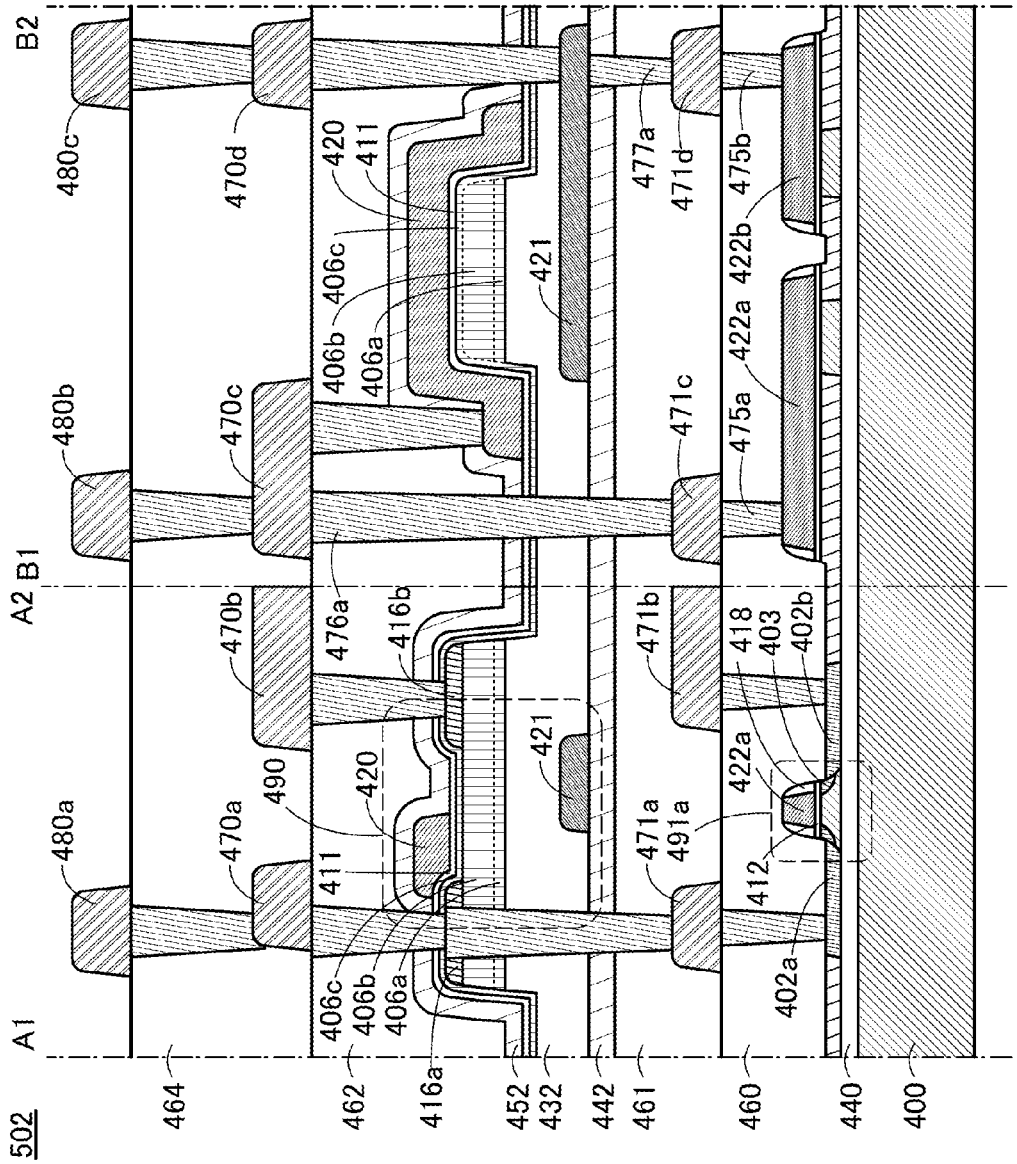
FIG. 13 is a cross-sectional view of a semiconductor device (cell) according to one embodiment of the present invention.

FIG. 13 is a cross-sectional view illustrating an example of the structure of the cell 502. A cross section taken along dashed-dotted line A1-A2 in FIGS. 6A to 6C is shown in on the left side of FIG. 13, and a cross section taken along dashed-dotted line B1-B2 in FIGS. 6A to 6C is shown on the right side of FIG. 13.

Note that the structures of the transistors 491a and 491b is not limited to the structures illustrated in FIG. 7 and the like. For example, as in the transistor 491a illustrated in FIG. 13, the insulator 440 may be provided over the substrate 400. With the structure of the transistor 491a illustrated in FIG. 13, the transistors can be separated from each other more surely and thus, leakage current can be suppressed. In addition, parasitic capacitance generated between the substrate and the transistor and leakage current into the substrate can be reduced. As a result, leakage current of the transistors 491a and 491b can be reduced. In addition, the transistors 491a and 491b can operate at high speed and with low power consumption.

As described above, the structures of the cross sections of the semiconductor devices (cells) of one embodiment of the present invention illustrated in FIG. 7, FIG. 9, FIG. 11, FIG. 12, and FIG. 13 are partly different from that of the cell 502 illustrated in FIG. 3 and FIG. 4. Therefore, the description of the cross section of the cell 502 illustrated in FIG. 3 and FIG. 4 can be referred to for the substrate and the insulator as appropriate.

This embodiment can be combined with any of the other embodiments in this specification as appropriate.

Embodiment 2

The transistor 490 can have a variety of structures. In this embodiment, only the transistor 490 and the region in the vicinity thereof are illustrated in FIGS. 14A and 14B, FIGS. 15A and 15B, and FIGS. 27A and 27B for easy understanding.

Figure 14A:
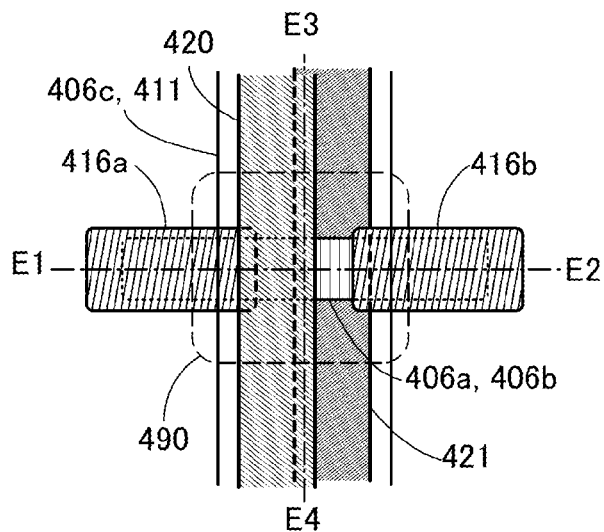
FIGS. 14A and 14B are a top view and a cross-sectional view of a transistor.
Figure 14B:
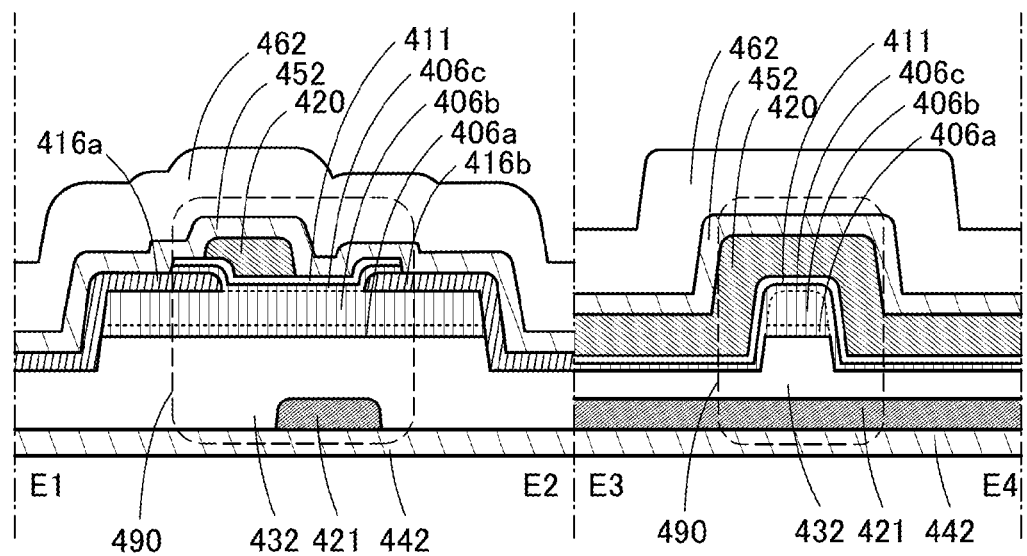

FIG. 14A is a top view illustrating a structure example of the transistor 490. FIG. 14B is an example of a cross-sectional view taken along dashed-dotted line E1-E2 and dashed-dotted line E3-E4 in FIG. 14A. Note that some components such as an insulator are omitted in FIG. 14A for easy understanding. In FIG. 14A, the hatching pattern of the semiconductor 406c is omitted.

Although in the transistor 490 illustrated in FIG. 3, the structure example where the conductor 416a and the conductor 416b which function as a source and a drain are in contact with only a top surface of the semiconductor 406b is shown, the structure of the transistor 490 is not limited thereto. For example, as illustrated in FIGS. 14A and 14B, the conductor 416a and the conductor 416b may be in contact with the top surface and the side surfaces of the semiconductor 406b, the top surface of the insulator 432, and the like.

Like the transistor 490 illustrated in FIG. 3, the transistor having the structure illustrated in FIGS. 14A and 14B has the structure in which the conductor 420 electrically surrounds the semiconductor 406b in the channel width direction and the side surfaces as well as the top surface of the semiconductor 406b are surrounded. This is the s-channel structure. For the s-channel structure, the description of the above embodiments can be referred to. With the s-channel structure, even a miniaturized transistor can have excellent electrical characteristics such as a high on-state current, a low subthreshold swing, and a low off-state current.

In the transistor having the structure illustrated in FIGS. 14A and 14B, the conductors 416a and 416b are in contact with side surfaces of the semiconductor 406a and the side surfaces of the semiconductor 406b. In addition, the semiconductor 406c is in contact with the side surfaces of the semiconductor 406a, the top surface and side surfaces of the semiconductor 406b, the top surface and side surfaces of the conductor 416a, and the top surface and side surfaces of the conductor 416b.

The semiconductor 406b in contact with the conductors 416a and 416b, in which donor levels are formed by entry of hydrogen into oxygen vacancy sites in some cases, includes an n-type conductive region. A state in which hydrogen enters sites of oxygen vacancies are denoted by $V_OH$ in some cases. Because of current flow in the n-type conductive region, high on-state current can be obtained.

Figure 15A:
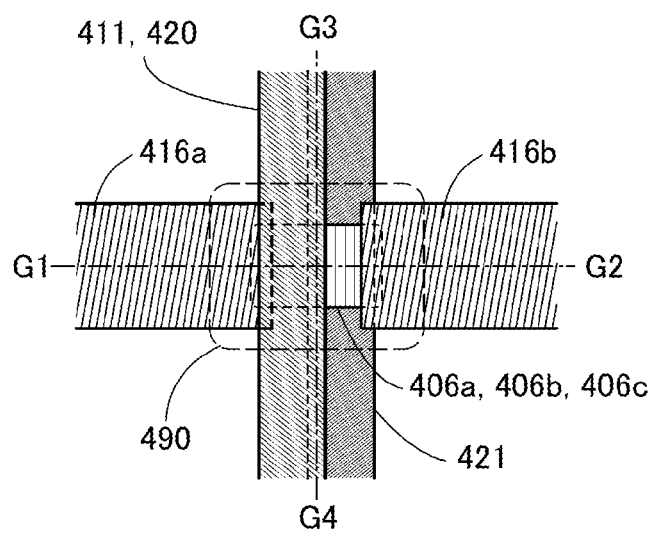
FIGS. 15A and 15B are a top view and a cross-sectional view of a transistor.
Figure 15B:
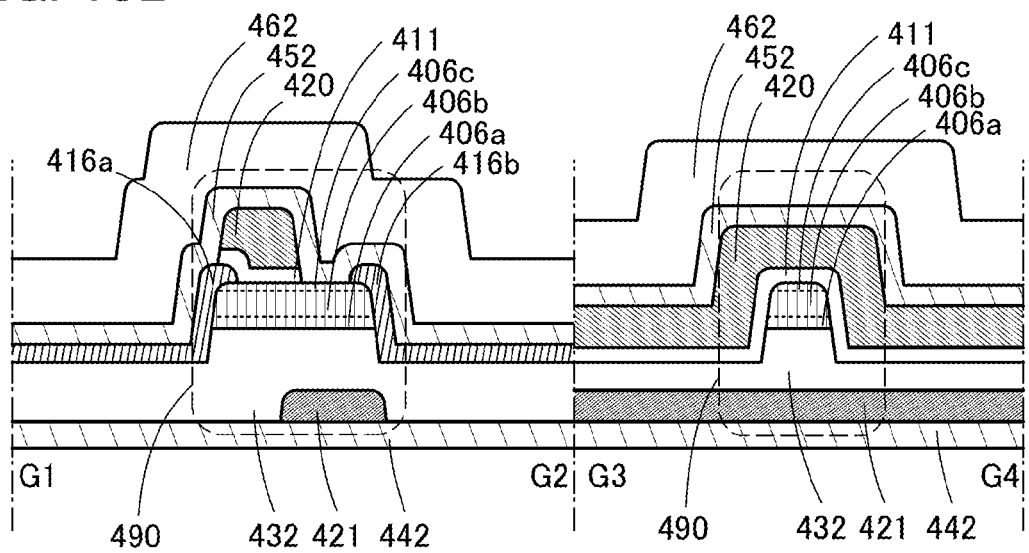

FIG. 15A is a top view illustrating a structure example of the transistor 490. FIG. 15B illustrates an example of a cross-sectional view taken along dashed-dotted line G1-G2 and dashed-dotted line G3-G4 in FIG. 15A. Note that some components such as an insulator are omitted in FIG. 15A for easy understanding.

The transistor 490 in FIGS. 15A and 15B includes the conductor 421 over the insulator 442; the insulator 432 having a projection over the insulator 442 and the conductor 421; the semiconductor 406a over the projection of the insulator 432; the semiconductor 406b over the semiconductor 406a; the semiconductor 406c over the semiconductor 406b; the conductor 416a and the conductor 416b which are in contact with the semiconductor 406a, the semiconductor 406b, and the semiconductor 406c and which are arranged to be separated from each other; the insulator 411 over the semiconductor 406c and the conductor 416a; the conductor 420 over the insulator 411; the insulator 452 over the conductor 416a, the conductor 416b, the insulator 411, and the conductor 420; and the insulator 462 over the insulator 452.

The insulator 411 is in contact with at least side surfaces of the semiconductor 406b in the cross section taken along line G3-G4. The conductor 420 faces a top surface and the side surfaces of the semiconductor 406b with at least the insulator 411 provided therebetween in the cross section taken along line G3-G4. The conductor 421 faces a bottom surface of the semiconductor 406b with the insulator 432 provided therebetween. The insulator 432 does not necessarily include a projection. The semiconductor 406c is not necessarily provided. The insulator 452 is not necessarily provided. The insulator 462 is not necessarily provided.

The structure of the transistor 490 illustrated in FIGS. 15A and 15B is partly different from that of the transistor 490 in FIGS. 14A and 14B. Specifically, the structures of the semiconductors 406a to 406c of the transistor 490 illustrated in FIGS. 14A and 14B are different from the structures of the semiconductors 406a to 406c of the transistor 490 in FIGS. 15A and 15B. Thus, for the transistor 490 in FIGS. 15A and 15B, the description of the transistor 490 in FIGS. 14A and 14B can be referred to as appropriate.

Figure 27A:
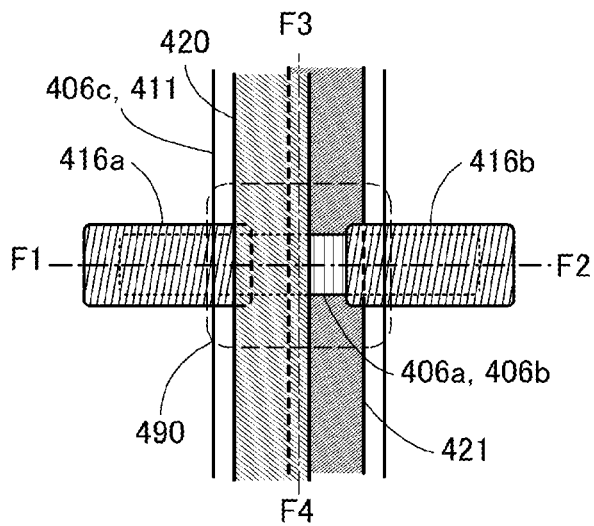
FIGS. 27A and 27B are a top view and a cross sectional view of a transistor.
Figure 27B:
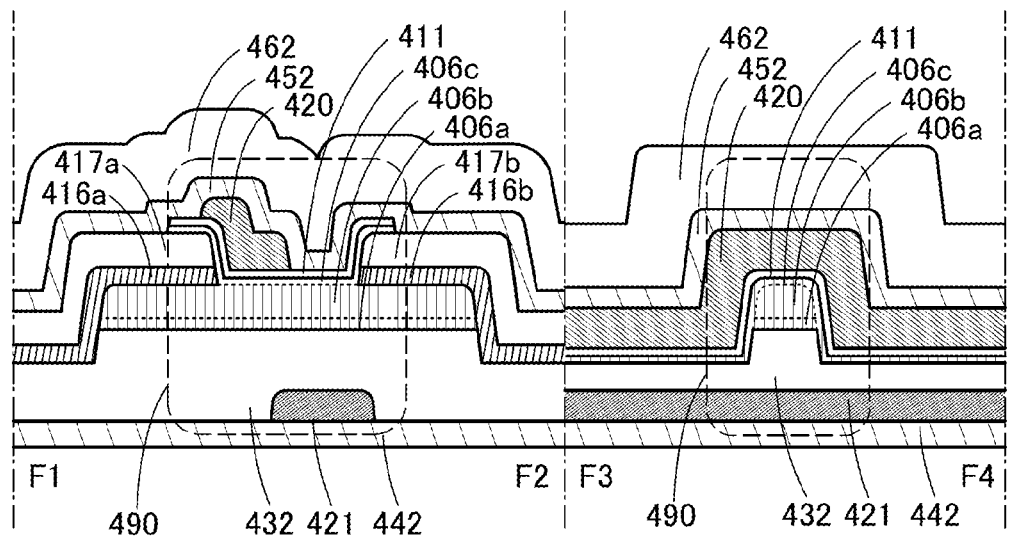

FIG. 27A is a top view illustrating a structure example of the transistor 490. FIG. 27B is an example of a cross-sectional view taken along dashed-dotted line F1-F2 and dashed-dotted line F3-F4 in FIG. 27A. Note that some components such as an insulator are omitted in FIG. 27A for easy understanding. In FIG. 27A, the hatching pattern of the semiconductor 406c is omitted.

The structure of the transistor 490 illustrated in FIGS. 27A and 27B is partly different from that of the transistor 490 in FIGS. 14A and 14B. Specifically, in the transistor 490 illustrated in FIGS. 27A and 27B, the insulators 417a and 417b are provided over the conductors 416a and 416b, respectively. Therefore, in the transistor 490 illustrated in FIGS. 27A and 27B, capacitance between the gate (the conductor 420) and the source or the drain (the conductor 416a) is reduced as compared to the transistor 490 illustrated in FIGS. 14A and 14B. As a result, the transistor 490 whose operation speed is improved can be obtained.

The other portions of the transistor 490 illustrated in FIGS. 27A and 27B are the same as those of the transistor 490 illustrated in FIGS. 14A and 14B. Thus, for the transistor 490 in FIGS. 27A and 27B, the description of the transistor 490 in FIGS. 14A and 14B can be referred to as appropriate.

This embodiment can be combined with any of the other embodiments in this specification as appropriate.

Embodiment 3

A structure of an oxide semiconductor which can be used as the semiconductor 406a, the semiconductor 406b, the semiconductor 406c, or the like is described below. In this specification, the trigonal and rhombohedral crystal systems are included in the hexagonal crystal system.

Oxide semiconductors are classified roughly into a single-crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS is described.

The CAAC-OS is one of oxide semiconductors having a plurality of c-axis aligned crystal parts.

With a transmission electron microscope (TEM), a combined analysis image (high-resolution TEM image) of a bright-field image and a diffraction pattern of the CAAC-OS is observed, and a plurality of crystal parts can be clearly observed. However, in the high-resolution TEM image, a boundary between crystal parts, that is, a grain boundary is not clearly observed. Thus, in the CAAC-OS, a reduction in electron mobility due to the grain boundary is less likely to occur.

In the high-resolution cross-sectional TEM image of the CAAC-OS observed in a direction substantially parallel to the sample surface, metal atoms arranged in a layered manner are seen in the crystal parts. Each metal atom layer has a morphology reflecting a surface over which the CAAC-OS is formed (hereinafter, a surface over which the CAAC-OS is formed is referred to as a formation surface) or a top surface of the CAAC-OS, and is arranged parallel to the formation surface or the top surface of the CAAC-OS.

In the high-resolution plan-view TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

For example, when a local Fourier transform image of the high-resolution cross-sectional TEM image of a CAAC-OS is observed, the angle of the c-axis continuously and gradually changes from 14.3°, 16.6° to 26.4° in a plurality of adjacent regions each having a diameter of 4 nm in some cases. In addition, in the other plurality of adjacent regions, the direction of the c-axis is different from that of the c-axis which changes continuously. In that case, it is suggested that the other plurality of adjacent regions have a different grain. For example, in the other plurality of adjacent regions, the angle of the c-axis continuously and gradually changes from −18.3°, −17.6°, −15.9° in some cases.

Note that in an electron diffraction pattern of the CAAC-OS, spots (luminescent spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS, spots are observed. For example, spots corresponding to the vertices of a hexagon are observed. This is a diffraction pattern indicating c-axis alignment.

From the results of the high-resolution cross-sectional TEM image and the high-resolution plan-view TEM image, alignment is found in the crystal parts in the CAAC-OS.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan-view TEM image.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

On the other hand, when the CAAC-OS is analyzed by an in-plane method in which an X-ray is incident on a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor of $InGaZnO_4$, six peaks appear. The six peaks are derived from crystal planes equivalent to the (110) plane. In the case of a CAAC-OS, a peak is not clearly observed even when φ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS is changed by etching or the like, the c-axis might not be necessarily parallel to a normal vector of a formation surface or a normal vector of a top surface of the CAAC-OS.

Distribution of c-axis aligned crystal parts in the CAAC-OS is not necessarily uniform. For example, in the case where crystal growth leading to the crystal parts of the CAAC-OS occurs from the vicinity of the top surface of the, the proportion of the c-axis aligned crystal parts in the vicinity of the top surface is higher than that in the vicinity of the formation surface in some cases. Further, when an impurity is added to the CAAC-OS, a region to which the impurity is added may be altered and the proportion of the c-axis aligned crystal parts in the CAAC-OS might vary depending on regions.

Note that when the CAAC-OS with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor and causes a decrease in crystallinity when it is contained in the oxide semiconductor. Note that the impurity contained in the oxide semiconductor might serve as a carrier trap or a carrier generation source.

The CAAC-OS is an oxide semiconductor having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Therefore, a transistor including the oxide semiconductor rarely has negative threshold voltage (is rarely normally on). The highly purified intrinsic or substantially highly purified intrinsic oxide semiconductor has a low density of defect states, and thus has few carrier traps. Accordingly, the transistor including the oxide semiconductor has little variation in electrical characteristics and high reliability. Electric charge trapped by the carrier traps in the oxide semiconductor takes a long time to be released and might behave like fixed electric charge. Thus, the transistor including the oxide semiconductor having high impurity concentration and a high density of defect states has unstable electrical characteristics in some cases.

With the use of the CAAC-OS in a transistor, variation in the electrical characteristics of the transistor due to irradiation with visible light or ultraviolet light is small.

Next, a microcrystalline oxide semiconductor is described.

A microcrystalline oxide semiconductor has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high resolution TEM image of the nc-OS, a grain boundary cannot be found clearly in the nc-OS sometimes for example.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part (the electron diffraction is also referred to as selected-area electron diffraction). Meanwhile, spots are shown in a nanobeam electron diffraction pattern of the nc-OS obtained by using an electron beam having a probe diameter close to, or smaller than the diameter of a crystal part. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

The nc-OS is an oxide semiconductor that has high regularity as compared to an amorphous oxide semiconductor. Thus, the nc-OS has a lower density of defect states than an amorphous oxide semiconductor. Note that there is no regularity of crystal orientation between different crystal parts in the nc-OS. Hence, the nc-OS has a higher density of defect states than the CAAC-OS.

Thus, the nc-OS may have a higher carrier density than the CAAC-OS. The oxide semiconductor having a high carrier density may have high electron mobility. Thus, a transistor including the nc-OS may have high field-effect mobility. The nc-OS has a higher defect state density than the CAAC-OS, and thus may have a lot of carrier traps. Consequently, a transistor including the nc-OS has larger changes in electrical characteristics and lower reliability than a transistor including the CAAC-OS. The nc-OS can be formed easily as compared to the CAAC-OS because nc-OS can be formed even when a relatively large amount of impurities are included; thus, depending on the purpose, the nc-OS can be favorably used in some cases. Thus, a semiconductor device including the transistor including the nc-OS can be manufactured with high productivity in some cases.

Next, an amorphous oxide semiconductor is described.

The amorphous oxide semiconductor has disordered atomic arrangement and no crystal part. For example, the amorphous oxide semiconductor does not have a specific state as in quartz.

In the high-resolution TEM image of the amorphous oxide semiconductor, crystal parts cannot be found.

When the amorphous oxide semiconductor is subjected to structural analysis by an out-of-plane method with an XRD apparatus, a peak showing a crystal plane does not appear. A halo pattern is shown in an electron diffraction pattern of the amorphous oxide semiconductor. Furthermore, a halo pattern is shown but a spot is not shown in a nanobeam electron diffraction pattern of the amorphous oxide semiconductor.

Note that an oxide semiconductor may have a structure having physical properties between the nc-OS and the amorphous oxide semiconductor. The oxide semiconductor having such a structure is specifically referred to as an amorphous-like oxide semiconductor (amorphous-like OS).

In a high-resolution TEM image of the amorphous-like OS, a void may be seen. Furthermore, in the high-resolution TEM image, there are a region where a crystal part is clearly observed and a region where a crystal part is not observed. In the amorphous-like OS, crystallization by a slight amount of electron beam used for TEM observation occurs and growth of the crystal part is found sometimes. In contrast, crystallization by a slight amount of electron beam used for TEM observation is less observed in the nc-OS having good quality.

Note that the crystal part size in the amorphous-like OS and the nc-OS can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the InGaZnO$_4$ crystal, focusing on the lattice fringes in the high-resolution TEM image. The maximum length in the region in which the lattice fringes are observed is regarded as the size of the crystal parts of the amorphous-like OS and the nc-OS. Note that the crystal part whose size is 0.8 nm or larger is selectively evaluated.

In the case where a change in average size of crystal parts (20-40 points) in the amorphous-like OS and the nc-OS is measured using the high-resolution TEM images, the crystal part size in the amorphous-like OS increases with an increase of the total amount of electron irradiation. Specifically, the case where the crystal part of approximately 1.2 nm at the start of TEM observation grows to a size of approximately 2.6 nm at the total amount of electron irradiation of $4.2 \times 10^8$ e$^-$/nm$^2$ was observed. In contrast, the crystal part size in the good-quality nc-OS shows a little change from the start of electron irradiation to the total amount of electron irradiation of $4.2 \times 10^8$ e$^-$/nm$^2$ regardless of the amount of electron irradiation.

Furthermore, by linear approximation of the change in the crystal part size in the amorphous-like OS and the nc-OS and extrapolation to the total amount of electron irradiation of 0 e$^-$/nm$^2$, the average size of the crystal part is found to be a positive value. This means that the crystal parts exist in the amorphous-like OS and the nc-OS before TEM observation.

Note that an oxide semiconductor may be a stacked film including two or more of an amorphous oxide semiconductor, a microcrystalline oxide semiconductor, and a CAAC-OS, for example.

In the case where the oxide semiconductor has a plurality of structures, the structures can be analyzed using nanobeam electron diffraction in some cases. For example, there is a method for measuring a transmission electron diffraction pattern of a substance by the transmission electron diffraction measurement apparatus.

For example, changes in the structure of a substance may be observed by changing the irradiation position of the electrons that are a nanobeam on the substance (or by scanning). At this time, when the substance is a CAAC-OS, a diffraction pattern indicating c-axis alignment is observed. When the substance is an nc-OS, a plurality of spots are observed in a ring-like region in a diffraction pattern.

Even when the substance is a CAAC-OS film, a diffraction pattern similar to that of an nc-OS film or the like is partly observed in some cases. Therefore, whether or not a CAAC-OS is favorable can be determined by the proportion of a region where a diffraction pattern of a CAAC-OS is observed in a predetermined area (also referred to as proportion of CAAC). In the case of a high quality CAAC-OS, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS is observed in a certain area is referred to as the proportion of non-CAAC.

As an example, a sample including a CAAC-OS obtained just after deposition (represented as "as-sputtered") and a sample including a CAAC-OS subjected to heat treatment at 450° C. in an atmosphere containing oxygen were made, and transmission electron diffraction patterns were obtained by scanning top surfaces of the samples. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a beam with a probe diameter of 1 nm was used. The above measurement was performed on six samples. The proportion of CAAC was calculated using the average value of the six samples.

The measurement result of the proportion of CAAC in each sample shows that the proportion of CAAC of the CAAC-OS obtained just after the deposition was 75.7% (the proportion of non-CAAC was 24.3%). The proportion of CAAC of the CAAC-OS subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS are diffraction patterns similar to that of an nc-OS. Furthermore, an amorphous oxide semiconductor was not able to be observed in the measurement region. Therefore, the above results suggest that the region having a structure similar to that of an nc-OS is rearranged by the heat treatment owing to the influence of the structure of the adjacent region, whereby the region becomes CAAC.

Comparison between high-resolution plan-view TEM images of the CAAC-OS obtained just after the deposition and the CAAC-OS subjected to the heat treatment at 450° C. shows that CAAC-OS subjected to the heat treatment at 450° C. has more uniform film quality. That is, the heat treatment at a high temperature improves the film quality of the CAAC-OS film.

With such a measurement method, the structure of an oxide semiconductor having a plurality of structures can be analyzed in some cases.

The above oxide semiconductor can be used as the semiconductor 406a, the semiconductor 406b, the semiconductor 406c, or the like.

Next, the other components of a semiconductor which can be used as the semiconductor 406a, the semiconductor 406b, the semiconductor 406c, or the like are described.

The oxide semiconductor that can be used for the semiconductor 406b is an oxide semiconductor containing indium, for example. The semiconductor 406b can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Avalanche breakdown or the like is less likely to occur in some cases in the transistor including an oxide semiconductor than in a general transistor including silicon or the like, because, for example, an oxide semiconductor has a wide bandgap and thus electrons are less likely to be excited, and the effective mass of a hole is large. Therefore, it may be possible to inhibit hot-carrier degradation due to avalanche breakdown, for example. Accordingly, the drain withstand voltage can be increased, so that the transistor can be driven at a higher drain voltage. Thus, in some cases, a higher voltage, that is, more states can be held by a floating node, increasing storage density.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than or equal to 50 atomic %, respectively, or further preferably less than 25 atomic % and greater than or equal to 75 atomic %, respectively. In the case of using an In-M-Zn oxide as the semiconductor 406b, when summation of In and M is assumed to be 100 atomic %, the proportions of In and M are preferably set to be greater than or equal to 25 atomic % and less than 75 atomic %, respectively, or further preferably greater than or equal to 34 atomic % and less than 66 atomic %, respectively. In the case of using an In-M-Zn oxide as the semiconductor 406c, when summation of In and M is assumed to be 100 atomic %, the proportions of In and M are preferably set to be less than 50 atomic % and greater than or equal to 50 atomic %, respectively, or further preferably less than 25 atomic % and greater than or equal to 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [In/(In+Ga)] is, for example, higher than or equal to 70%, preferably higher than or equal to 80%, more preferably higher than or equal to 90%.

At this time, when an electric field is applied to a gate, a channel is formed in the semiconductor 406b having the highest electron affinity in the semiconductors 406a, 406b, and 406c. Thus, the field effect mobility of the transistor can be increased. Here, the semiconductor 406b and the semiconductor 406c have the common constituent elements and thus interface scattering hardly occurs therebetween.

Figure 26A:
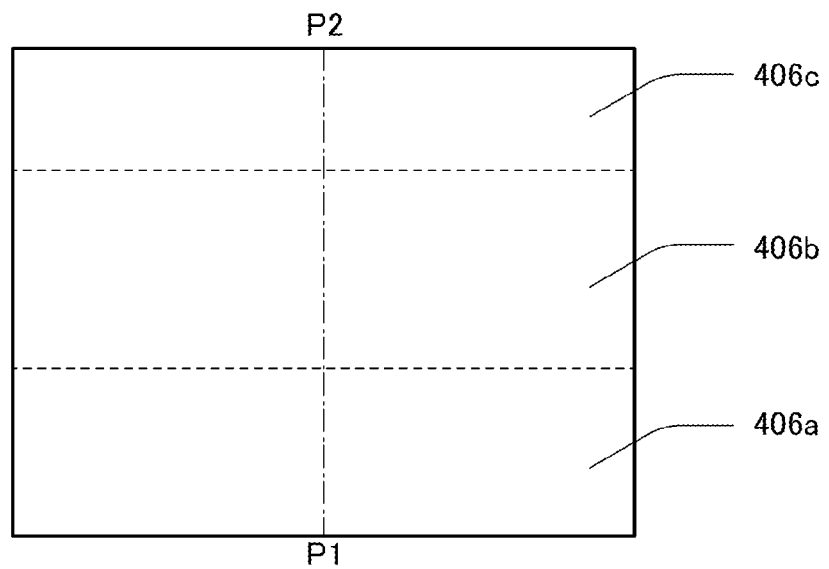
FIGS. 26A to 26C are a cross-sectional view of stacked semiconductor layers and band diagrams thereof.
Figure 26B:
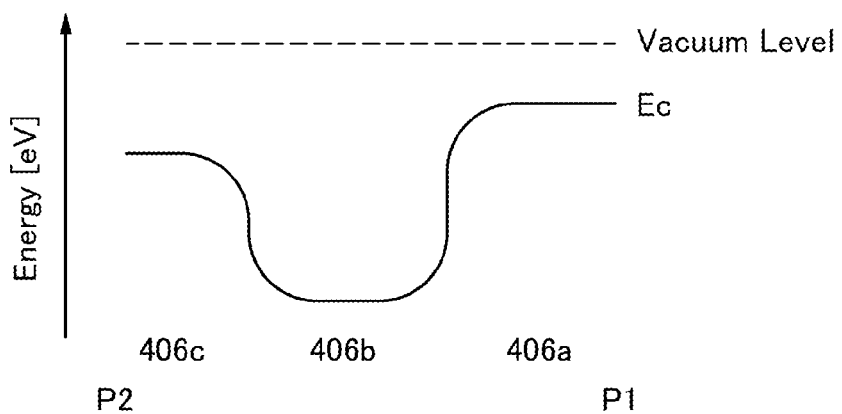
Figure 26C:
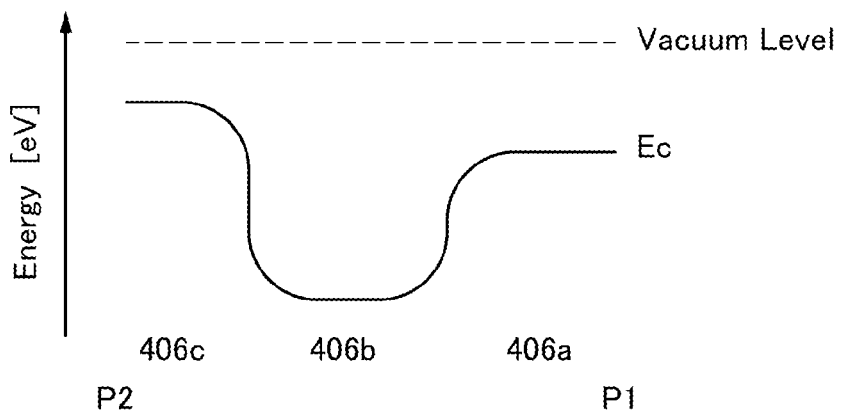

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low density of interface states. For that reason, the stack of the semiconductor 406a, the semiconductor 406b, and the semiconductor 406c has a band structure where energy at each interface and in the vicinity of the interface is changed continuously (continuous junction). Note that FIG. 26A is a cross-sectional view in which the semiconductor 406a, the semiconductor 406b, and the semiconductor 406c are stacked in this order. FIG. 26B shows energy (Ec) of the bottom of the conduction band corresponding to dashed-dotted line P1-P2 in FIG. 26A when the semiconductor 406c has a higher electron affinity than the semiconductor 406a. FIG. 26C shows the case where the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor can be increased.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

Furthermore, the semiconductors 406a, 406b, and 406c preferably have no or a small amount of spinel crystal structures. Moreover, the semiconductors 406a, 406b, and 406c are preferably CAAC-OS.

For example, when a CAAC-OS having a plurality of c-axis aligned crystal parts is used as the semiconductor 406a, the semiconductor 406b formed thereover can have a region with favorable c-axis alignment even in the vicinity of the interface with the semiconductor 406a.

In addition, by an increase in the CAAC proportion of the CAAC-OS, defects can be reduced, for example. Furthermore, for example, an area having a spinel structure can be reduced. Moreover, for example, carrier scattering can be reduced. In addition, the CAAC-OS can be a film having a high blocking property against impurities. Accordingly, when the CAAC proportion of each of the semiconductors 406a and 406c is increased, a favorable interface with the semiconductor 406b where the channel is formed can be formed, so that carrier scattering can be low. For example, the CAAC proportion of the semiconductor 406a and/or the semiconductor 406c may be higher than or equal to 10%, preferably higher than or equal to 20%, further preferably higher than or equal to 50%, still further preferably higher than or equal to 70%. Furthermore, mixing of impurities to the semiconductor 406b can be prevented; as a result, the impurity concentration of the semiconductor 406b can be reduced.

The semiconductor 406b is preferably a semiconductor in which oxygen vacancies are reduced.

For example, in the case were the semiconductor 406b contains oxygen vacancies (also denoted by $V_O$), donor levels are formed by entry of hydrogen into oxygen vacancy sites in some cases. A state in which hydrogen enters oxygen vacancy sites is denoted by $V_OH$ in the following description in some cases. $V_OH$ is a factor of decreasing the on-state current of the transistor because $V_OH$ scatters electrons. Note that oxygen vacancy sites become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 432 is moved to the semiconductor 406b through the semiconductor 406a. In this case, the semiconductor 406a is preferably a layer having an oxygen-transmitting property (a layer through which oxygen passes or is transmitted).

Oxygen is released from the insulator 432 and taken into the semiconductor 406a by heat treatment or the like. In some cases, oxygen exists and is apart from atomics in the semiconductor 406a, or exists and is bonded to oxygen or the like. As the density becomes lower, i.e., the number of spaces between the atoms becomes larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

The semiconductor 406a preferably has crystallinity such that excess oxygen (oxygen) is transmitted so that excess oxygen (oxygen) released from the insulator 432 reaches the semiconductor 406b. For example, in the case where the semiconductor 406a is a CAAC-OS, a structure in which a space is partly provided in the layer is preferably employed because when the whole layer becomes CAAC, excess oxygen (oxygen) cannot be transmitted. For example, the proportion of CAAC of the semiconductor 406a is lower than 100%, preferably lower than 98%, further preferably lower than 95%, still further preferably lower than 90%.

Moreover, the thickness of the semiconductor 406c is preferably as small as possible to increase the on-state current of the transistor. The thickness of the semiconductor 406c is less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 432 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

For example, a region in which the concentration of silicon which is measured by secondary ion mass spectrometry (SIMS) is lower than $1 \times 10^{19}$ atoms/cm$^3$, preferably lower than $5 \times 10^{18}$ atoms/cm$^3$, or further preferably lower than $2 \times 10^{18}$ atoms/cm$^3$ is provided between the semiconductor 406b and the semiconductor 406a. A region with a silicon concentration of lower than $1 \times 10^{19}$ atoms/cm$^3$, preferably lower than $5 \times 10^{18}$ atoms/cm$^3$, more preferably lower than $2 \times 10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

In the case where gallium oxide is used for the semiconductor 406c, indium in the semiconductor 406b can be prevented from being diffused into the gate insulator; thus, the leakage current of the transistor can be reduced.

For example, when an In—Ga—Zn oxide film formed by a sputtering method is used as each of the semiconductor 406a and 406c, the semiconductor 406a and 406c can be deposited with the use of an In—Ga—Zn oxide target having an atomic ratio of In:Ga:Zn=1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the semiconductor 406b is a CAAC-OS, the semiconductor 406b is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

The structures and the other elements of the oxide semiconductor that can be used for the semiconductors 406a, 406b, and 406c and the like have been described so far. By using the above-described oxide semiconductor in the semiconductors 406a, 406b, and 406c and the like, the transistor 490 can have favorable electrical characteristics. For example, excellent subthreshold characteristics and an extremely low off-state current can be achieved. Moreover, a high on-state current and favorable switching speed can be achieved. Furthermore, high withstand voltage can be achieved.

This embodiment can be combined with any of the other embodiments in this specification as appropriate.

Embodiment 4

An example of the configuration of the semiconductor device (cell) of one embodiment of the present invention will be described with reference to FIGS. 16A and 16B.

Figure 16A:
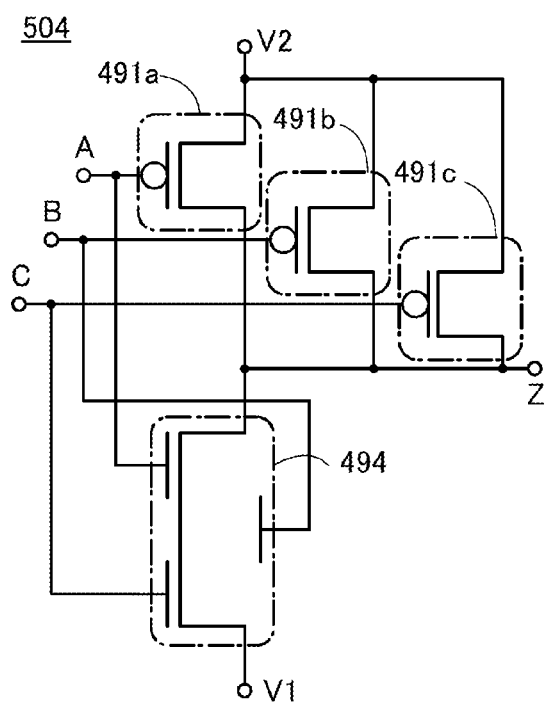
FIGS. 16A and 16B are circuit diagrams illustrating a semiconductor device (cell) of one embodiment of the present invention.

FIG. 16A shows a configuration example of the semiconductor device (cell). The cell 504 includes a transistor 494, the transistor 491a, the transistor 491b, and a transistor 491c. The signals A, B, and C are input to the cell 504, and the cell 504 outputs the signal Z. The power supply potentials V1 and V2 are supplied to the cell 504.

The transistor 494 includes a first gate, a second gate, a third gate, a source, and a drain. The first gate and the second gate are positioned so as to vertically sandwich the channel formation region. The second gate and the third gate are positioned so as to vertically sandwich the channel formation region. The channel formation region includes a region overlapping with the first gate and not overlapping with the second gate and the third gate, a region not overlapping with the first gate and the third gate and overlapping with the second gate, and a region overlapping with the third gate and not overlapping with the first gate and the third gate. In this specification, the transistor 494 with such a structure is represented by a symbol surrounded by dashed-dotted line FIG. 16A.

A gate of the transistor 491a and the first gate of the transistor 494 are electrically connected to each other, and the signal A is input thereto. The gate of the transistor 491b and the second gate of the transistor 494 are electrically connected to each other, and the signal B is input thereto. A gate of the transistor 491c and the third gate of the transistor 494 are electrically connected to each other, and the signal C is input thereto. The transistors 491a, 491b, and 491c are connected in parallel. That is, the source of the transistor 491a, the source of the transistor 491b, and the source of the transistor 491c are electrically connected. The drain of the transistor 491a, the drain of the transistor 491b, and a drain of the transistor 491c are electrically connected. The sources of the transistors 491a, 491b, and 491c are supplied with the power supply potential V2. A source of the transistor 494 is supplied with the power supply potential V1. The drains of the transistors 491a, 491b, and 491c and the drain of the transistor 494 are electrically connected to each other, and output the signal Z.

The transistor 494 is turned on or off depending on the potential of the first gate, the potential of the second gate, and the potential of the third gate. When a potential difference Vgs1 between the first gate and the source exceeds a voltage Vth1, a channel is formed (or carriers are induced) in some cases in the channel formation region that overlaps with the first gate when viewed from above. When a potential difference Vgs2 between the second gate and the source exceeds a voltage Vth2, a channel is formed (or carriers are induced) in some cases in the channel formation region that overlaps with the second gate when viewed from above. When a potential difference Vgs3 between the third gate and the source exceeds a voltage Vth3, a channel is formed (or carriers are induced) in some cases in the channel formation region that overlaps with the third gate when viewed from above. Thus, the transistor 494 has at least three threshold voltages, that is, Vth1, Vth2, and Vth3. The transistor 494 is on when Vgs1>Vth1, Vgs2>Vth2, and Vgs3>Vth3 are satisfied. That is, it can be said that the transistor 494 has a function equivalent to that of a circuit in which three transistors, a transistor whose threshold voltage is Vth1, a transistor whose threshold voltage is Vth2, and a transistor whose threshold voltage is Vth3 are connected in parallel.

The cell 504 illustrated in FIG. 16A is a three-input NAND circuit.

As the transistor 494, an n-channel transistor can be used. As the transistors 491a, 491b, and 491c, p-channel transistors can be used. The power supply potential V1 may be the low power supply potential VSS. The power supply potential V2 may be the high power supply potential VDD.

In the transistor 494, at least two adjacent gates preferably vertically sandwich the channel formation region. In particular, in the transistor 494, the first gate may be formed over the channel formation region, the second gate may be formed under the channel formation region, and the third gate may be formed over the channel formation region. In the transistor 494, the first gate may be formed under the channel formation region, the second gate may be formed over the channel formation region, and the third gate may be formed under the channel formation region.

With such a structure, the area of the transistor 494 can be smaller than that of the circuit in which three transistors whose gates are formed using conductors in the same layer are connected in series. This is explainable because the transistor 494 has a similar structure to that of the transistor 490 in that the two adjacent gates are provided so as to vertically sandwich the channel region of the transistor 494. Therefore, the description of the transistors 490 illustrated in FIGS. 5A to 5C can be referred to as appropriate.

As an example of the transistor 494, a transistor with a low drain current in an off state (also referred to as a leakage current) can be used. For example, the drain current in an off state is $1 \times 10^{-18}$ A or lower, preferably $1 \times 10^{-21}$ A or lower, further preferably $1 \times 10^{-24}$ A or lower at room temperature (approximately 25° C.), or $1 \times 10^{-15}$ A or lower, preferably $1 \times 10^{-18}$ A or lower, further preferably $1 \times 10^{-21}$ A or lower at 85° C. For example, a transistor including an oxide semiconductor (preferably an oxide including In, Ga, and Zn) in its channel formation region (hereinafter also referred to as an oxide semiconductor transistor in the following description) can be used. Consequently, leakage current of the cell can be reduced.

As the transistors 491a, 491b, and 491c, p-channel transistors having a high switching speed can be used. For example, the time required to switch the transistor is shorter than 10 ns, preferably shorter than 1 ns, and more preferably shorter than 0.1 ns. For example, a p-channel Si transistor can be used. As an example of the transistor 494, an n-channel transistor having a high switching speed can be used. For example, the time required to switch the transistor is shorter than 10 ns, preferably shorter than 1 ns, and more preferably shorter than 0.1 ns. For example, an oxide semiconductor transistor can be used. As a result, the delay time of the cell can be shortened.

As illustrated in FIG. 16A, the semiconductor device (cell) of one embodiment of the present invention includes a series of semiconductor regions or channel formation regions, and transistors having a plurality of gates which face the semiconductor regions or channel formation regions. Two gates, or three gates or more may be included. At least two adjacent gates in the plurality of gates are preferably provided so as to vertically sandwich the channel formation region.

Figure 16B:
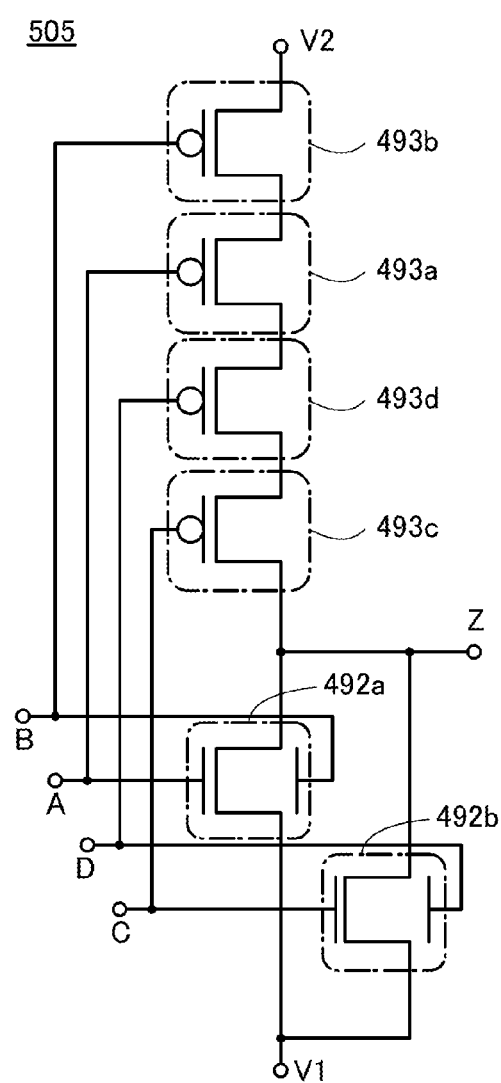

FIG. 16B illustrates another example of a structure of a semiconductor device (cell). The cell 505 includes the transistor 492a, the transistor 492b, the transistor 493a, the transistor 493b, the transistor 493c, and the transistor 493d. The signals A, B, C, and D are input to the cell 505, and the cell 505 outputs the signal Z. The power supply potentials V1 and V2 are supplied to the cell 505.

The transistors 492a and 492b have the same structure and function as the transistor 492 surrounded by a dotted line in FIG. 1D.

The gate of the transistor 493a and the first gate of the transistor 492a are electrically connected to each other, and the signal A is input thereto. The gate of the transistor 493b and the second gate of the transistor 492a are electrically connected to each other, and the signal B is input thereto. A gate of the transistor 493c and a first gate of the transistor 492b are electrically connected to each other, and the signal C is input thereto. A gate of the transistor 493d and a second gate of the transistor 492b are electrically connected to each other, and the signal D is input thereto. The transistors 493b, 493a, 493d, and 493c are connected in series. The source of the transistor 493b is supplied with the power supply potential V2. That is, the source of the transistor 493a and a drain of the transistor 493b are electrically connected to each other. That is, a source of the transistor 493d and the drain of the transistor 493a are electrically connected to each other. That is, a source of the transistor 493c and a drain of the transistor 493d are electrically connected to each other. A source of the transistor 492a and a source of the transistor 492b are supplied with the power supply potential V1. The drains of the transistors 492a and 492b and the drain of the transistor 493c are electrically connected to each other, and output the signal Z.

The cell 505 illustrated in FIG. 16B is a four-input NOR circuit.

As the transistors 492a and 492b, n-channel transistors can be used. As the transistors 493a, 493b, 493c, and 493d, p-channel transistors can be used. The power supply potential V1 may be the low power supply potential VSS. The power supply potential V2 may be the high power supply potential VDD.

FIG. 16B shows the case where the transistors 493b, 493a, 493d, and 493c are connected in series in this order from the side to which the power supply potential V2 is connected in the cell 505, but one embodiment of the present invention is not limited thereto. The four transistors 493b, 493a, 493d, and 493c may be connected in series in any order.

The transistors 492a and 492b illustrated in FIG. 16B have a function similar to that of a circuit in which two transistors are connected in parallel like the transistor 492 described in the above embodiment. In addition, two gates (the conductor 421 and the conductor 420) overlap with each other in the channel formation region when viewed from above, so that the areas of transistors 492a and 492b can be smaller than the area of the circuit in which the two transistors whose gates are formed using conductors in the same layer are connected in parallel. As a result, the cell area can be reduced in some cases.

As an example of the transistors 492a and 492b, a transistor with a low drain current in an off state (also referred to as a leakage current) can be used. For example, the drain current in an off state is $1 \times 10^{-18}$ A or lower, preferably $1 \times 10^{-21}$ A or lower, further preferably $1 \times 10^{-24}$ A or lower at room temperature (approximately 25° C.), or $1 \times 10^{-15}$ A or lower, preferably $1 \times 10^{-18}$ A or lower, further preferably $1 \times 10^{-21}$ A or lower at 85° C. For example, an oxide semiconductor transistor can be used. Consequently, leakage current of the cell can be reduced.

As an example of the transistor 493a, 493b, 493c, and 493d, a p-channel transistor having a high switching speed can be used. For example, the time required to switch the transistor is shorter than 10 ns, preferably shorter than 1 ns, and more preferably shorter than 0.1 ns. For example, a p-channel Si transistor can be used. As an example of the transistors 492a and 492b, an n-channel transistor having a high switching speed can be used. For example, the time required to switch the transistor is shorter than 10 ns, preferably shorter than 1 ns, and more preferably shorter than 0.1 ns. For example, an oxide semiconductor transistor can be used. As a result, the delay time of the cell can be shortened.

This embodiment can be combined with any of the other embodiments in this specification as appropriate.

Embodiment 5

An example of the configuration of the semiconductor device (cell) of one embodiment of the present invention will be described with reference to FIG. 17.

Figure 17:
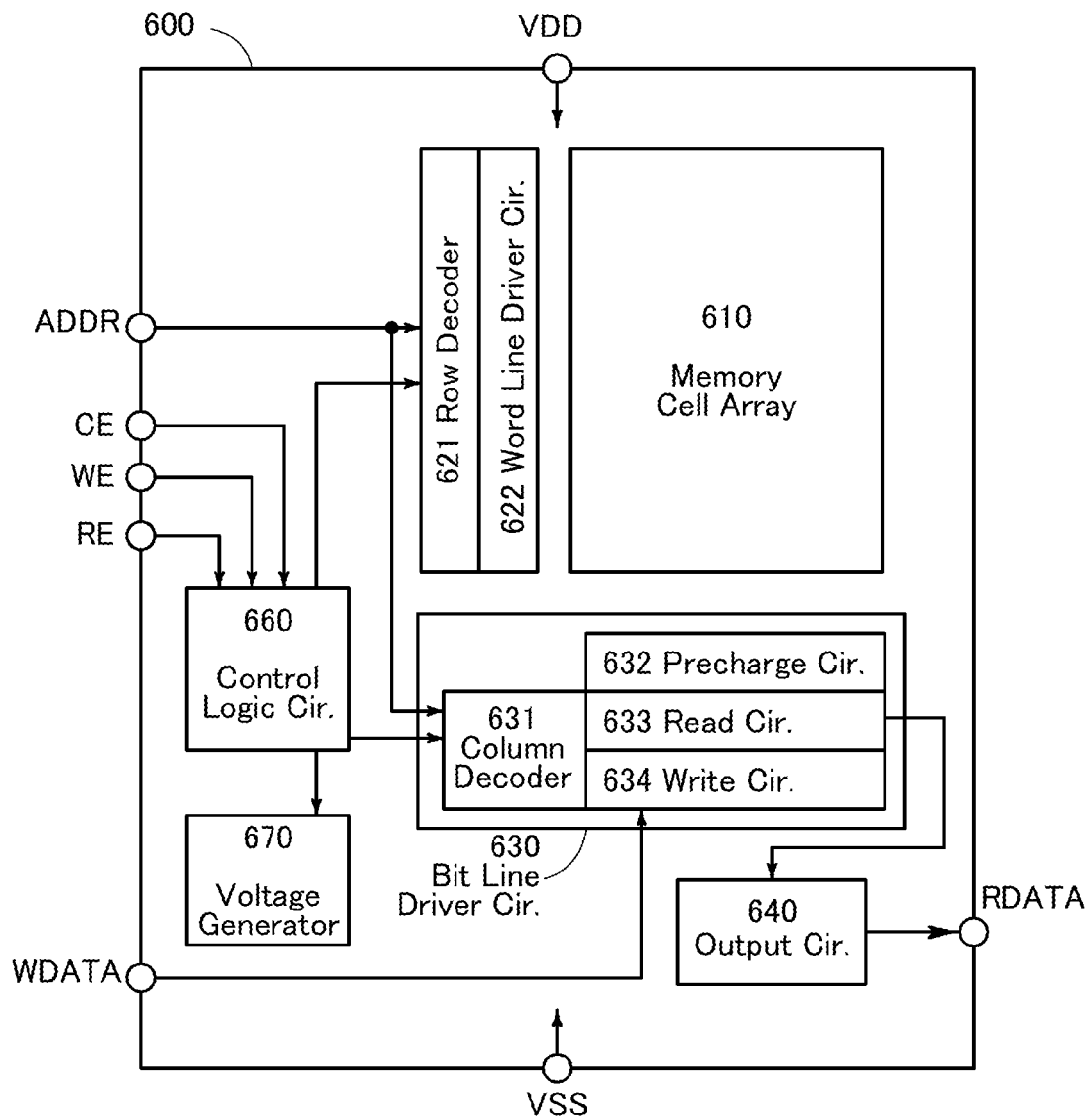
FIG. 17 is a block diagram illustrating a memory device according to one embodiment of the present invention.

FIG. 17 illustrates a configuration example of a semiconductor device. A semiconductor device 600 illustrated in FIG. 17 is an example of a semiconductor device that can function as a memory device. The semiconductor device 600 includes a memory cell array 610, a row decoder 621, a word line driver circuit 622, a bit line driver circuit 630, an output circuit 640, a control logic circuit 660, and a power supply circuit 670.

The bit line driver circuit 630 includes a column decoder 631, a precharge circuit 632, a read circuit 633, and a write circuit 634. The precharge circuit 632 has a function of precharging bit lines. The read circuit 633 has a function of detecting potentials of the bit lines and reading data from memory cells. The read signals are output outside the semiconductor device 600 as digital data signals RDATA, through the output circuit 640

To the semiconductor device 600, a low power supply voltage (VSS), a high power supply voltage (VDD), and the like are supplied from the outside as power supply voltages.

Control signals (CE, WE, RE), an address signal ADDR, a data signal WDATA, and the like are input to the semiconductor device 600 from the outside. ADDR is input to the row decoder 621 and the column decoder 631, and WDATA is input to the write circuit 634.

A semiconductor device (cell) of one embodiment of the present invention can be applied to the low decoder 621, a word line driver circuit 622, a bit line driver circuit 630, the control logic circuit 660, and the like. The semiconductor device (cell) can be also applied to a logic circuit that can be formed using a standard cell. As a result, the semiconductor device 600 that can be miniaturized, the semiconductor device 600 that consumes less power, the semiconductor device 600 with improved operation speed, or the semiconductor device 600 which can be manufactured at low cost can be provided.

A memory cell which is used for the memory cell array 610 may be Dynamic RAM (DRAM) cell or Static RAM (SRAM) cell which is a volatile memory formed using a Si transistor. For example, a memory cell including an oxide semiconductor transistor may be used. Examples of such a memory cell are described with reference to FIG. 18, FIG. 19, FIG. 20, and FIG. 21.

Figure 18:
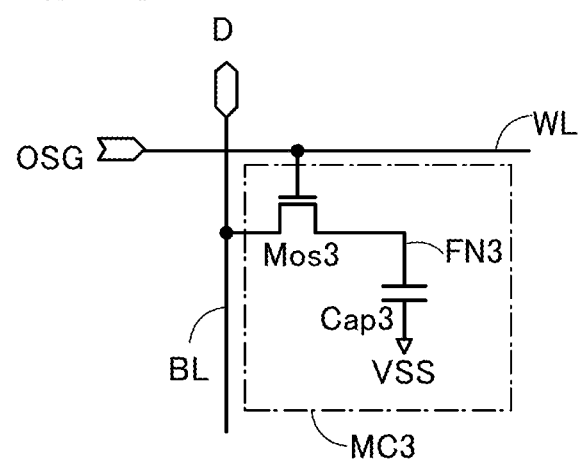
FIG. 18 is a circuit diagram illustrating a memory cell.

FIG. 18 is a circuit diagram illustrating a configuration example of a memory cell. A memory cell MC3 includes a transistor Mos3 and a capacitor Cap3. A node FN3 is a data holding portion, and a terminal of the capacitor Cap3 is connected thereto. The transistor Mos3 functions as a switch connecting the node FN3 to a wiring BL, and a gate of the transistor Mos3 is connected to a wiring WL. A signal OSG is input to the wiring WL. The amount of charge which is accumulated in the capacitor Cap3 through the transistor Mos3 is controlled, retained, and determined, whereby the memory cell MC3 can function as a memory cell.

Figure 19:
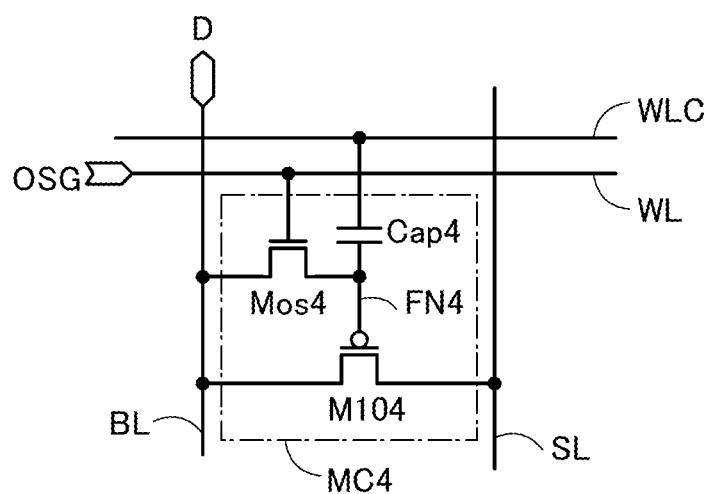
FIG. 19 is a circuit diagram illustrating a memory cell.

FIG. 19 is a circuit diagram showing a configuration example of a memory cell. A memory cell MC4 includes a transistor Mos4, a transistor M104, and a capacitor Cap4. The transistor Mos4 whose data holding portion is a node FN4 functions as a switch connecting the node FN4 to a wiring BL, and a gate of the transistor Mos4 is connected to a wiring WL. A signal OSG is input to the wiring WL. The capacitor Cap4 connects a wiring WLC to the node FN4. The transistor M104 is a p-channel transistor, and a gate, a source, and a drain thereof are connected to the node FN4, a wiring SL, and the wiring BL, respectively. The amount of charge which is accumulated in the capacitor Cap4 (it is sometimes including an amount of charge accumulated in a parasitic capacitance accompanied with the node FN4) is controlled and retained through the transistor Mos4. In addition, the amount of charge is determined on the basis of the state of the transistor M104. Thus, the memory cell MC4 functions as a memory cell. A memory cell which performs reading can be selected by the wiring WLC connected to the capacitor Cap4. The transistor M104 may be an n-channel transistor. In accordance with the conductivity type of the transistor M104, a voltage applied to the wirings BL, SL, and WLC is determined.

Figure 20:
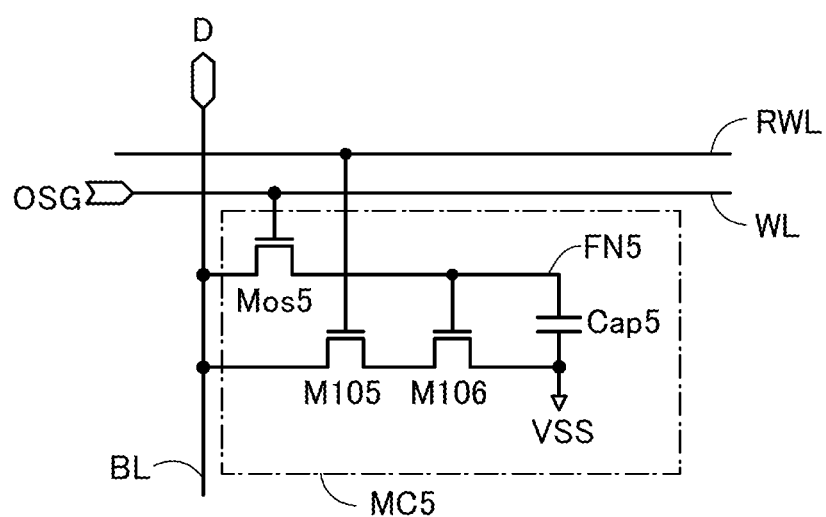
FIG. 20 is a circuit diagram illustrating a memory cell.

FIG. 20 is a circuit diagram showing a configuration example of a memory cell. A memory cell MC5 includes a transistor Mos5, a transistor M105, a transistor M106, and a capacitor Cap5. The transistor Mos5 whose data holding portion is a node FN5 functions as a switch connecting the node FN5 to a wiring BL, and a gate of the transistor Mos5 is connected to a wiring WL. A signal OSG is input to the wiring WL. The capacitor Cap5 connects the node FN5 and VSS. The transistors M105 and M106 are connected in series, and the drain of the transistor M105 is connected to the wiring BL, and the source of the transistor M106 is connected to VSS. A gate of the transistor M105 is connected to a wiring RWL, and a gate of the transistor M106 is connected to the node FN5. The amount of charge which is accumulated in the capacitor Cap5 (it is sometimes including an amount of charge accumulated in a parasitic capacitance accompanied with the node FN5) is controlled and retained through the transistor Mos5. In addition, the amount of charge is determined on the basis of the state of the transistor M106. Thus, the memory cell MC5 functions as a memory cell. A memory cell which performs reading can be selected by the transistor M105. The transistors M105 and M106 may be p-channel transistors. In accordance with the conductivity type of the transistors M105 and M106, a voltage applied to the wirings BL, WL, RWL is determined. The capacitor Cap5 is not necessarily provided.

Figure 21:
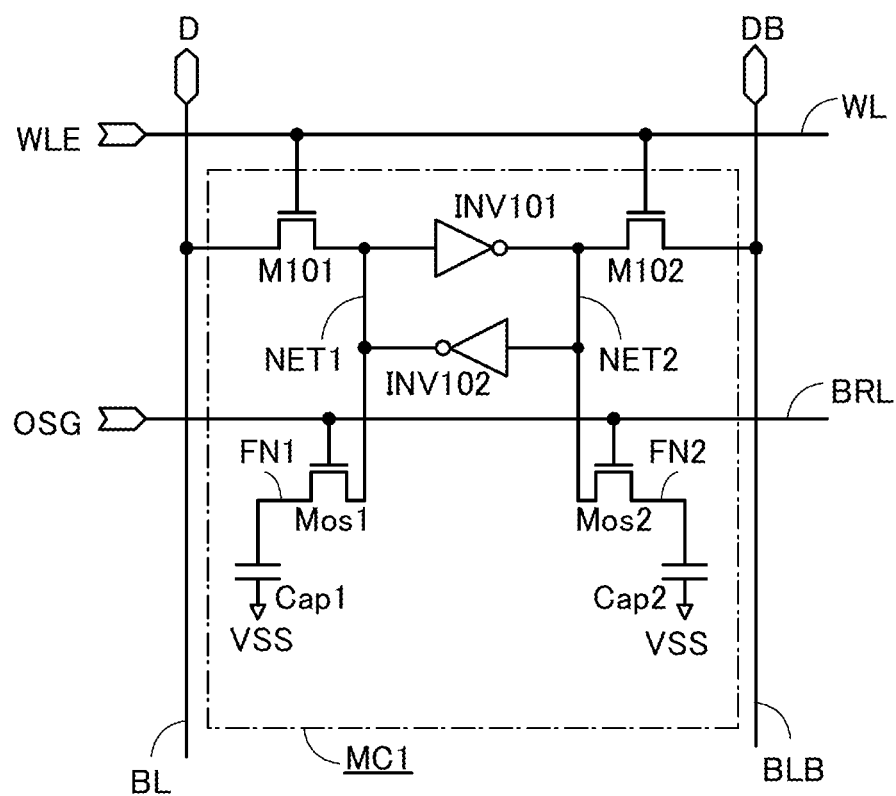
FIG. 21 is a circuit diagram illustrating a memory cell.

A memory cell MC1 illustrated in FIG. 21 is an example of an SRAM cell in which backup operation can be performed. The memory cell MC1 includes transistors M101, M102, Mos1, and Mos2, inverters INV101 and INV102, and capacitors Cap1 and Cap2. The memory cell MC1 is connected to wirings WL, BL, BLB, and BRL. To the semiconductor device 100, a low power supply voltage (VSS), and the like are supplied as the power supply voltage.

The inverters INV101 and INV102 constitute an inverter loop including the nodes NET1 and NET2. The gates of the transistors M101 and M102 are connected to the wiring WL. The transistor M101 functions as a switch for connecting the node NET1 and a wiring BL, and the transistor M102 functions as a switch for connecting the node NET2 and a wiring BLB, respectively. This is a structure of an SRAM cell, which functions as a volatile memory cell.

In memory circuits for backup (Mos1 and Cap1) and (Mos2 and Cap2), nodes FN1 and FN2 are data holding portions. The node NET1 is connected to (the Mos1, and the Cap1), and the node NET2 is connected to (the Mos2 and the Cap2). The transistor Mos1 functions as a switch for connecting the Cap1 and the NET1. The transistor Mos2 functions as a switch for connecting the Cap2 and the NET2. Gates of the transistors Mos1 and Mos2 are connected to a wiring BRL. A signal OSG is input to the wiring BRL. The amount of charge which is accumulated in the capacitors Cap1 and Cap2 through the transistors Mos1 and Mos2 is controlled, retained, and determined, whereby the memory cell MC1 can function as a memory cell. The memory cell MC1 can hold data for a long time without supply of power, so that the memory cell can be used for backup.

In the configuration examples of the memory cells illustrated in FIGS. 18, 19, 20 and 21, the transistors Mos1, Mos2, Mos3, Mos4, and Mos5 are preferably oxide semiconductor transistors. As a result, since a leakage current (off-state current) flows between a source and a drain in an off-state is extremely low, fluctuation in the voltage of the nodes FN1, FN2, FN3, FN4, and FN5 can be suppressed. Thus, the circuit made up of the Mos1 and the Cap1, the circuit made up of the Mos2 and the Cap2, a circuit made up of the Mos3 and the Cap3, a circuit made up of the Mos4 and the Cap4, a circuit made up of the Mos5 and the Cap5 can be operated as nonvolatile memory circuits or memory circuits capable of holding data for a long time without supply of power. All the n-channel transistors included in the memory cells may be oxide semiconductor transistors. As a result, a manufacturing process of an n-channel Si transistor can be omitted in some cases. In addition, the circuits other than the memory cell may be provided under the memory cell array.

The control logic circuit 660 illustrated in FIG. 17 processes the signals (CE, WE, RE) input from the outside, and generates control signals and the like for the row decoder 621, the column decoder 631, and the power supply circuit 670. CE, WE, and RE are a chip enable signal, a write enable signal, and a read enable signal, respectively. Signals processed by the control logic circuit 660 are not limited to those listed above, and other control signals may be input as necessary.

The read circuit 633 may include a sense amplifier in which the potential Vref and the bit line potential may be compared. Furthermore, the read circuit 633 may include a logic circuit for converting the read data into the output format. The write circuit 634 may include a logic circuit for converting the input data WDATA into the writing format.

VDD, VSS, or another power supply voltage is input to the power supply circuit 670, and the power supply circuit 670 generates and outputs potentials necessary for reading operation and writing operation Note that the decision whether the circuits and signals described above are used or not can be made as appropriate as needed.

In the case where the memory cell includes an oxide semiconductor transistor, the oxide semiconductor transistor can be formed at the same time as the oxide semiconductor transistor included in the semiconductor device (cell) of one embodiment of the present invention in some cases. The process cost is reduced as compared to the case where an element for a memory element different from the oxide semiconductor transistor is formed.

The circuits other than the memory cell array 610 may include an n-channel Si transistor and a p-channel Si transistor. In the case where the memory cell includes a region where an oxide semiconductor transistor is included and a Si transistor is not included, the circuits other than the memory cell array 610 may be stacked under the memory cell array 610. This leads to the semiconductor device 600 with a reduced size.

All the n-channel transistors may be oxide semiconductor transistors. In such a case, the process can be simplified because the n-channel Si transistor is not needed, which enables increase in yield and reduction in the process cost.

This embodiment can be combined with any of the other embodiments in this specification as appropriate.

Embodiment 6

An example of the structure of a semiconductor device including the semiconductor device (cell) of one embodiment of the present invention will be described with reference to FIG. 22.

Figure 22:
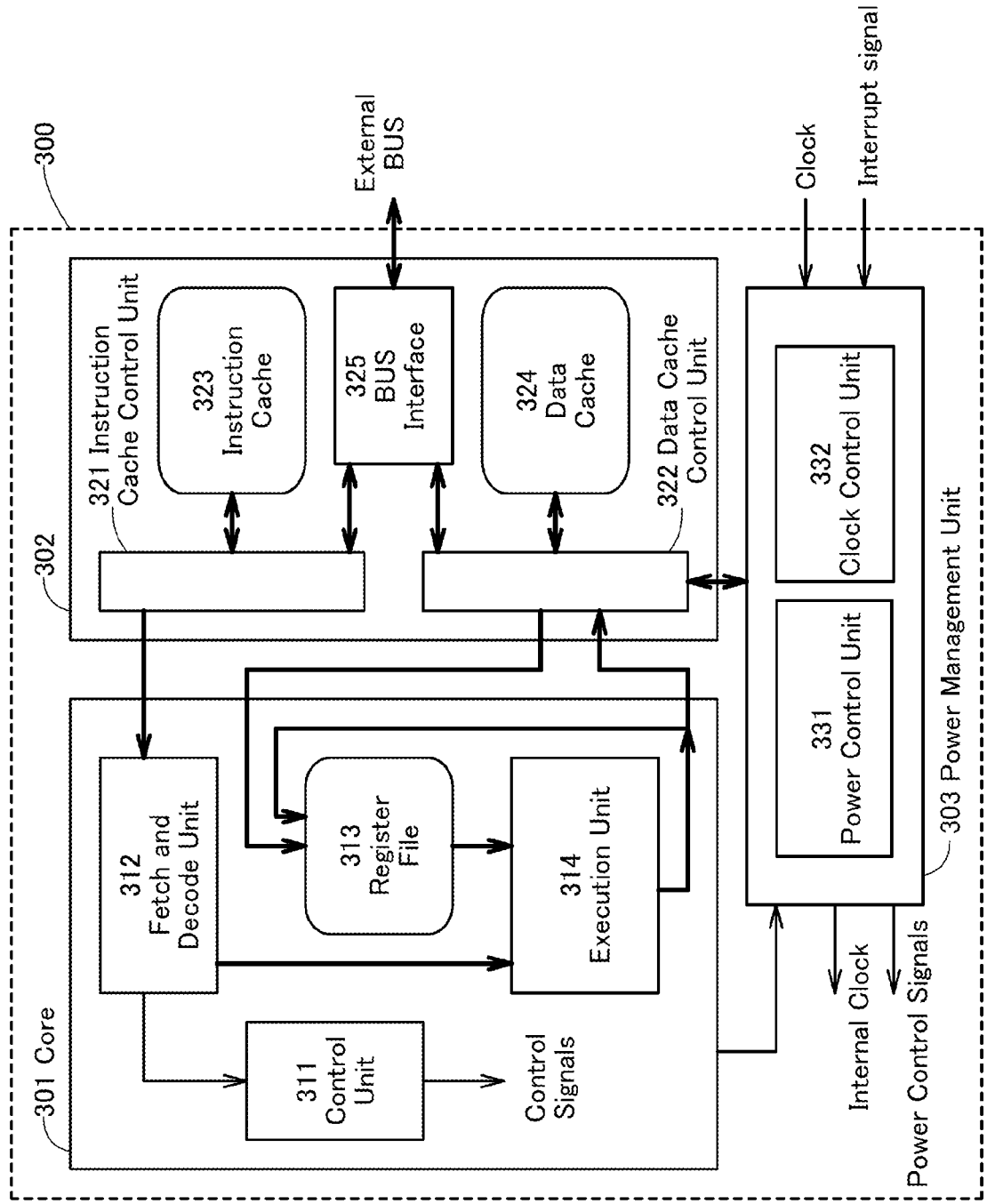
FIG. 22 is a block diagram illustrating a CPU of one embodiment of the present invention.

A semiconductor device 300 illustrated in FIG. 22 includes a CPU core 301, a power management unit 303, and a peripheral circuit 302. The power management unit 303 includes a power supply control unit 331 and a clock control unit 332. The peripheral circuit 302 includes an instruction cache control unit 321, an instruction cache 323, a data cache control unit 322, a data cache 324, and a bus interface 325. The CPU core 301 includes a control unit 311, a fetch and decode unit 312, an execution unit 314, and a register file 313.

The semiconductor device (cell) of one embodiment of the present invention can be applied to a logic circuit which can be formed using a standard cell. Therefore, the semiconductor device (cell) of one embodiment of the present invention can be applied to the power supply control unit 331, the clock control unit 332, the instruction cache control unit 321, the instruction cache 323, the data cache control unit 322, the data cache 324, the bus interface 325, the control unit 311, the fetch and decode unit 312, the execution unit 314 and/or the register file 313. As a result, the semiconductor device 300 that can be miniaturized, the semiconductor device 300 that consumes less power, the semiconductor device 300 with improved operation speed, or the semiconductor device 300 which can be manufactured at low cost can be provided.

The fetch and decode unit 312 has a function of acquiring an instruction from the main memory and the instruction cache 323 and decoding the instruction.

The control unit 311 has a function of controlling the timing of data transmission and reception between the fetch and decode unit 312, the execution unit 314, the register file 313, and the outside of the CPU core 301 in accordance with fetched instructions or the like.

The execution unit 314 includes an arithmetic logic unit (ALU), a shifter, a multiplier, and the like. The execution unit 314 has a function of performing a variety of arithmetic operations such as four arithmetic operations and logic operations.

The register file 313 includes a plurality of registers including a general purpose register and stores data that is read from the main memory and the data cache 324, the data output from the execution unit 314, or the like.

The instruction cache 323 has a function of temporarily storing frequently used instruction. The data cache 324 has a function of temporarily storing frequently used data. The instruction cache control unit 321 controls the operation of the instruction cache 323, and the like. The data cache control unit 322 controls the operation of the data cache 324, and the like.

The bus interface 325 is connected to an external bus, and functions as a path for data between the semiconductor device 300 and devices outside the semiconductor device 300.

The power management unit 303 performs control regarding electric power of the semiconductor device 300.

A control signal from the CPU core 301, an interrupt signal from the outside of the semiconductor device 300, and the like are input to the power supply control unit 331, and outputs power control signals. For example, the semiconductor device 300 has a plurality of power domains. In the case where the power switches are provided between the power source and each of the power domains, the power supply control unit 331 may have a function of controlling the operation of the power switches. For example, in the case where a voltage regulator is provided, the power supply control unit 331 may have a function of controlling the voltage regulator. The voltage regulator may be provided in the semiconductor device 300 or outside the semiconductor device 300. Alternatively, only part of the voltage regulator (for example, an inductor coil) may be provided outside the semiconductor device 300.

A control signal from the CPU core 301, and a clock signal, an interrupt signal, and the like from the outside of the semiconductor device 300 are input to the clock control unit 332, and an internal clock is output. For example, the semiconductor device 300 may perform a coarse-grained clock gating by which clock is controlled for each large block such as the CPU core 301 and the peripheral circuit 302. Alternatively, the semiconductor device 300 may perform a fine-grained clock gating by which clock is controlled for each small block comprising fewer flip-flops.

The semiconductor device 300 having the above-described configuration can perform power gating. An example of the flow of the power gating operation will be described.

The power gating is a technique for stopping the supply of power supply voltage to one or more of various circuits included in the semiconductor device 300 in a period during which the semiconductor device 300 does not execute processing or the like. The power gating is a technique for reducing power consumption by reducing DC power that is consumed when the power supply voltage is supplied. In the power gating, necessary data in the semiconductor device 300 is saved when power is turned off. When the power is turned on, the saved data is restored and the instruction is executed again in the CPU core 301.

First, the CPU core 301 sets the mode of power gating by setting the value in the register in the power supply control unit 331 in advance. The power gating is started, for example, by an instruction to the CPU core 301. After the CPU core 301 decodes the instruction, the CPU core 301 transmits a control signal for turning off power to the power supply control unit 331. Next, the power supply control unit 331 saves data stored in a register included in the semiconductor device 300, the register file 313, the instruction cache 323, the data cache 324, and the like or part of the data. Then, the power supply control unit 331 stops the supply of power supply voltage to one or more of various circuits included in the semiconductor device 300 by controlling the operation of power switches. On the other hand, an interrupt signal is input to the power management unit 303, thereby starting the supply of the power supply voltage to the circuits. A counter may be provided in the power supply control unit 331 to be used to determine the timing of starting the supply of the power supply voltage regardless of input of an interrupt signal. Then, the semiconductor device 300 restores the saved data. After that, the instruction is executed again in the CPU core 301.

A state retention register can be used as the register. As a result, data stored in the register can be saved in a state retention portion of the register without saving the data outside the semiconductor device 300. The state retention portion may have a configuration to which the supply of power supply voltage is not stopped while power is off. The state retention portion may include a circuit comprising an oxide semiconductor transistor and a capacitor, and a memory circuit capable of holding data for a long time without supply of power may be used. With such a structure, power and time are not required as compared to the case where data stored in the register is saved in the memory other than the register.

The register file 313, the instruction cache 323, and/or the data cache 324 may include the memory cell including the oxide semiconductor transistor described in the above embodiments. For example, in the case were a SRAM cell in which backup operation can be performed is included, the register file 313, the instruction cache 323, and/or the data cache 324 can save the stored data in the memory circuit for backup. As another structure, the register file 313, the instruction cache 323, and/or the data cache 324 have a mode where they are supplied with a low power supply voltage at which data can be held (also referred to a low power supply voltage mode). At the time of power gating, the register file 313, the instruction cache 323, and/or the data cache 324 is shifted to the low power supply voltage mode instead of stopping the supply of power supply voltage to the register file 313, the instruction cache 323, and/or the data cache 324, whereby the power consumption can be reduced. With such a structure, power and time can be reduced as compared to the case where data stored in the register file 313, the instruction cache 323, and/or the data cache 324 is saved outside the semiconductor device 300. Alternatively, power and/or time can be reduced as compared to the case where the data stored in the instruction cache 323 and/or the data cache 324 is not saved at the time of power gating, and data and instruction are acquired from outside the semiconductor device 300 as needed after the power supply is turned on.

Note that the semiconductor device of one embodiment of the present invention can be used for not only a CPU but also a graphics processing unit (GPU), a programmable logic device (PLD), a digital signal processor (DSP), a microcontroller unit (MCU), a radio frequency identification (RFID) tag, a custom LSI, and the like.

This embodiment can be combined with any of the other embodiments in this specification as appropriate.

Embodiment 7

An example of the structure of a semiconductor device including the semiconductor device of one embodiment of the present invention will be described with reference to FIG. 23.

Figure 23:
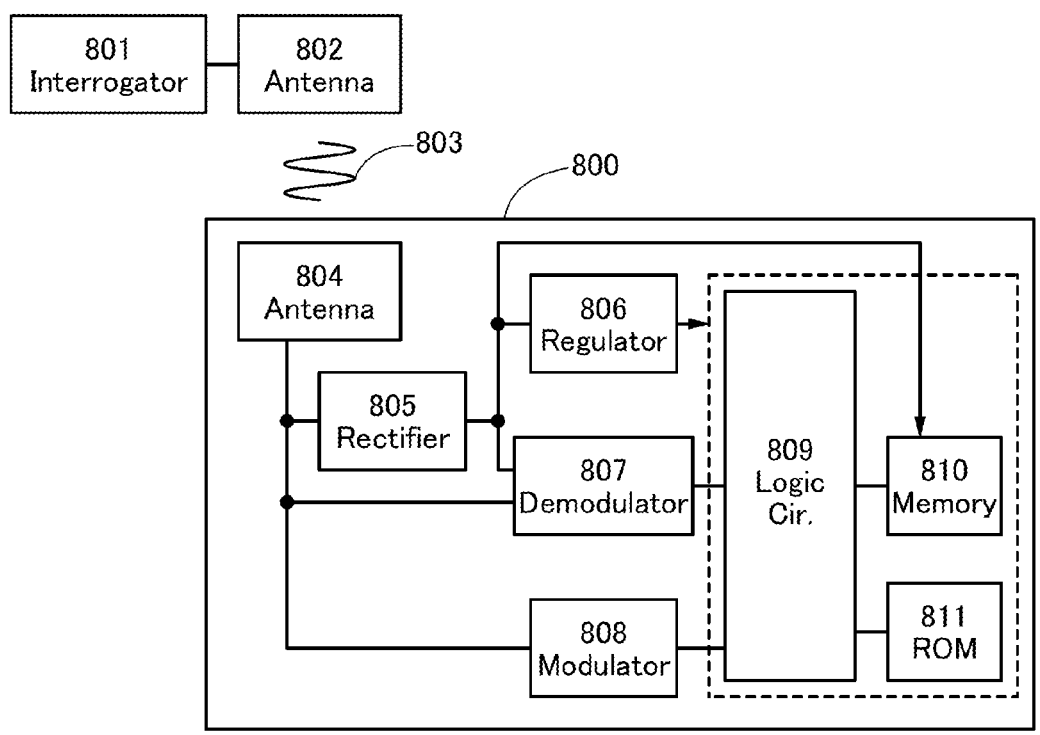
FIG. 23 is a block diagram illustrating an RFID of one embodiment of the present invention.

A semiconductor device 800 illustrated in FIG. 23 is an example of the structure of an RFID tag. The RFID tag can be used for an individual authentication system in which an object or the like is recognized by reading the individual information, for example. The semiconductor device 800 includes an antenna 804, a rectifier circuit 805, a constant voltage circuit 806, a demodulation circuit 807, a modulation circuit 808, a logic circuit 809, a memory circuit 810, and a ROM 811.

The semiconductor device (cell) of one embodiment of the present invention can be applied to the logic circuit 809, the memory circuit 810, the ROM 811, and the like. The semiconductor device (cell) can be also applied to a logic circuit that can be formed using a standard cell. As a result, the semiconductor device 600 that can be miniaturized, the semiconductor device 600 that consumes less power, the semiconductor device 600 with improved operation speed, or the semiconductor device 600 which can be manufactured at low cost can be provided.

The antenna 804 exchanges the radio signal 803 with the antenna 802 which is connected to the communication device 801. The rectifier circuit 805 generates a stable potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from a potential output from the rectifier circuit 805 and supplies the voltage to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory cell, and the like. The ROM 811 is a circuit that stores an identification number (ID) or the like.

Note that as the data transmission method, there are an electromagnetic coupling method in which a pair of coils is provided so as to face each other and communicates with each other by mutual induction, an electromagnetic induction method in which communication is performed using an induction field, a radio wave method in which communication is performed using a radio wave, and the like. Any of these methods can be used in the semiconductor device 800 described in this embodiment.

Note that decision whether each circuit described above is provided or not can be made as appropriate as needed.

The transistors including an oxide semiconductor described in the above embodiment may be used as elements having a rectifying function included in the demodulation circuit 807. Since the transistors have low off-state currents, the reverse currents of the elements having a rectifying function can be reduced, leading to excellent rectification efficiency. Furthermore, these oxide semiconductor transistors are formed at the same time as the oxide semiconductor transistor included in the semiconductor device (cell) of one embodiment of the present invention, whereby high performance of the semiconductor device 800 can be achieved without increase in the number of manufacturing steps.

All the n-channel transistors may be oxide semiconductor transistors. In such a case, the process can be simplified because the n-channel Si transistor is not needed, which enables increase in yield and reduction in the process cost.

This embodiment can be combined with any of the other embodiments in this specification as appropriate.

Embodiment 8

In this embodiment, application examples of the semiconductor device described in the above embodiments to an electronic component and to an electronic device including the electronic component will be described with reference to FIGS. 24A and 24B, and FIGS. 25A to 25F.

Figure 24A:
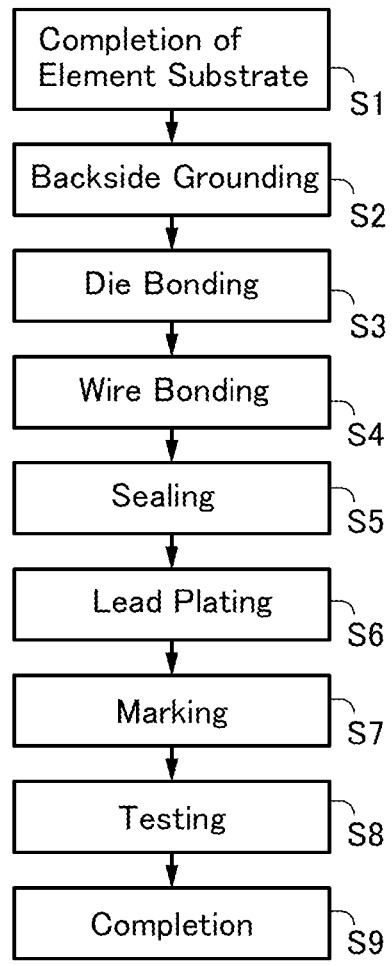
FIGS. 24A and 24B each illustrate an electronic device of one embodiment of the present invention.

FIG. 24A shows an example where the semiconductor device (cell) of one embodiment of the present invention is used to make an electronic component. Note that an electronic component is also referred to as semiconductor package or IC package. This electronic component has a plurality of standards and names depending on a terminal extraction direction and a terminal shape. Thus, examples of the electronic component are described in this embodiment.

The electronic component can be completed after an assembly process (post-process) by using a plurality of components that can be detached and attached from and to a printed wiring board in combination. An assembly process (post-process) is described with reference to FIG. 24A.

After an element substrate obtained in the preceding process is completed (Step S1), a back surface of the substrate is ground (Step S2). By thinning the substrate at this stage, the warpage or the like of the substrate in the preceding process is reduced and the component is downsized.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed wiring board in a later step can be performed with higher reliability.

Next, printing process (marking) is performed on a surface of the package (Step S7). Then, through a final test step (Step S8), the electronic component is completed (Step S9).

The above electronic component can include a semiconductor device (cell) according to one embodiment of the present invention. As a result, an electronic component that can be miniaturized, an electronic component which consumes less power, an electronic component with improved operation speed, or an electronic component with reduced cost can be provided.

Figure 24B:
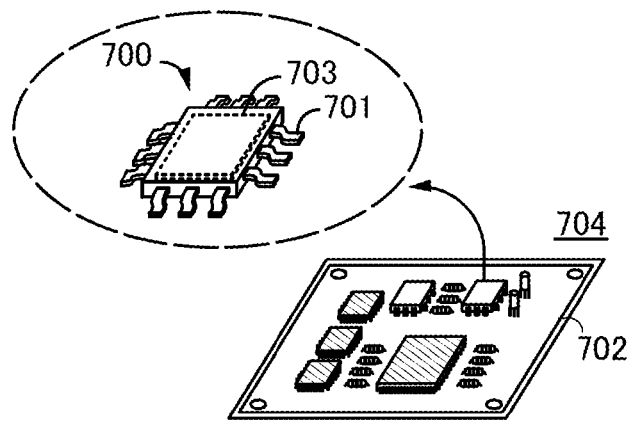

FIG. 24B is a perspective schematic diagram of the completed electronic component. FIG. 24B shows a perspective schematic diagram of a quad flat package (QFP) as an example of the electronic component. An electronic component 700 illustrated in FIG. 24B includes a lead 701 and a semiconductor device 703. The electronic component 700 in FIG. 24B is, for example, mounted on a printed wiringboard 702. The plurality of electronic components 700 are used in combination to be electrically connected to each other over the printed wiring board 702; thus, a circuit board on which the electronic components are mounted (a circuit board 704) is completed. The completed circuit board 704 is provided in an electronic device or the like.

The above-described electronic component can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the above-described electronic component are mobile phones, game machines including portable game machines, portable data terminals, e-book readers, cameras such as video cameras and digital still cameras, goggle-type display devices (head mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

Figure 25A:
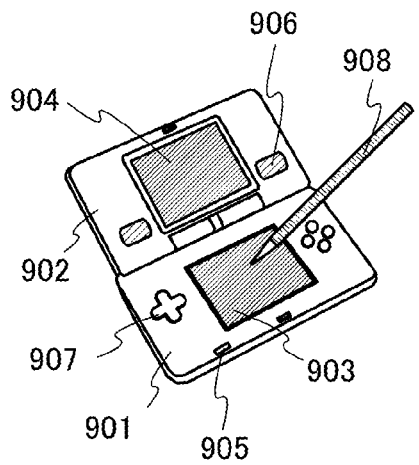
FIGS. 25A to 25F each illustrate an electronic device of one embodiment of the present invention.

FIG. 25A illustrates a portable game machine including a housing 901, a housing 902, a display portion 903, a display portion 904, a microphone 905, a speaker 906, an operation key 907, a stylus 908, and the like. Although the portable game machine in FIG. 25A has the two display portions 903 and 904, the number of display portions included in a portable game machine is not limited to this.

Figure 25B:
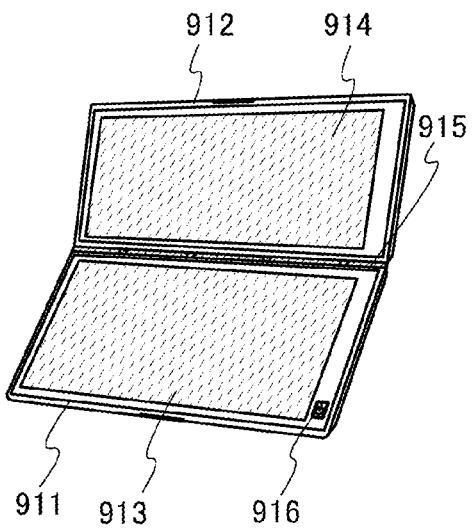

FIG. 25B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 25C:
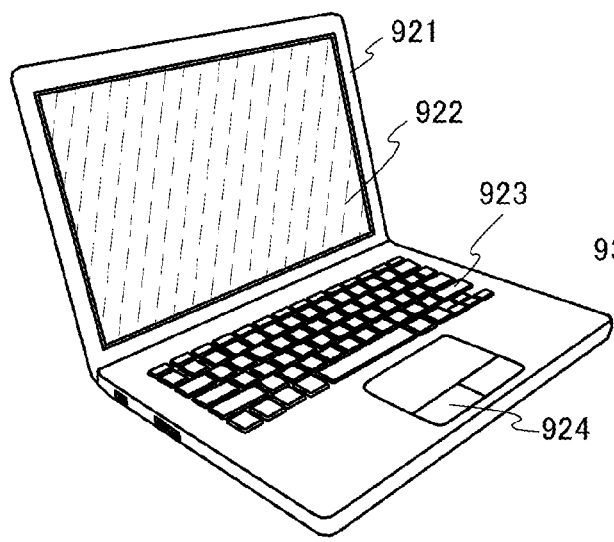

FIG. 25C illustrates a laptop personal computer, which includes a housing 921, a display portion 922, a keyboard 923, a pointing device 924, and the like.

Figure 25D:
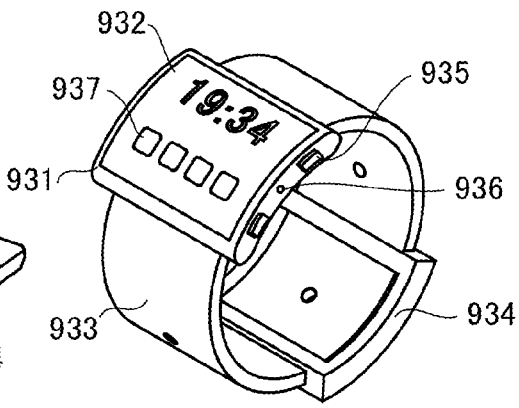

FIG. 25D illustrates an example of a wrist-watch-type information terminal, which includes a housing 931, a display portion 932, a band 933, a buckle 934, operation buttons 935, an input/output terminal 936, and the like. The information terminal is capable of executing a variety of applications such as mobile phone calls, e-mailing, reading and editing texts, music reproduction, Internet communication, and a computer game. The display surface of the display portion 932 is bent, and images can be displayed on the bent display surface. The display portion 932 includes a touch sensor, and operation control can be performed by touching the screen with a finger, a stylus, or the like. The information terminal can employ near field communication, which is a communication method based on an existing communication standard. Moreover, the information terminal includes the input output terminal 936, and data can be directly transmitted to and received from another information terminal via a connector.

Figure 25E:
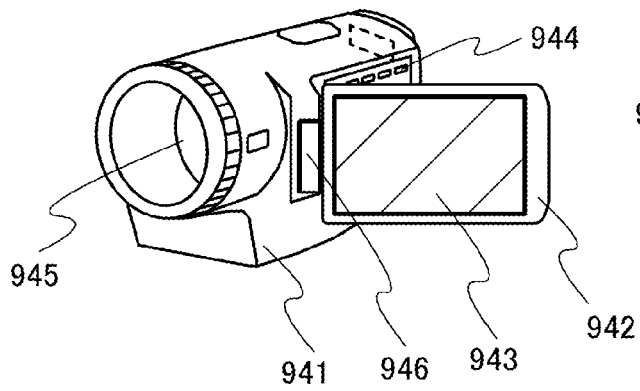

FIG. 25E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 25F:
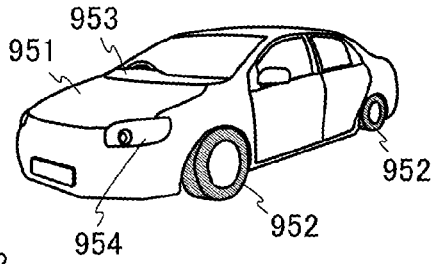

FIG. 25F illustrates an ordinary vehicle including a car body 951, wheels 952, a dashboard 953, lights 954, and the like By applying an electronic component which enables miniaturization, low power consumption, or high speed operation including the semiconductor device (cell) of one embodiment the present invention to these electronic devices, a small-sized electronic device, an electronic device which consumes less power, an electronic device with improved operation speed, or an electronic device with reduced cost can be provided.

This embodiment can be combined with any of the other embodiments in this specification as appropriate.

In this specification, a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In this specification, an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is silicon, examples of an impurity which changes characteristics of the semiconductor include oxygen, Group 1 elements except hydrogen, Group 2 elements, Group 13 elements, and Group 15 elements.

In this specification, an insulator may be formed to have, for example, a single-layer structure or a stacked-layer structure including an insulator containing one or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be formed in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

In this specification, unless otherwise specified, a conductor may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

For example, in this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit description "X and Y are electrically connected" is the same as the explicit description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Here, each of X, Y, Z1, and Z2 denotes an object (e.g., a device, an element, a circuit, a wiring, an electrode, a terminal, a conductive film, a layer, or the like).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-082256 filed with Japan Patent Office on Apr. 11, 2014, the entire contents of which are hereby incorporated by reference.

What is claimed is:
1. A semiconductor device comprising:
a first transistor comprising:
   a first conductor;
   a first insulator over the first conductor;
   an oxide semiconductor over the first insulator, the oxide semiconductor overlapping with the first conductor;
   a second insulator over the oxide semiconductor;
   a second conductor over the second insulator;
   a third conductor being in contact with the oxide semiconductor; and
   a fourth conductor being in contact with the oxide semiconductor,
wherein the oxide semiconductor includes a first region positioned between the third conductor and the fourth conductor,
wherein the first region includes:
   a second region overlapping with the first conductor;
   a third region not overlapping with the first conductor;
   a fourth region overlapping with the second conductor; and
   a fifth region not overlapping with the second conductor,
wherein the second region and the fifth region overlap with each other, and
wherein the third region and the fourth region overlap with each other; and a second transistor, wherein a layer in which the first transistor is provided and a layer in which the second transistor is provided are provided so as to overlap with each other.

2. The semiconductor device according to claim 1, wherein the second region and the fourth region partly overlap with each other.

3. The semiconductor device according to claim 1,
wherein the third region and the fifth region have a sixth region where they overlap with each other, and
wherein the sixth region is narrower than the second region and the fourth region.

4. An RFID tag including the semiconductor device according to claim 1, and an antenna.

5. An electronic device comprising the semiconductor device according to claim 1 and a printed wiring board.

6. The semiconductor device according to claim 1, wherein the second transistor is a p-channel transistor.

7. A semiconductor device comprising:
a first transistor comprising:
a first conductor;
a first insulator over the first conductor;
an oxide semiconductor over the first insulator, the oxide semiconductor overlapping with the first conductor;
a second insulator over the oxide semiconductor;
a second conductor over the second insulator;
a third conductor being in contact with the oxide semiconductor; and
a fourth conductor being in contact with the oxide semiconductor,
wherein the oxide semiconductor includes a first region positioned between the third conductor and the fourth conductor,
wherein the first region includes:
a second region overlapping with the first conductor and not overlapped with the second conductor; and
a third region not overlapping with the first conductor and overlapped with the second conductor; and
a second transistor and a third transistor, wherein a layer in which the first transistor is provided and a layer in which the second transistor and the third transistor are provided are provided so as to overlap with each other.

8. The semiconductor device according to claim 7,
wherein the first region further comprises a fourth region not overlapping with the first conductor and not overlapped with the second conductor, and
wherein the fourth region is narrower than the second region and the third region.

9. The semiconductor device according to claim 7,
wherein the fourth region is provided between the second region and the third region.

10. The semiconductor device according to claim 7, wherein a channel width of the first transistor is larger than channel widths of the second transistor and the third transistor.

11. An RFID tag including the semiconductor device according to claim 7, and an antenna.

12. An electronic device comprising the semiconductor device according to claim 7 and a printed wiring board.

13. The semiconductor device according to claim 7,
wherein the third conductor is partially overlapped with the second conductor and,
wherein the fourth conductor is partially overlapping with the first conductor.

14. The semiconductor device according to claim 7, wherein the second transistor and the third transistor are p-channel transistors.

15. A semiconductor device comprising:
a first transistor comprising:
a first conductor;
a first insulator over the first conductor;
an oxide semiconductor over the first insulator, the oxide semiconductor overlapping with the first conductor;
a second insulator over the oxide semiconductor;
a second conductor over the second insulator;
a third conductor being in contact with the oxide semiconductor; and
a fourth conductor being in contact with the oxide semiconductor,
wherein the oxide semiconductor includes a first region positioned between the third conductor and the fourth conductor, and
wherein the first region partially overlaps with the first conductor and is partially covered with the second conductor;
a second transistor, a gate of the second transistor being electrically connected to the first conductor through a first connection portion; and
a third transistor, a gate of the third transistor being electrically connected to the second conductor through a second connection portion,
wherein a layer in which the first transistor is provided and a layer in which the second transistor and the third transistor are provided are provided to overlap with each other, and
wherein the first region, a channel formation region of the second transistor, and a channel formation region of the third transistor are provided between the first connection portion and the second connection portion.

16. An RFID tag including the semiconductor device according to claim 15, and an antenna.

17. An electronic device comprising the semiconductor device according to claim 15 and a printed wiring board.

18. The semiconductor device according to claim 15,
wherein the first region includes:
a second region overlapping with the first conductor;
a third region not overlapping with the first conductor;
a fourth region overlapping with the second conductor; and
a fifth region not overlapping with the second conductor,
wherein the second region and the fifth region overlap with each other, and
wherein the third region and the fourth region overlap with each other.

19. The semiconductor device according to claim 15,
wherein the first region includes:
a second region overlapping with the first conductor and not overlapped with the second conductor; and
a third region not overlapping with the first conductor and overlapped with the second conductor.

20. The semiconductor device according to claim 15, wherein the second transistor and the third transistor are p-channel transistors.

21. The semiconductor device according to claim 15,
wherein one of the third conductor and the fourth conductor is electrically connected to one of a source and a drain of the second transistor, and
wherein the other of the source and the drain of the second transistor and one of a source and a drain of the third transistor are electrically connected to each other.

22. A semiconductor device comprising:
a first transistor comprising:
a first conductor;
a first insulator over the first conductor;

an oxide semiconductor over the first insulator, the oxide semiconductor overlapping with the first conductor;
a second insulator over the oxide semiconductor;
a second conductor over the second insulator;
a third conductor being in contact with the oxide semiconductor; and
a fourth conductor being in contact with the oxide semiconductor,
wherein the oxide semiconductor includes a first region positioned between the third conductor and the fourth conductor, and
wherein the first region overlaps with the first conductor and is covered with the second conductor;
a second transistor, a gate of the second transistor being electrically connected to the first conductor through a first connection portion; and
a third transistor, a gate of the third transistor being electrically connected to the second conductor through a second connection portion,
wherein a layer in which the first transistor is provided and a layer in which the second transistor and the third transistor are provided are provided to overlap with each other,
wherein a direction in which the gate of the second transistor extends, a direction in which the gate of the third transistor extends, a direction in which the first conductor extends, a direction in which the second transistor extends are parallel, and
wherein a channel formation region of the second transistor and a channel formation region of the third transistor are aligned in the direction.

23. The semiconductor device according to claim 22, wherein a channel width of the first transistor is larger than channel widths of the second transistor and the third transistor.

24. An RFID tag including the semiconductor device according to claim 22, and an antenna.

25. An electronic device comprising the semiconductor device according to claim 22 and a printed wiring board.

26. The semiconductor device according to claim 22, wherein the first region includes:
a second region overlapping with the first conductor;
a third region not overlapping with the first conductor;
a fourth region overlapping with the second conductor; and
a fifth region not overlapping with the second conductor,
wherein the second region and the fifth region overlap with each other, and
wherein the third region and the fourth region overlap with each other.

27. The semiconductor device according to claim 22, wherein the first region includes:
a second region overlapping with the first conductor and not overlapped with the second conductor; and
a third region not overlapping with the first conductor and overlapped with the second conductor.

28. The semiconductor device according to claim 22, wherein the second transistor and the third transistor are p-channel transistors.

29. The semiconductor device according to claim 22,
wherein one of the third conductor and the fourth conductor is electrically connected to one of a source and a drain of the second transistor, and
wherein the other of the source and the drain of the second transistor and one of a source and a drain of the third transistor are electrically connected to each other.

30. A semiconductor device comprising:
a first transistor comprising:
a first conductor;
a first insulator over the first conductor;
an oxide semiconductor over the first insulator, the oxide semiconductor overlapping with the first conductor;
a second insulator over the oxide semiconductor;
a second conductor over the second insulator;
a third conductor being in contact with the oxide semiconductor; and
a fourth conductor being is in contact with the oxide semiconductor,
wherein the oxide semiconductor includes a first region positioned between the third conductor and the fourth conductor,
wherein the first region overlaps with the first conductor and is covered with the second conductor;
a second transistor, a gate of the second transistor being electrically connected to the first conductor through a first connection portion; and
a third transistor, a gate of the third transistor being electrically connected to the second conductor through a second connection portion,
wherein a layer in which the first transistor is provided and a layer in which the second transistor and the third transistor are provided are provided to overlap with each other,
wherein a direction in which the gate of the second transistor extends, a direction in which the gate of the third transistor extends, a direction in which the first conductor extends, and a direction in which the second conductor extends are parallel to a first direction, and
wherein a channel formation region of the second transistor and a channel formation region of the third transistor are aligned perpendicular to the first direction.

31. The semiconductor device according to claim 30, wherein a channel length of the first transistor is larger than channel lengths of the second transistor and the third transistor.

32. An RFID tag including the semiconductor device according to claim 30, and an antenna.

33. An electronic device comprising the semiconductor device according to claim 30 and a printed wiring board.

34. The semiconductor device according to claim 30, wherein the first region includes:
a second region overlapping with the first conductor;
a third region not overlapping with the first conductor;
a fourth region overlapping with the second conductor; and
a fifth region not overlapping with the second conductor,
wherein the second region and the fifth region overlap with each other, and
wherein the third region and the fourth region overlap with each other.

35. The semiconductor device according to claim 30, wherein the first region includes:
a second region overlapping with the first conductor and not overlapped with the second conductor; and
a third region not overlapping with the first conductor and overlapped with the second conductor.

36. The semiconductor device according to claim 30, wherein the second transistor and the third transistor are p-channel transistors.

37. The semiconductor device according to claim 30,
wherein one of the third conductor and the fourth conductor is electrically connected to one of a source and a drain of the second transistor, and wherein the other of the source and the drain of the second transistor and one of a source and a drain of the third transistor are electrically connected to each other.

* * * * *